(12) United States Patent
Tuan et al.

(10) Patent No.: US 6,757,199 B2
(45) Date of Patent: *Jun. 29, 2004

(54) NONVOLATILE MEMORY STRUCTURES AND FABRICATION METHODS

(75) Inventors: Hsing Ti Tuan, Cupertino, CA (US); Li-Chun Li, Los Gatos, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/434,262

(22) Filed: May 7, 2003

(65) Prior Publication Data

US 2003/0206447 A1 Nov. 6, 2003

Related U.S. Application Data

(62) Division of application No. 09/974,455, filed on Oct. 9, 2001, now Pat. No. 6,643,186, which is a division of application No. 09/640,139, filed on Aug. 15, 2000, now Pat. No. 6,355,524.

(51) Int. Cl.[7] .............................................. G11C 16/04
(52) U.S. Cl. ........................... 365/185.33; 365/185.29; 365/185.26
(58) Field of Search .................................... 365/185.33

(56) References Cited

U.S. PATENT DOCUMENTS

| | | |
|---|---|---|
| 4,794,565 A | 12/1988 | Wu et al. |
| 5,029,130 A | 7/1991 | Yeh |
| 5,045,488 A | 9/1991 | Yeh |
| 5,067,108 A | 11/1991 | Jenq |
| 5,120,671 A | 6/1992 | Tang et al. |
| 5,202,850 A | 4/1993 | Jenq |
| 5,212,541 A | 5/1993 | Bergemont |
| 5,217,920 A | 6/1993 | Mattox et al. |
| 5,242,848 A | 9/1993 | Yeh |
| 5,264,387 A | 11/1993 | Beyer et al. |
| 5,265,059 A | 11/1993 | Wells et al. |
| 5,278,087 A | 1/1994 | Jenq |
| 5,376,573 A | 12/1994 | Richart et al. |
| 5,399,516 A | 3/1995 | Bergendahl et al. |
| 5,479,368 A | 12/1995 | Keshtbod |
| 5,543,339 A | 8/1996 | Roth et al. |
| 5,576,232 A | 11/1996 | Hong |
| 5,587,332 A | 12/1996 | Chang et al. |
| 5,616,941 A | 4/1997 | Roth et al. |
| 5,640,031 A | 6/1997 | Keshtbod |
| 5,661,053 A | 8/1997 | Yuan |
| 5,668,757 A | 9/1997 | Jeng |
| 5,673,224 A | 9/1997 | Chevallier et al. |
| 5,696,019 A | 12/1997 | Chang |
| 5,712,179 A | 1/1998 | Yuan |
| 5,736,442 A | 4/1998 | Mori |
| 5,763,309 A | 6/1998 | Chang |
| 5,770,501 A | 6/1998 | Hong |
| 5,776,787 A | 7/1998 | Keshtbod |
| 5,851,879 A | 12/1998 | Lin et al. |
| 5,856,943 A | 1/1999 | Jeng |
| 5,909,628 A | 6/1999 | Chatterjee et al. |
| 5,912,843 A | 6/1999 | Jeng |
| 5,943,261 A | 8/1999 | Lee |

(List continued on next page.)

OTHER PUBLICATIONS

"A 0.67 mn.sup.2 Self–Aligned Shallow Trench Isolation Cell (SA–STI Cell) For 3V—only 256Mbit Nand EEPROMs", S. Aritome, S. Satoch, T. Maruyama, H. Watanabe, S. Shuto, G.J. Hemink, R. Shirota, S. Watanabe, and F. Masuoka, (IEDM Tech. Dig. Dec. 11–14, 1994, pp. 61–64), pp. 3.6.1–3.6.4.

(List continued on next page.)

Primary Examiner—Thong Q. Le
(74) Attorney, Agent, or Firm—Michael Shenker; MacPherson Kwok Chen & Heid LLP

(57) ABSTRACT

A nonvolatile memory array can be erased by sectors, or alternatively a chip erase operation can be performed to erase all the cells of the array in parallel.

16 Claims, 48 Drawing Sheets

U.S. PATENT DOCUMENTS

| | | |
|---|---|---|
| 5,953,255 A | 9/1999 | Lee |
| 5,963,473 A | 10/1999 | Norman |
| 5,965,913 A | 10/1999 | Yuan et al. |
| 5,991,204 A | 11/1999 | Chang |
| 6,001,687 A | 12/1999 | Chu et al. |
| 6,001,706 A | 12/1999 | Tan et al. |
| 6,013,551 A | 1/2000 | Chen et al. |
| 6,025,229 A | 2/2000 | Hong |
| 6,027,971 A | 2/2000 | Cho et al. |
| 6,028,336 A | 2/2000 | Yuan |
| 6,043,530 A | 3/2000 | Chang |
| 6,043,536 A | 3/2000 | Numata et al. |
| 6,054,355 A | 4/2000 | Inumiya et al. |
| 6,057,572 A | 5/2000 | Ito et al. |
| 6,057,575 A | 5/2000 | Jenq |
| 6,066,544 A | 5/2000 | Pan et al. |
| 6,087,208 A | 7/2000 | Krivokapic et al. |
| 6,103,592 A | 8/2000 | Levy et al. |
| 6,108,236 A | 8/2000 | Barnett |
| 6,165,692 A | 12/2000 | Kanai et al. |
| 6,166,415 A | 12/2000 | Sakemi et al. |
| 6,169,012 B1 | 1/2001 | Chen et al. |
| 6,171,910 B1 | 1/2001 | Hobbs et al. |
| 6,171,971 B1 | 1/2001 | Natzle |
| 6,171,976 B1 | 1/2001 | Cheng |
| 6,177,303 B1 | 1/2001 | Schmitz et al. |
| 6,191,001 B1 | 2/2001 | Chen et al. |
| 6,191,049 B1 | 2/2001 | Song |
| 6,191,444 B1 | 2/2001 | Clampitt et al. |
| 6,198,657 B1 | 3/2001 | Uekubo et al. |
| 6,222,775 B1 | 4/2001 | Cappelletti |
| 6,228,715 B1 | 5/2001 | Shimoji |
| 6,248,630 B1 | 6/2001 | Clementi et al. |
| 6,266,277 B1 | 7/2001 | Roohparvar |
| 6,316,293 B1 | 11/2001 | Fang |
| 6,355,524 B1 | 3/2002 | Tuan et al. |
| 6,392,928 B1 | 5/2002 | Roohparvar |
| 6,403,417 B1 | 6/2002 | Chien et al. |
| 6,643,186 B2 * | 11/2003 | Tuan et al. ............ 365/185.33 |

OTHER PUBLICATIONS

"A New Flash–Erase EEProm Cell With A Sidewall Select–Gate On Its Source Side", K. Naruke, S. Yamada, E. Obi, S. Taguchi, and M. Wada, (IEDM Tech. Dig. Dec. 3–6, 1989, pp. 603–606), pp. 25.7.1–25.7.4.

"A Novel High–Density 5F.sup.2 NAND STI Cell Technology Suitable for 256Mbit and 1 Gbit Flash Memories", K. Shimizu, K. Narita, H. Watanabe, E. Kamiya, Y. Takeuchi, T. Yaegashi, S. Aritome, and T. Watanabe, (IEEE Tech. Dig. Dec. 7–10, 1997, pp. 271–274), pp. 11.1.1–11.1.4.

"A Novel High–Speed, 5–Volt Programming Eprom Structure With Source–Side Injection", A.T. Wu, T.Y. Chan, P.K. Ko and C. Hu (IEDM Tech. Dig., pp. 584–587, (1986), pp. 108–111.

"A Review of 256Mbit NAND Flash Memories and NAND Flash Furture Trend", Riichiro Shirota (Microelectronics Engineering Laboratory), unknown date before Aug. 15, 2000, pp. 22–31.

"Nonvolatile Semiconductor Memory Technology" "A Comprehensive Guide to Understanding and Using NVSM Devices", William D. Brown, Joe E. Brewer (IEEE Press series on microelectronic systems 1998), pp. 21–23 and 241–245.

* cited by examiner

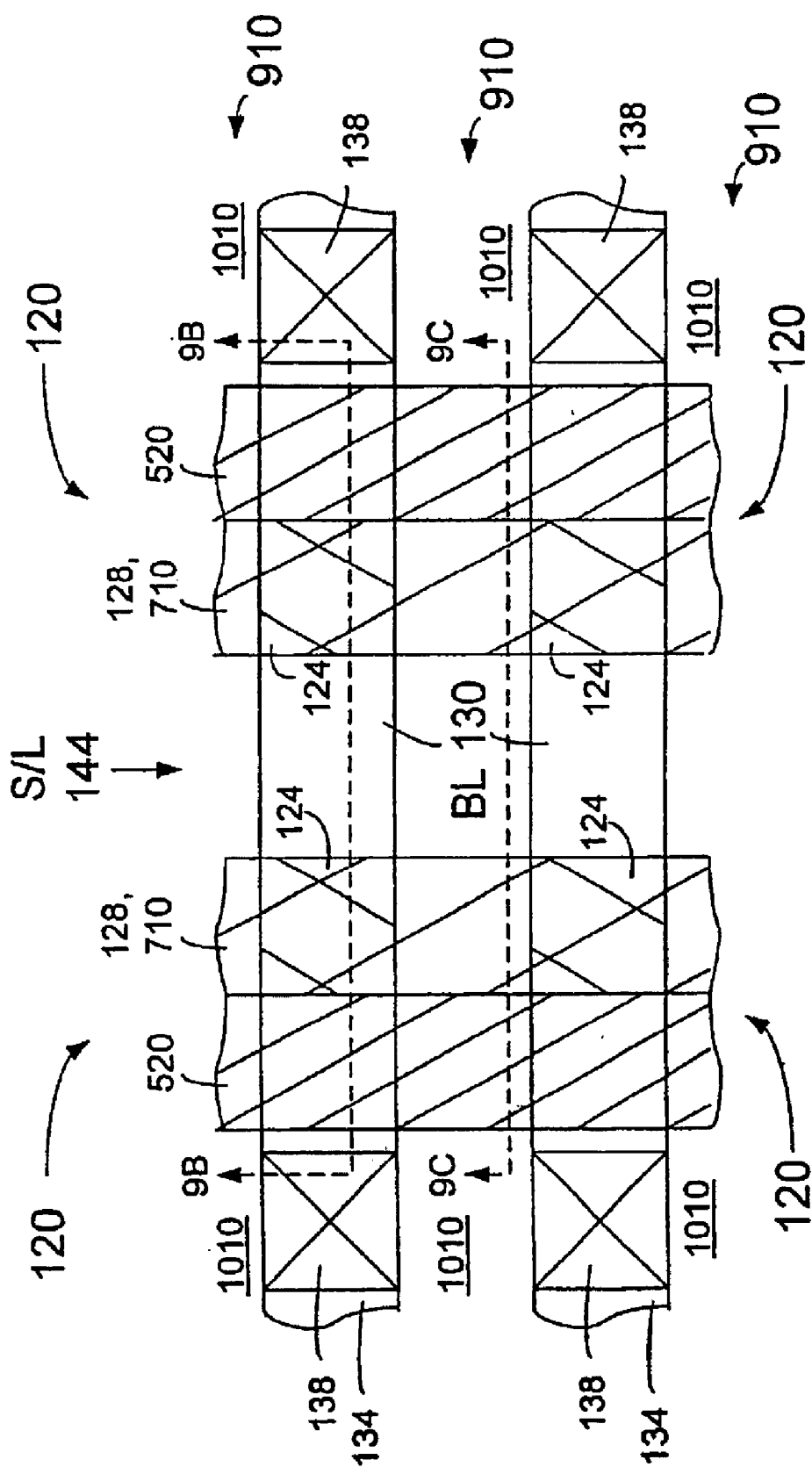

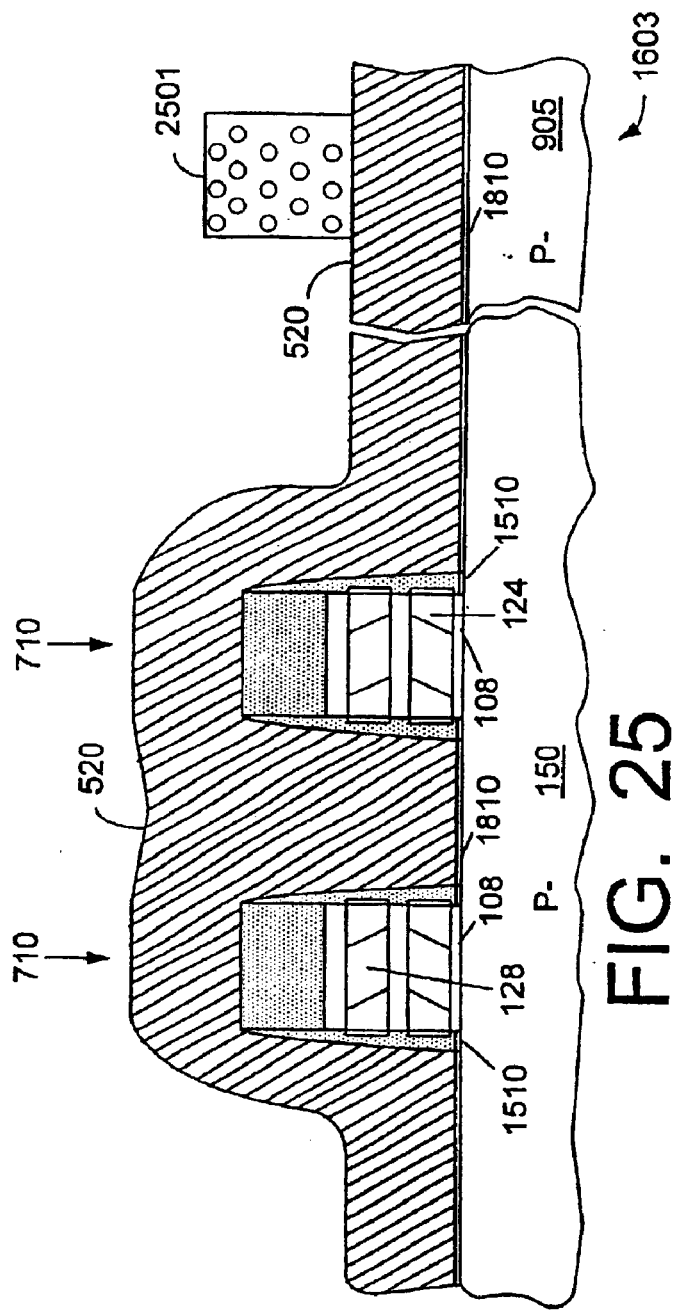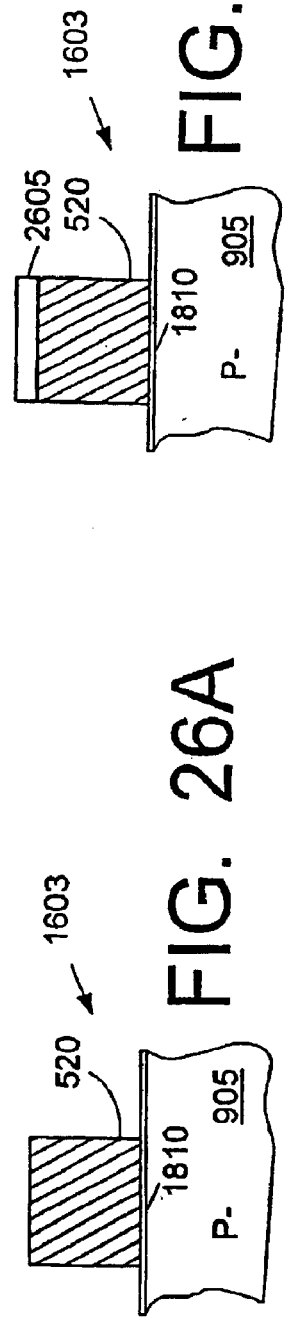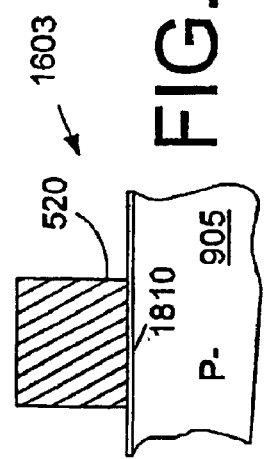

NONVOLATILE MEMORY STRUCTURES AND FABRICATION METHODS

CROSS REFERENCE TO RELATED APPLICATIONS

The present application is a division of U.S. patent application Ser. No. 09/974,455 filed on Oct. 9, 2001 now U.S. Pat. No. 6,643,186 and incorporated herein by reference, which is a division of U.S. patent application Ser. No. 09/640,139 filed on Aug. 15, 2000, now U.S. Pat. No. 6,355,524, incorporated herein by reference.

BACKGROUND OF THE INVENTION

The present invention relates to semiconductor technology, and more particularly to nonvolatile memories.

FIGS. 1–8 illustrate fabrication of a conventional nonvolatile stacked-gate flash memory described in U.S. Pat. No. 6,013,551 issued Jan. 11, 2000 to J. Chen et al. Silicon oxide layer 108 ("tunnel oxide") is grown on P-doped silicon substrate 150. Doped polysilicon 124 is deposited over oxide 108. Polysilicon 124 will provide floating gates for memory cell transistors.

Mask 106 is formed over the structure. Polysilicon 124, oxide 108, and substrate 150 are etched through the mask openings. Trenches 910 are formed in the substrate as a result (FIG. 2).

As shown in FIG. 3, the structure is covered with dielectric which fills the trenches. More particularly, silicon oxide 90 is grown by thermal oxidation. Then silicon oxide 94 is deposited by PECVD (plasma enhanced chemical vapor deposition). Then thick silicon oxide layer 96 is deposited by SACVD (subatomspheric chemical vapor deposition).

The structure is subjected to chemical mechanical polishing (CMP). Polysilicon 124 becomes exposed during this step, as shown in FIG. 4.

As shown in FIG. 5, ONO (silicon oxide, silicon nitride, silicon oxide) layer 98 is formed on the structure. Silicon 99 is deposited on top. Then tungsten silicide 100 is deposited.

Then a mask is formed (not shown), and the layers 100, 99, 98, 124 are patterned (FIG. 6). Layer 124 provides floating gates, and layers 99, 100 provide control gates and wordlines.

Then mask 101 is formed over the structure, as shown in FIG. 8. Silicon oxide etch removes those portions of oxide layers 90, 94, 96 which are exposed by mask 101. After the etch, the mask remains in place, as dopant is implanted to form source lines 103.

Other implantation steps are performed to properly dope the source and drain regions.

Alternative memory structures and fabrication methods are desirable.

SUMMARY

Some embodiments of the present invention provide a method for manufacturing an integrated circuit comprising nonvolatile memory, the method comprising:
  (a) forming, over a semiconductor region S1, a first layer, wherein the integrated circuit is to include a plurality of nonvolatile memory cells each of which has a floating gate comprising a portion of the first layer;
  (b) forming trenches in the region S1 through openings in the first layer, and filling the trenches with insulation;
  (c) forming a second layer over the region S1, wherein each of said cells is to have a conductive gate comprising a portion of the second layer, the conductive gate being insulated from the cell's floating gate;
  (d) patterning the second layer to form strips extending in a predetermined direction, each strip crossing over a plurality of trenches;
  (e) removing that portion of the first layer over the region S1 which is not covered by the second layer, to form a plurality of first structures each of which comprises a strip made from the second layer and also comprises a portion of the first layer under the strip, each first structure having a first sidewall;
  (f) forming a third layer over the first and second layers, and removing a portion of the third layer by a process comprising an anisotropic etch, to form a spacer over at least a portion of the first sidewall of each first structure, each spacer being insulated from materials of the first and second layers in the respective first structure;
  (g) removing a portion of the third layer from over a portion of the region S1 so as not to completely remove said spacers, wherein each of said cells comprises a conductive gate comprising a portion of a spacer over a first sidewall of a first structure; and
  (h) introducing dopant into at least a portion of the region S1;
  wherein the operations (g) and (h) are performed using a single photolithographic masking operation performed before the operation (g).

Some embodiments of the present invention provide a method for manufacturing an integrated circuit comprising a nonvolatile memory, the method comprising:
  (a) forming insulation on a semiconductor region S1;
  (b) forming, over the insulation, a plurality of conductive first strips of first material from which floating gates are to be formed, the first strips extending in a first direction;
  (c) forming trenches in the semiconductor region S1, each trench extending between adjacent first strips of the first material, the trenches containing an insulator;
  (d) forming insulation over the first strips;
  (e) forming second material from which conductive memory gates are to be formed, wherein the second material is formed over the insulation formed over the first material;
  (f) forming a mask over the second material, and patterning the second material using said mask, to form second strips of the second material, the second strips extending in a second direction at an angle to the first strips;
  (g) removing that portion of the first material over the region S1 which is not covered by the second material, to form a plurality of first structures each of which comprises a second strip of the second material and also comprises floating gates formed from the first material under the second material, each first structure having a first sidewall;
  (h) forming insulation over exposed sidewalls of the floating gates and of the second material in the first structures;
  (i) forming a third material over the first and second materials, and removing a portion of the third material by a process comprising an anisotropic etch, to form spacers over at least portions of the first sidewalls of each first structure;
  (j) forming a mask using photolithography, the mask covering the spacers over the first sidewalls of the first structures;

(j) removing the third layer by a process comprising an etch selective to said mask, so as not to remove the spacers which are to provide conductive gates for the nonvolatile memory; and (k) introducing dopant into the region S1, wherein the dopant is blocked by said mask from portions of the region S1.

Some embodiments of the present invention provide a method for manufacturing an integrated circuit comprising nonvolatile memory, the method comprising:

(a) forming over a semiconductor region S1, a first layer comprising a plurality of first strips extending in a first direction, wherein the memory is to include a plurality of nonvolatile memory cells each of which has a floating gate comprising a portion of the first layer;

(b) forming trenches in the semiconductor region S1, each trench extending in the first direction between adjacent first strips, the trenches containing an insulation;

(c) forming, over the first layer, a second layer, wherein each of said cells is to have a conductive gate comprising a portion of the second layer, the conductive gate being insulated from the cell's floating gate, the second layer comprising a plurality of second strips extending at an angle to the first strips;

(d) removing that portion of the first layer over the region S1 which is not covered by the second layer, to form a plurality of first structures each of which comprises a second strip and also comprises a portion of the first layer under the second strip, each first structure having a first sidewall;

(f) forming a third layer over the first and second layers, and removing a portion of the third layer by a process comprising an anisotropic etch, to form spacers over at least portions of the first sidewalls of each first structure, each spacer being insulated from materials of the first and second layers in the respective first structure;

(g) removing the third layer so as not to remove the spacers, the spacers over the first sidewalls being to provide conductive gates for the nonvolatile memory cells;

(h) introducing dopant into at least a portion of the region S1;

(i) after the operation (h), removing at least a portion of the insulation from the trenches; and (j) after the operation (i), introducing dopant into at least a portion of the region S1 to dope at least portions of surfaces of the trenches.

Some embodiments of the present invention provide a method for manufacturing an integrated circuit, the method comprising:

forming a first gate insulation on a semiconductor substrate for a first MOS transistor which is to be formed in a first area of the integrated circuit;

forming, over the first insulation, a layer L1 to provide a conductive gate for the first MOS transistor;

removing the layer L1 and the first insulation from a second area of the integrated circuit;

forming a second gate insulation on the semiconductor substrate in the second area for a second MOS transistor;

forming, over the second insulation, a layer L2 to provide a conductive gate for the second MOS transistor.

Some embodiments of the present invention provide a method for fabricating an integrated circuit comprising nonvolatile memory, the method comprising:

forming an insulation I1 to provide gate insulation for nonvolatile memory cells;

forming a first layer to provide floating gates for the memory cells;

removing the first layer and the insulation I1 from first, second and third areas of the integrated circuit, wherein at least one peripheral MOS transistor is to be formed in each of the first, second and third areas;

forming a first gate insulation in the first, second and third areas;

removing the first gate insulation from the second and third areas;

forming a second gate insulation in the second and third areas;

forming a second layer over the first layer, over the first gate insulation, and over the second gate insulation, wherein the memory cells and the MOS transistors in the first and third areas each have a conductive gate comprising a portion of the second layer;

removing the second layer from the second area;

forming a third gate insulation in the second area and in an area of the memory cells; and forming a third layer, wherein the memory cells and the MOS transistor in the second area each comprises a conductive gate comprising a portion of the third layer, wherein the first gate insulation in the first area is thicker than the second gate insulation and is thicker than the third gate insulation, and the third gate insulation is thicker than the second gate insulation.

Some embodiments of the present invention provide an integrated circuit comprising:

at least one nonvolatile memory cell having a floating gate insulated from a semiconductor substrate, and having a control gate overlying the floating gate, and having another conductive gate;

a first peripheral transistor, a second peripheral transistor, and a third peripheral transistor;

wherein a gate insulation of the first peripheral transistor is thicker than a gate insulation of the second peripheral transistor which is thicker than a gate insulation of a third peripheral transistor.

Some embodiments of the present invention provide a method for manufacturing an integrated circuit comprising nonvolatile memory comprising a plurality of peripheral transistors, the method comprising:

forming a first layer over first, second and third areas of the integrated circuit, wherein the memory is to include at least one memory cell formed in the first area, at least one peripheral transistor in the second area, and at least one peripheral transistor in the third area, wherein the memory cell is to include a floating gate comprising a portion of the first layer;

removing the first layer from the second and third areas;

forming a second layer in the first, second and third areas, wherein the memory cell is to include a conductive gate comprising a portion of the second layer, and the peripheral transistor in the second area is to include a conductive gate comprising a portion of the second layer;

removing the second layer from the third area;

forming a third layer over the first and third areas, wherein the memory cell is to include a conductive gate comprising at least a portion of the third layer, and the peripheral transistor in the third area is to include a conductive gate comprising at least a portion of the third layer.

Some embodiments of the present invention provide an integrated circuit comprising:
- at least one nonvolatile memory cell having a floating gate insulated from a semiconductor substrate, and having a control gate overlying the floating gate, and having a conductive gate G1; and
- a first peripheral transistor;
- wherein the control gate is formed from a layer L1 and wherein the gate G1 and a gate of the first peripheral transistor are formed from a different layer L2.

Some embodiments of the present invention provide a method for manufacturing an integrated circuit comprising a nonvolatile memory array and a peripheral transistor used to operate the memory array, the method comprising:
- forming, over a semiconductor substrate, a first layer to provide floating gates for the memory array;
- forming, over the semiconductor substrate, a second layer overlying the first layer but insulated from the first layer, to provide conductive memory gates for the memory array;
- so that the first and second layers are present over a region S1 of the semiconductor substrate, the region S1 being where the memory array is to be formed, but the first and second layers are not present over a region S2 of the semiconductor substrate, the region S2 being where a peripheral transistor for a peripheral circuitry is to be formed;
- after forming the first and second layers, forming a third layer over the semiconductor substrate to provide conductive gates for the memory array, wherein each nonvolatile memory cell of the memory array has a conductive gate formed from the second layer and has a conductive gate formed from the third layer;
- wherein a portion of the third layer is present over the region S2 to provide at least a portion of a conductive gate of the peripheral transistor.

Some embodiments of the present invention provide a method for manufacturing an integrated circuit comprising nonvolatile memory, the method comprising:
- forming, over a semiconductor substrate, a first layer to provide floating gates for the memory array;
- forming, over the semiconductor substrate, a second layer overlying the first layer but insulated from the first layer, wherein the memory is to have a plurality of conductive gates each of which comprises a portion of the second layer;
- patterning the second layer to provide at least one structure comprising a strip of the second layer and also comprising floating gates under the strip of the second layer, the floating gates being formed from the first layer, wherein the memory is to have a plurality of cells each of which comprises a conductive gate comprising a portion of the strip of the second layer, wherein the structure has a sidewall;
- depositing a third layer over said structure, wherein each of said cells is to have a conductive gate comprising a portion of the third layer and formed over the sidewall of said structure;
- forming a mask over the third layer, and etching the third layer anisotropically to provide a spacer line over the sidewall of said structure in a region not covered by the mask, wherein each of said cells is to have a conductive gate comprising a portion of said spacer line, wherein a third layer portion covered by the mask comprises extensions to the spacer line;
- forming an insulator over the first, second and third layers, and forming a conductive layer contacting the extension through openings in the insulator.

Some embodiments of the present invention provide an integrated circuit comprising nonvolatile memory comprising:
- a structure comprising a conductive line L1 providing first conductive gates for a plurality of memory cells, the structure also comprising a plurality of floating gates formed under the conductive line L1 and insulated from the conductive line L1;
- a conductive line L2 formed as a spacer on a sidewall of said structure and providing second conductive gates for said memory cells, each of said memory cells comprising one of said first conductive gates and one of said second conductive gates;
- wherein said structure, said floating gates, and said conductive lines L1 and L2 are formed over a semiconductor substrate;
- wherein the substrate comprises:
  - a plurality of trenches formed therein and extending at an angle to said structure; and
  - a conductive area extending along said structure traversing a plurality of said trenches, the conductive area providing source/drain regions for said memory cells.

Some embodiments of the present invention provide a method for manufacturing an integrated circuit comprising nonvolatile memory, the method comprising:
(a) forming over a semiconductor region S1, a plurality of first strips of a first material from which floating gates are to be formed, the first strips extending in a first direction;
(b) forming over the semiconductor region S1, a plurality of second strips of a second material, the second strips extending in a second direction at an angle to the first direction, thereby creating regions bounded by the first and second strips;
(c) forming trenches in the region S1 in the areas bounded by the first and second strips, and filling the trenches with insulation;
(d) forming a material L1 from which conductive memory gates are to be formed, wherein the material L1 is formed over the first material, and is insulated from the first material;
(e) forming a mask over the material L1, and patterning the material L1 using said mask, so that the material L1 is removed from over at least a portion of each of the first strips;
(f) removing the first material not covered by the material L1 over the region S1, to form a plurality of first structures each of which includes the first material and the material L1 overlying the first material;
(g) insulating at least one sidewall of each first structure;
(h) forming a third material over the first material and the material L1;
(i) etching the third material by a process comprising an anisotropic etch, to form a spacer on at least one sidewall of each of the first structures; and
(j) doping at least portions of those areas of the region S1 over which the first material has been removed and of those areas of the region S1 over which the second strips were formed;
wherein the nonvolatile memory comprises floating gate regions formed from the first material, conductive gate regions formed from the material L1, and conductive gate regions formed from the third material.

Some embodiments of the present invention provide a method for manufacturing an integrated circuit comprising nonvolatile memory, the method comprising:

(a) forming, over a semiconductor region S1, a first layer, wherein the integrated circuit is to include a plurality of nonvolatile memory cells each of which has a floating gate comprising a portion of the first layer;

(b) forming trenches in the region S1 through openings in the first layer, and filling the trenches with insulation;

(c) forming a second layer over the region S1, wherein each of said cells is to have a conductive gate comprising a portion of the second layer, the conductive gate being insulated from the cell's floating gate;

(d) patterning the second layer to form strips extending in a predetermined direction, each strip crossing over a plurality of trenches;

(e) removing that portion of the first layer over the region S1 which is not covered by the second layer, to form a plurality of first structures each of which comprises a strip made from the second layer and also comprises a portion of the first layer under the strip, each first structure having a first sidewall;

(f) forming a third layer over the first and second layers, and removing a portion of the third layer by a process comprising an anisotropic etch, to form a spacer over at least a portion of the first sidewall of each first structure, each spacer being insulated from materials of the first and second layers in the respective first structure;

(g) removing a portion of the third layer from over a portion of the region S1 so as not to completely remove said spacers, wherein each of said cells comprises a conductive gate comprising a portion of a spacer over a first sidewall of a first structure; and (h) introducing dopant into at least a portion of the region S1.

Some embodiments of the present invention provide a method for erasing memory cells of a flash memory array formed in and over a semiconductor region, the memory array comprising a plurality of sections each of which can be erased individually, each section having a plurality of memory cells, the method comprising:

receiving by the memory a command indicating whether the entire memory array is to be erased or less than the entire memory array is to be erased;

if the entire memory array is to be erased, then erasing the entire memory array;

if less than the entire memory array is to be erased, then erasing a portion of the memory array without erasing the entire memory array.

Other features and advantages of the invention are described below. The invention is defined by the appended claims.

BRIEF DESCRIPTION OF THE DRAWINGS

FIG. 9A is a top view of a memory according to some embodiments of the present invention.

FIGS. 25, 26A, 26B, 26C are cross section illustrations of some memory embodiments of the present invention.

Figure 1:
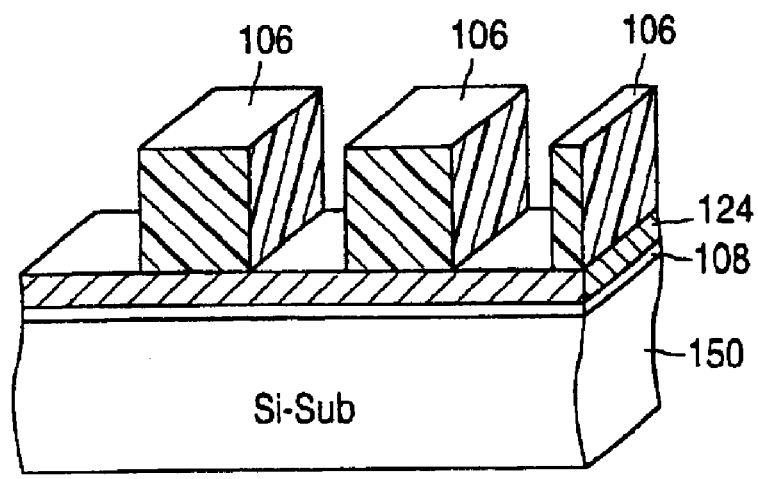
FIGS. 1–7 are cross section illustrations of a prior art flash memory at different stages of fabrication.
Figure 2:
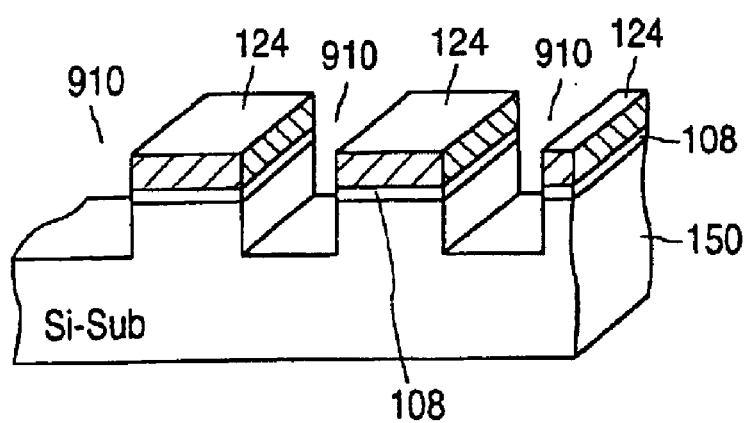
Figure 3:
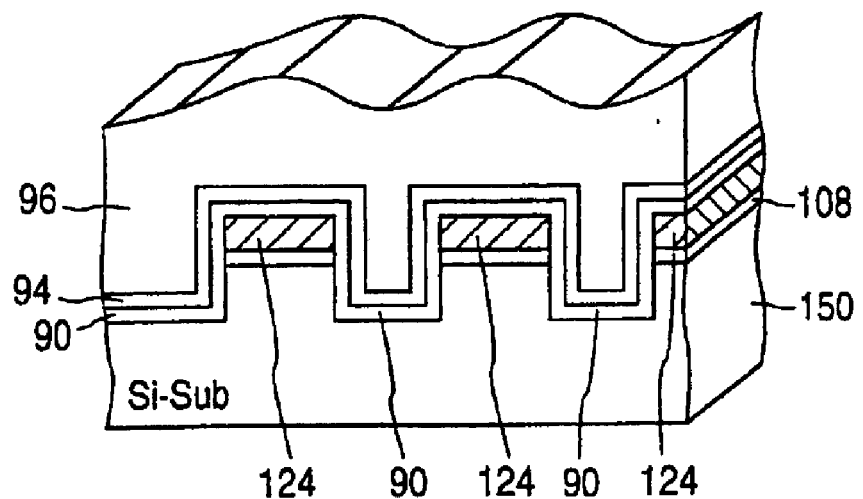
Figure 4:
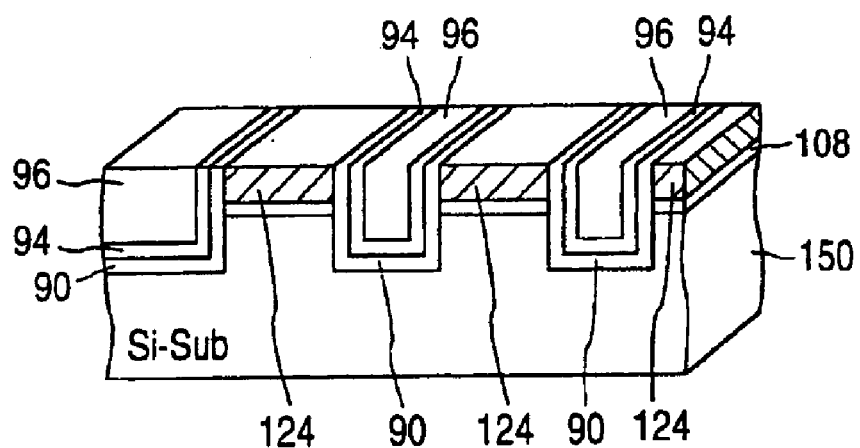
Figure 5:
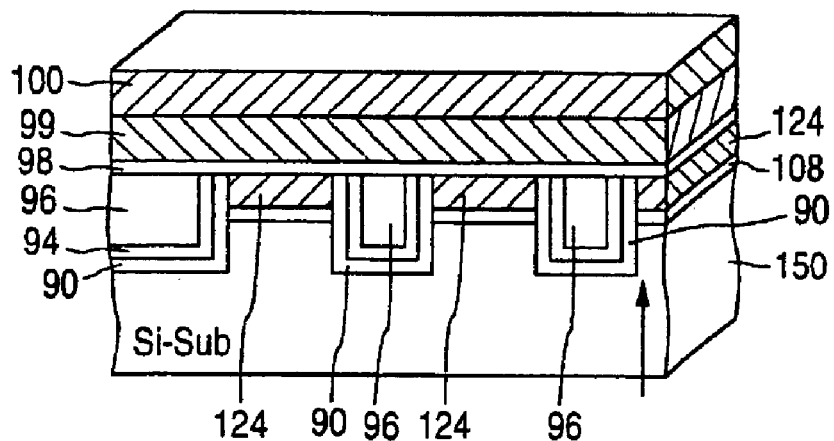
Figure 6:
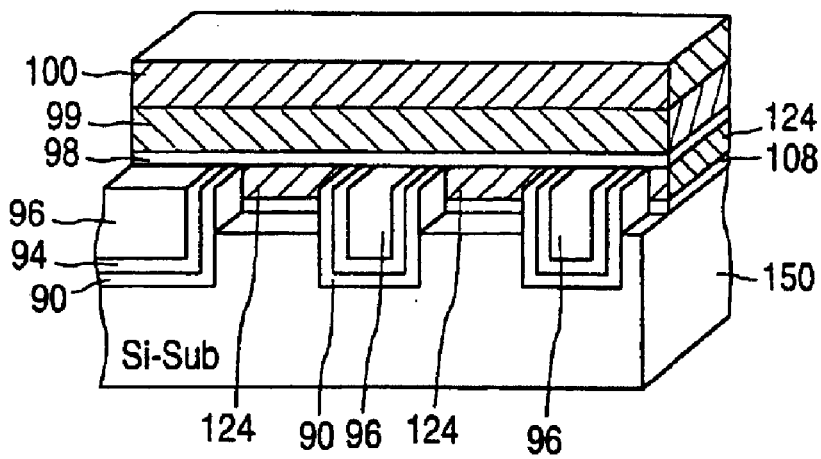
Figure 7:
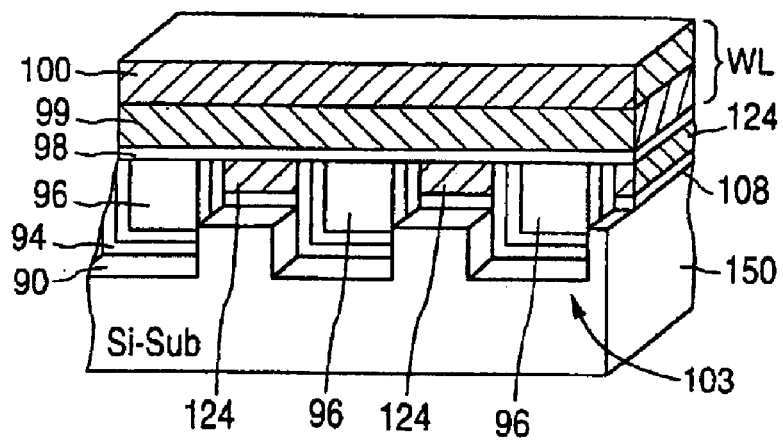
Figure 8:
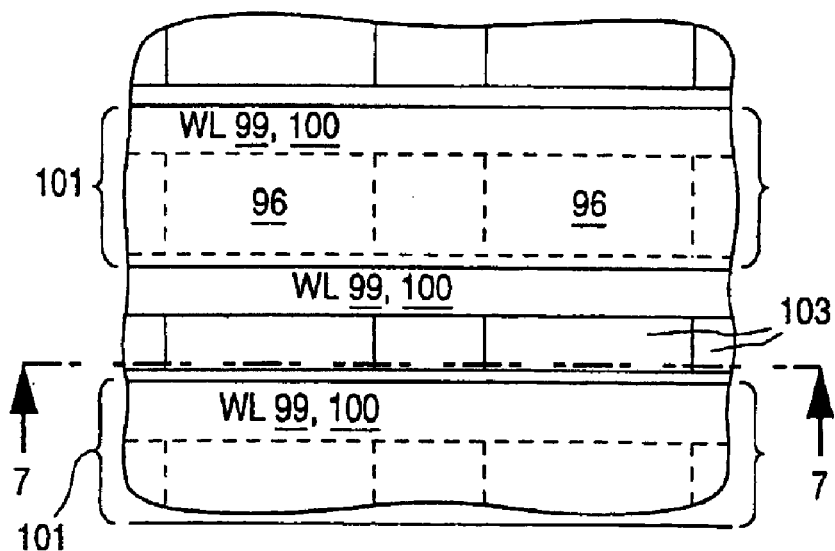
FIG. 8 is a top view of the memory of FIGS. 1–7.

In the drawings, the reference numbers are used as indicated in the following table. The list of the reference numbers in this table is not exhaustive. The description of the features is not complete, and is not limiting. For example, silicon dioxide can be replaced with other insulators. Not all of the functions described for a reference number have to be present in the invention, and also functions not described can be present.

| Reference Number | Feature |
|---|---|
| 98 | Insulator isolating the floating gates 124 from the control gates 128 |
| 108 | Tunneling oxide |
| 124 | Floating gates |
| 128 | Control gates |
| 130 | Bitlines |

-continued

| Reference Number | Feature |
|---|---|
| 134 | Bitline regions of memory cells |
| 138 | Bitline contacts to memory cells |
| 144 | Source lines |
| 150 | Isolated substrate region |
| 520 | Wordlines |
| 710 | Stacks including the floating and control gates |
| 720 | Silicon nitride at the top of stacks 710 |
| 901 | Memory array |
| 903 | Silicon nitride on sidewalls of stacks 710 |
| 904 | Photoresist mask used to pattern the floating gate polysilicon 124 and the isolation trenches |
| 905 | Substrate |
| 910 | Isolation trench |
| 1010 | Insulation in isolation trenches |
| 1014 | Photoresist used to pattern the stacks 710 |
| 1103 | N-region isolating the substrate region 150 from below |
| 1105 | N-region isolating the substrate region 150 laterally on all sides |
| 1203 | Silicon nitride that serves as a stop layer during the etch of trench insulation 1010 |
| 1510 | Silicon dioxide insulating the floating gate sidewalls |
| 1603 | Peripheral areas |
| 1710 | Photoresist mask used to etch the polysilicon 520 |
| 1810 | Gate oxide for select transistors |
| 2110 | Deep source line implant |
| 2401 | Source line and bitline region implant |
| 2501 | Photoresist mask used to form wordline extensions and peripheral transistor gates |
| 2605 | Silicide on top of peripheral transistor gates |
| 2701 | Gap in which wordline extensions 520E are formed |
| 2703.1, 2703.2 | Memory array sections |
| 2710 | Oxide deposited before patterning isolation trenches |
| 2810 | Photoresist used to pattern isolation trenches |
| 3301 | Silicide over source lines 144 |
| 4201 | Voltage generator |

DESCRIPTION OF PREFERRED EMBODIMENTS

The description of the preferred embodiments is illustrative and not limiting. The invention is not limited by any particular dimensions, materials, processing steps, doping levels, crystal orientation, layer thicknesses, layouts, or any other features, unless expressly stated otherwise.

Figure 9B:
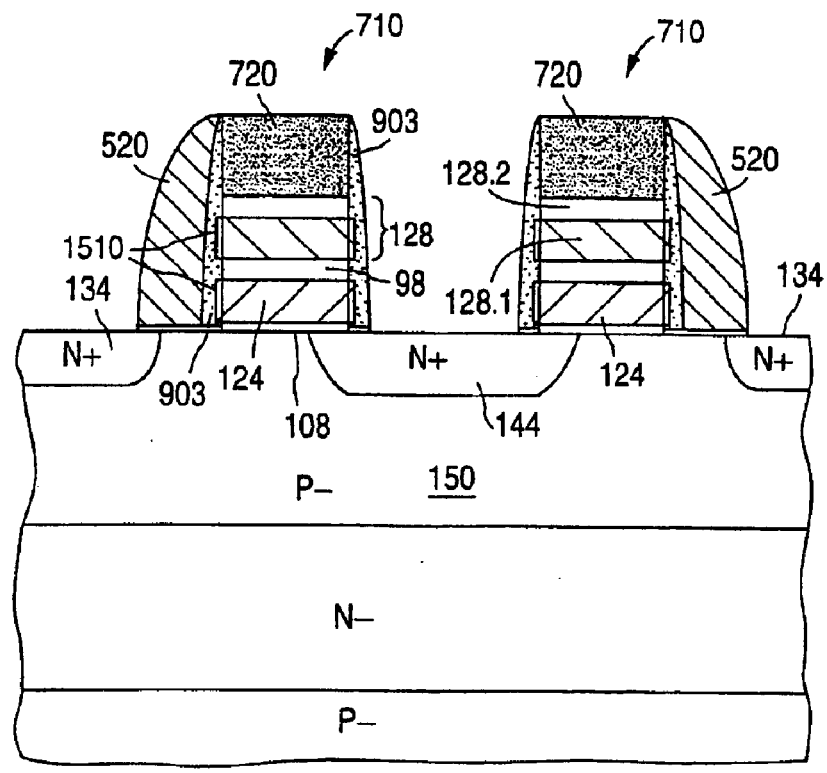
FIGS. 9B, 9C are cross section illustrations of the memory of FIG. 9A.
Figure 9C:
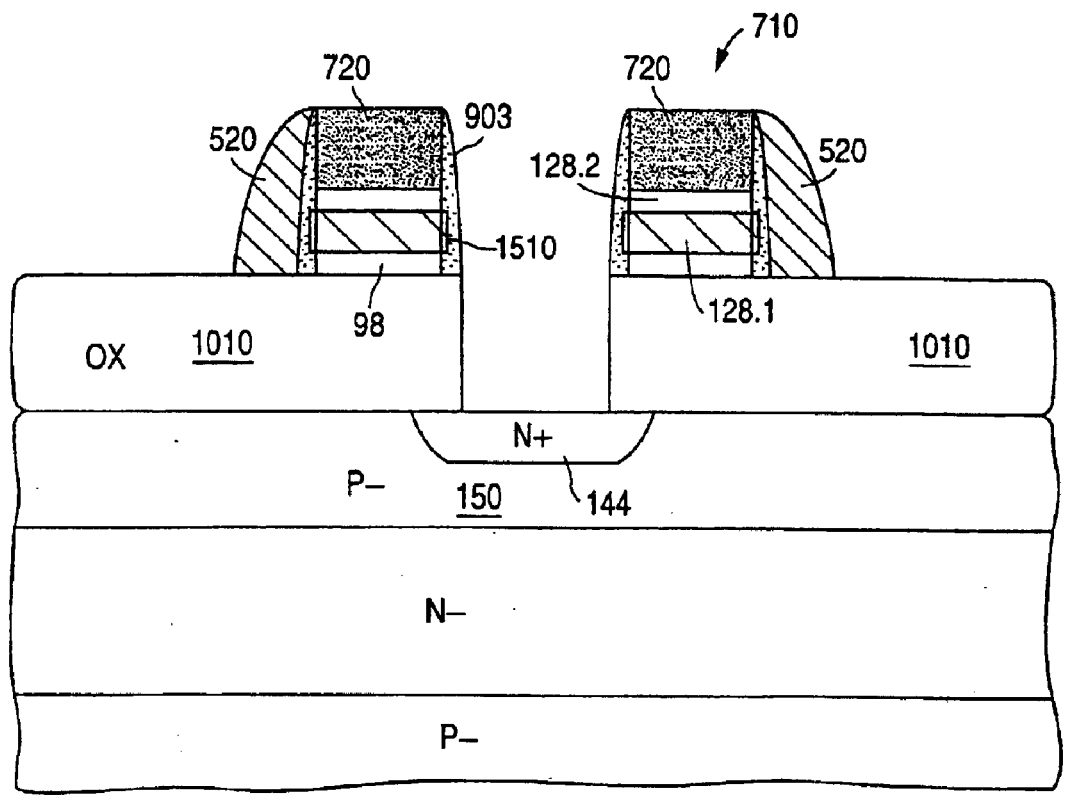
Figure 10A:
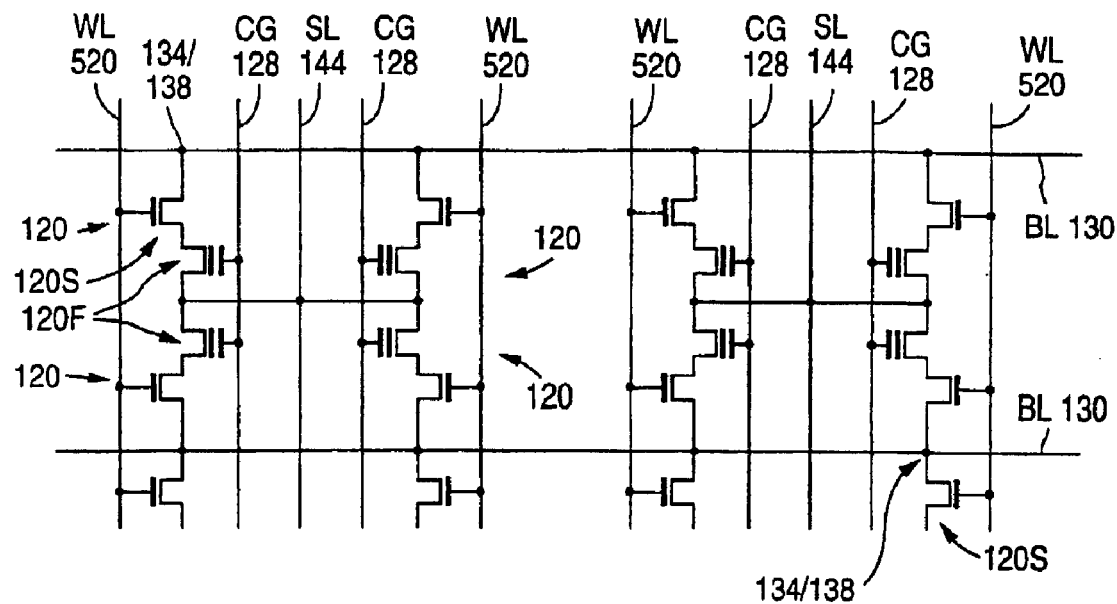
FIG. 10A is a circuit diagram of the memory of FIG. 9A.
Figure 10B:
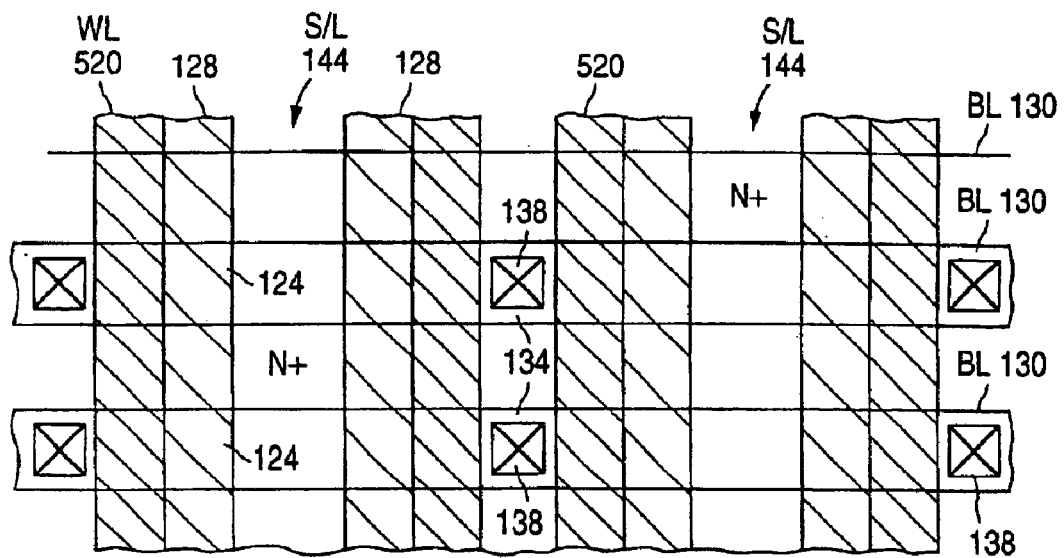
FIG. 10B is a top view of the memory of FIG. 9A.

FIG. 9A is a top view of a flash memory array of self-aligned triple-gate memory cells 120. FIG. 9B illustrates a cross section of the array along the line 9B—9B in FIG. 9A. FIG. 9C illustrates a cross section along the line 9C—9C in FIG. 9A. FIG. 10A is a circuit diagram of the array. FIG. 10B is a top view illustrating some additional features.

In FIGS. 9A, 10A, 10B, bitlines 130 extend horizontally. The bitlines are formed from a conductive layer overlying the memory cells (for example, aluminum or tungsten, not shown in FIGS. 9B, 9C). The bitlines contact the memory cells' bitline regions 134 in contact regions 138. Source lines 144 extend vertically between the adjacent row structures 710. Each row structure 710 includes a conductive control gate line 128 extending vertically and providing control gates for a row of memory cells. In the embodiment of FIGS. 9B, 9C, the control gate lines 128 are made of polysilicon layer 128.1 and tungsten silicide layer 128.2. Polysilicon floating gates 124 underlie the control gates 128. Each floating gate extends between adjacent isolation trenches 910. Trenches 910 extend horizontally between the bitlines 130.

Each structure 710 is a self-aligned stack.

Conductive wordlines 520 (e.g. doped polysilicon) are perpendicular (or at some other angle) to the bitlines. Each wordline 520 provides select gates for a row of memory cells. Each wordline 520 is a self-aligned sidewall spacer formed over a sidewall of a corresponding stack 710. Wordlines 520 are insulated from the adjacent control gates 128 and floating gates 124 by silicon nitride spacers 903 and silicon dioxide 1510. Layers 903, 1510 can be formed without a mask.

As shown in FIG. 10A, each row of memory cells has two cells 120 between each two adjacent bitlines 130. Each row has a control gate line 128 and a wordline 520. Two adjacent memory rows share a source line 144. In each memory cell 120, an NMOS select transistor 120S and a floating gate transistor 120F are connected in series. The gate of the select transistor 120S is provided by wordline 520. The control gate of the transistor 120F is provided by line 128.

Each cell 120 can be erased by Fowler-Nordheim tunneling of electrons from its floating gate 124 (FIG. 9B) through silicon dioxide 108 to source line 144 or substrate region 150. (Region 150 contains the channel regions of the memory cells.) The cell can be programmed by source-side hot electron injection. The term "source-side hot electron injection" assumes that a cell's bitline region 134 is called a "source". At other times, this region is called a drain, and the source line region 144 is called a source. Each of regions 134, 144 may also be called a source/drain region. The invention is not limited by any particular terminology.

Figure 11:
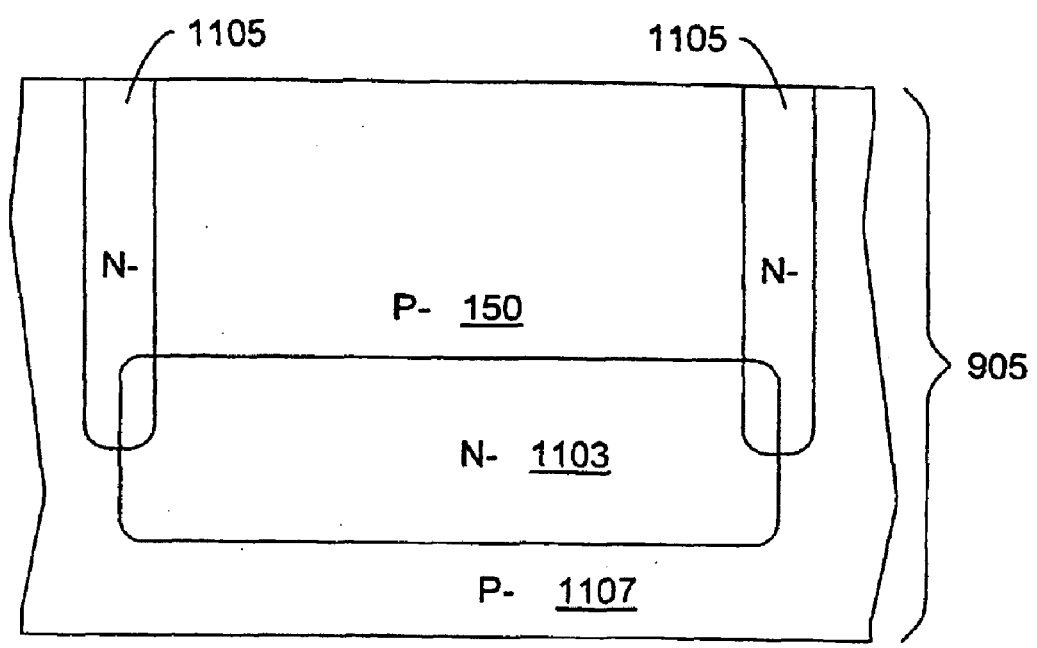
FIGS. 11, 12A are cross section illustrations of the memory of FIG. 9A at different stages of fabrication.

The memory is formed in and over an isolated P-type region 150 of monocrystalline silicon substrate 905 (FIG. 11). In some embodiments, the top surface of substrate 905 has a crystal orientation <100>; the substrate is doped with boron to a concentration of 2E15 to 2E16 atoms/cm$^3$. As indicated above, this crystal orientation, the dopant, and the concentration values are illustrative and not limiting.

Region 150 is formed as follows. N type dopant is implanted into substrate 905 by ion implantation through a mask opening to form an N-region 1103 which insulates the region 150 from below. For example, phosphorus is implanted at an energy of 1.5 MeV and a dose of 1.0E13 atoms/cm$^2$.

In a separate ion implantation step or series of steps, using another mask (not shown), N type dopant is implanted to form an N-region 1105 completely surrounding the region 150 on all sides. In some embodiments, this step creates also N wells (not shown) in which peripheral PMOS transistors will be formed for peripheral circuitry. Such circuitry may include sense amplifiers, input/output drivers, decoders, voltage level generators. Creating such N wells is well known in CMOS technology.

Regions 1103, 1105 are at a voltage equal to or above the voltage of substrate region 150 during memory operation. Exemplary voltages for region 150 are shown in Table 1 below. The areas 1107 of substrate 905 that surround the regions 1103, 1105 are at some voltage equal to or below the voltage of the regions 1103, 1105. In some embodiments, the regions 150, 1103, 1105 are shorted together, and the region 1107 is at ground.

The invention is not limited to a particular region 150 isolation technique, or to memories having an isolated substrate region.

Figure 12A:
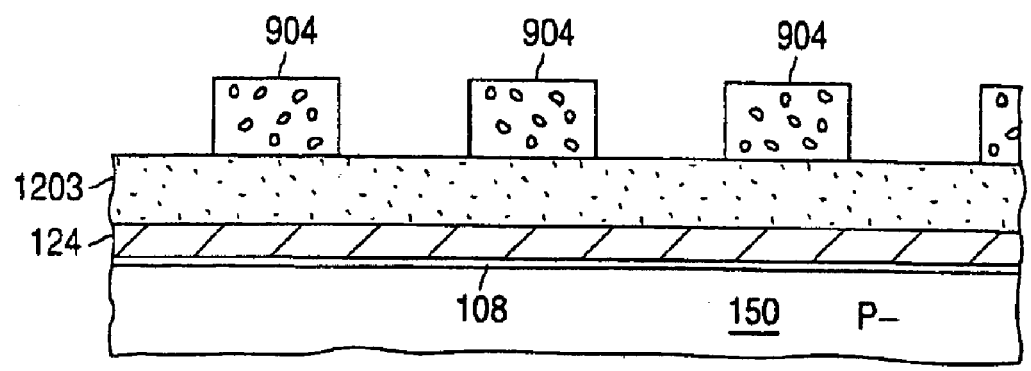

As shown in FIG. 12A, silicon dioxide 108 (tunneling oxide) is grown on substrate 905 by thermal oxidation. In some embodiments, the oxide is grown at around 800° C. by dry oxidation to a thickness of 9 nm.

Conductive polysilicon layer 124 is formed on oxide 108. In some embodiments, polysilicon 124 is deposited to a thickness of 120 nm by LPCVD (low pressure chemical vapor deposition), and is lightly doped (N type) during or after deposition. Layer 124 will provide the floating gates and, possibly, other circuit elements as needed for the peripheral circuitry. Such elements may include interconnects, transistor gates, resistors, capacitor plates.

Silicon nitride 1203 is deposited over polysilicon 124. In some embodiment, nitride 1203 is deposited to a thickness of 120 nm by LPCVD. If desired, a silicon dioxide layer (not shown) can be grown on polysilicon 124 before the nitride deposition to relieve stress.

Figure 12B:
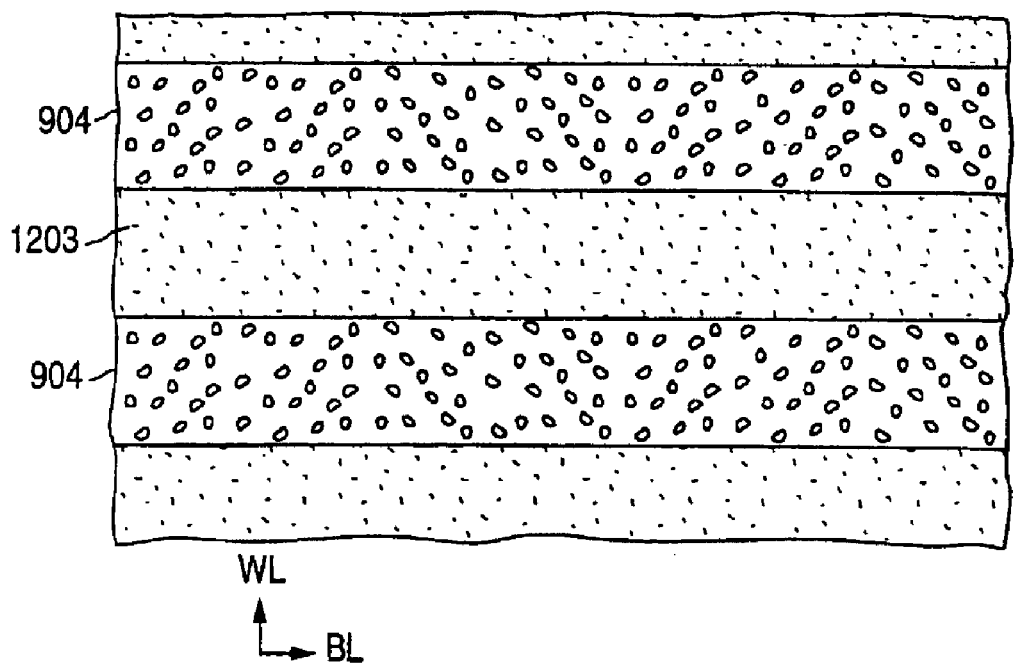
FIG. 12B is a top view of the structure of FIG. 12A.

Photoresist mask 904 is formed photolithographically over nitride 1203. Nitride 1203 and polysilicon 124 are etched through the mask openings to form strips extending in the bitline direction through the memory array. In the top view of FIG. 12B, the "BL" axis indicates the bitline direction. The "WL" axis indicates the wordline direction. The etch of polysilicon 124 and nitride 1203 is a reactive ion etching process (RIE) in some embodiments.

A misalignment of mask 904 does not affect the cell geometry and hence may have to be accommodated, if at all, only at the array boundaries and in the peripheral areas (the areas in which the peripheral circuitry is located).

Figure 13:
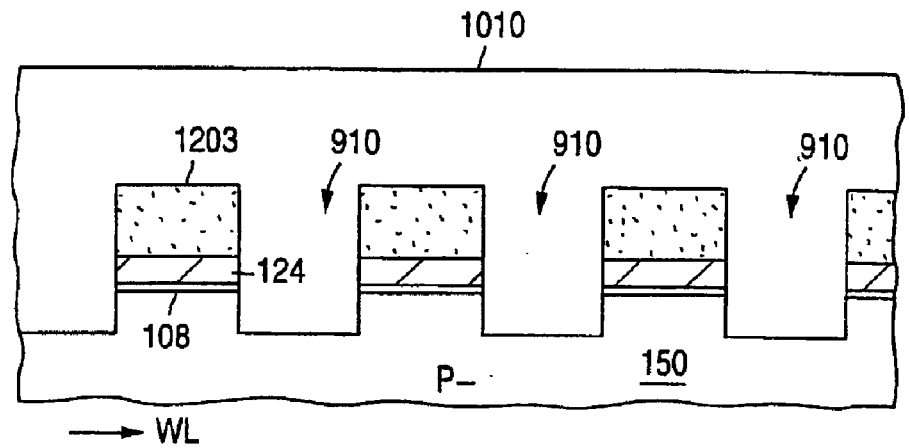
FIGS. 13–15 are cross section illustrations of the memory of FIG. 9A at different stages of fabrication.

After the polysilicon etch, oxide 108 and substrate region 150 are etched through the openings in mask 904 to form isolation trenches 910 (FIG. 13). Isolation trenches for the peripheral circuitry (not shown) are also formed in this step. The etch can be RIE. In some embodiments, the trench depth is 0.25 $\mu$m.

Then mask 904 is removed.

Whenever a masked etch of two or more layers is described herein, it is assumed, unless stated otherwise, that only the top layer may be etched using the mask. After the top layer is etched, the mask may be removed, and the remaining layers may be etched with the top layer as a mask, or even without a mask. For example, after the etch of nitride 1203, the mask 904 may be removed, and then polysilicon 124, oxide 108 and substrate 150 can be etched with nitride 1203 as a mask. Nitride 1203 may also be etched but is not completely removed.

Trench insulation 1010 (FIG. 13) fills the trenches 910 and covers the wafer. In some embodiments, insulation 1010 is formed as follows. A 13.5 nm layer of silicon dioxide is grown on the exposed surfaces of trenches 910 by a well-known RTO (rapid thermal oxide) process. Then a 480 nm layer of silicon dioxide is deposited by chemical vapor deposition (CVD) using high density plasma (HDP).

Figure 14:
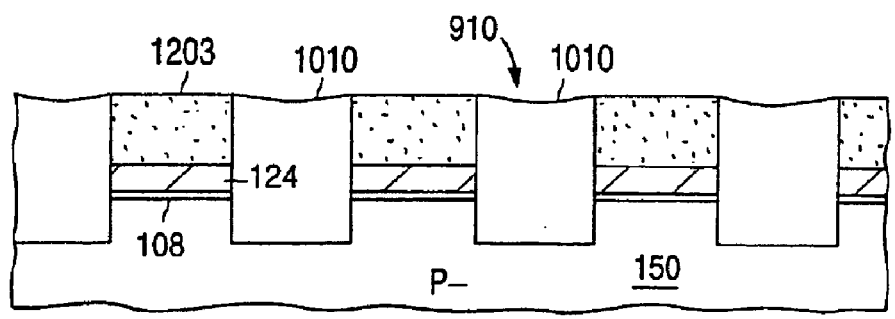
Figure 15:
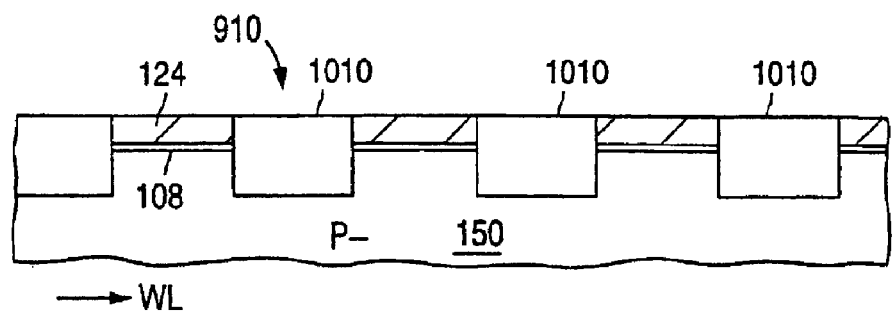

Trench insulation 1010 is subjected to chemical mechanical polishing (CMP) and/or some blanket etch process, until silicon nitride 1203 is exposed (FIG. 14). Nitride 1203 acts as a stop layer during this step. Then nitride 1203 is removed (by a wet etch, for example). Optionally, insulation 1010 is etched down also. A timed wet etch can be used for this purpose. The resulting structure may have a planar top surface as shown in FIG. 15. Alternatively, the etch of insulation 1010 may expose the sidewalls of polysilicon 124. This may improve the efficiency of the memory cells as explained below in connection with FIG. 24C.

Then insulation 98 (FIGS. 9B, 9C) is formed. In some embodiments, the insulation 98 is ONO (oxide-nitride-oxide). First, silicon dioxide 98.1 (FIG. 16) is thermally grown on polysilicon 124 by dry oxidation at a temperature 800° C. or below. An exemplary thickness of oxide 98.1 is 6 nm. Then silicon nitride 98.2 is deposited to a 4 nm thickness by LPCVD. Then silicon dioxide 98.3 is thermally grown by wet oxidation at a temperature below 850° C.

Figure 16:
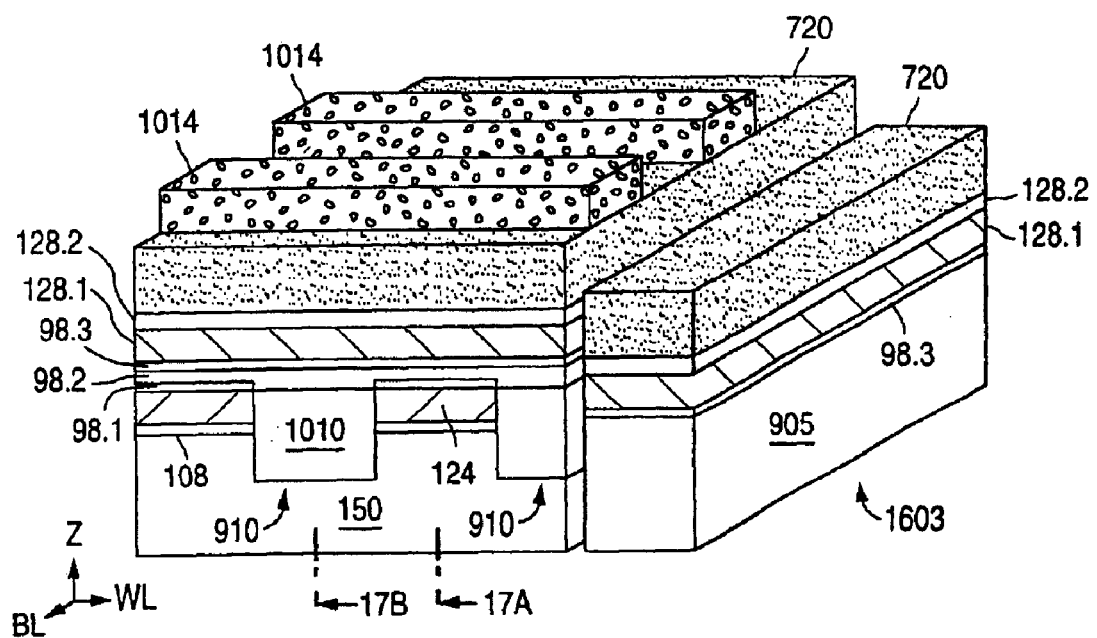
FIG. 16 is a perspective view of the memory of FIG. 9A during fabrication.

In FIG. 16, oxide 98.3 also provides gate insulation for the peripheral transistors. Before the oxide 98.3 is grown, a photoresist mask (not shown) is formed over the memory array. The mask exposes peripheral areas 1603. Layers 98.2, 98.1, 124, and 108 are etched off the peripheral areas to expose the substrate 905. Then the mask is removed, and the wafer is oxidized to grow the oxide 98.3. An exemplary thickness of oxide 98.3 is 24 nm in the peripheral areas 1603, and 1 nm in the memory region over nitride 98.2. Oxide 98.3 is thinner over the nitride 98.2 because silicon dioxide grows slower over the nitride than over the silicon 905.

Polysilicon layer 128.1 is formed on insulation 98. In some embodiments, polysilicon 128.1 is deposited by LPCVD to a thickness of 80 nm and is doped N+ or P+ during or after deposition. Then tungsten silicide 128.2 is deposited, to a thickness of 50 nm for example. WSi$_x$ layer 128.2 can be formed by CVD. Then silicon nitride layer 720 is deposited over the wafer. Layer 720 can be formed by LPCVD, and can be 160 nm thick.

In some embodiments, one of polysilicon 128.1 and tungsten silicide 128.2 is omitted or replaced with some other material.

Photoresist 1014 is deposited and patterned photolithographically into strips extending in the wordline direction over the memory array. Resist 1014 will be used to form stacks 710 (FIGS. 9A, 9B, 9C). Resist 1014 will also be used to pattern peripheral transistor gates 128.1, 128.2, and silicon nitride 720 in the peripheral areas 1603. A misalignment of the resist mask 1014 does not change the geometry of the memory cells and hence may have to be accommodated only at the boundaries of the memory array and in the peripheral areas.

Figure 17A:
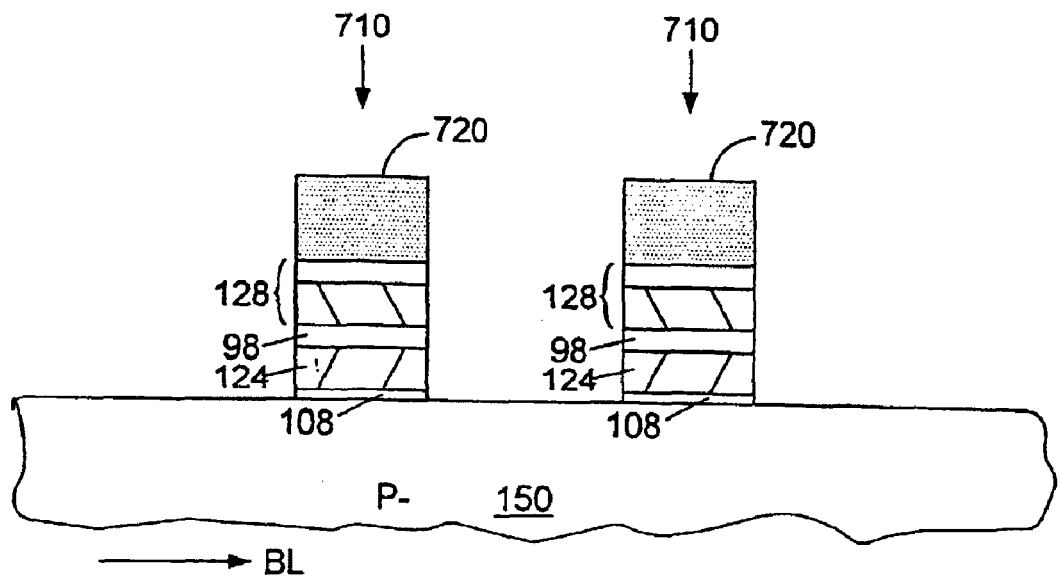
FIGS. 17A, 17B, 18A, 18B, 19A, 19B, 20A, 20B, 21A, 21B, 22A, 22B are cross section illustrations of the memory of FIG. 9A during fabrication.
Figure 17B:
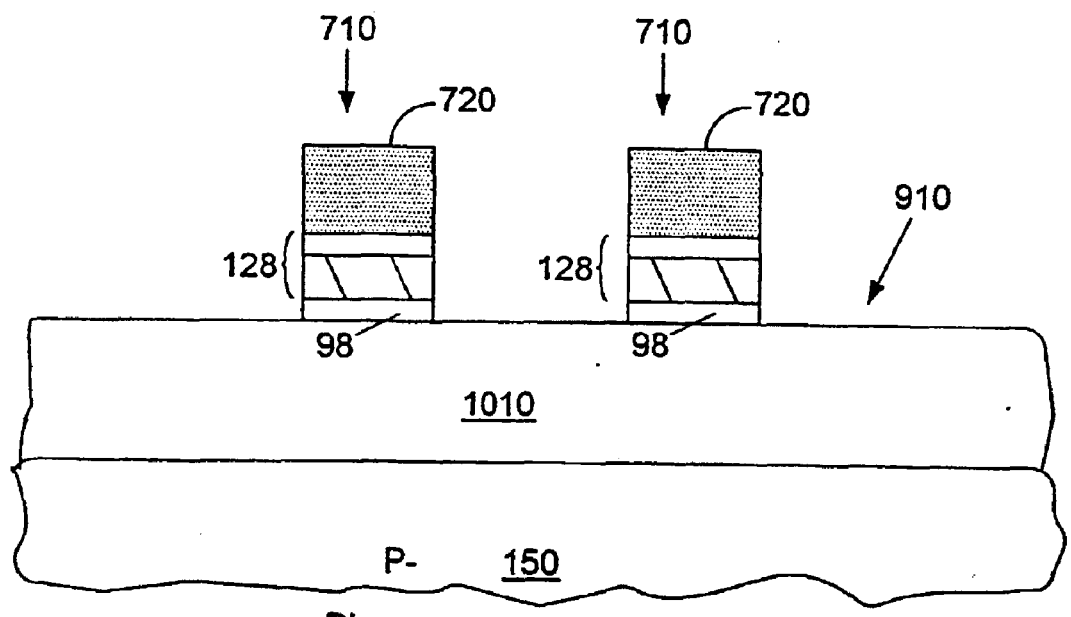

Layers 720, 128 (i.e. 128.1 and 128.2), 98 are etched to define the stacks 710. An exemplary etch is anisotropic RIE. Then mask 1014 is stripped, and another photoresist mask (not shown) is formed over the peripheral areas 1603. Polysilicon 124 and oxide 108 are etched with silicon nitride 720 as a mask in the memory array, while the resist protects the silicon substrate 905 in the peripheral active areas. Then the resist is stripped. The resulting memory array cross sections are shown in FIGS. 17A, 17B. The cross sectional planes in these figures are parallel to the bitlines. The cross sectional planes are indicated by respective arrows 17A, 17B in FIG. 16. In FIG. 17B, the cross section is along a trench 910. In FIG. 17A, the cross section is taken between the trenches.

Similarly, FIGS. 18A, 19A, 20A, 21A, 22A, 23A, 24A, 31A, 32A, 33A illustrate cross sections taken between the trenches. FIGS. 18B, 19B, 20B, 21B, 22B, 23B, 24B, 31B, 32B, 33B illustrate cross sections taken along a trench 910.

In some embodiments, layer 128 is not used to form the peripheral transistor gates. The peripheral transistor gates are formed from a subsequently deposited polysilicon layer 520 (FIGS. 9A, 9B, 9C) from which the wordlines are fabricated. In this case, the etch of layers 98.2, 98.1, 124, 108 before formation of oxide 98.3 is omitted, and the masking step to protect the memory array during this etch is also omitted. When mask 1014 is formed, the peripheral active areas are covered by layers 108, 124, 98, 128, 720, i.e. the same layers that cover the active areas of the memory array. These layers are etched in the peripheral areas and the memory array area at the same time while resist 1014 is masking the stacks 710. Resist 1014 does not need to be stripped after the etch of oxide 98.3, and the mask, described above, protecting the peripheral active areas during the etch of layer 124 is omitted.

The structure is oxidized (e.g. by RTO (rapid thermal oxidation) in oxygen atmosphere at 1080° C). As a result, silicon dioxide 1510 (FIGS. 18A, 18B) is grown on the exposed surface of substrate region 150 to a thickness of 5 nm. This operation also results in oxidation of the exposed sidewalls of polysilicon layers 124, 128.1. The horizontal thickness of oxide 1510 on the polysilicon sidewalls is 8 nm.

A thin conformal layer 903 of silicon nitride (FIGS. 19A, 19B) is deposited to a 20 nm thickness by LPCVD. Layer 903 is etched anisotropically without a mask to form spacers over the sidewalls of stacks 710.

This etch also removes exposed portions of oxide 1510. Silicon dioxide is regrown on substrate region 150 by dry oxidation at a temperature below 800° C. This oxide, shown at 1810 in FIG. 19A, will provide gate insulation for the select transistors. An exemplary thickness of oxide 1810 is 5 nm.

In some embodiments, either nitride 903 or oxide 1510 is omitted.

Conductive polysilicon layer 520 (FIGS. 20A, 20B, 21A, 21B) is formed. In some embodiments, polysilicon 520 is deposited by LPCVD to a thickness of 300 nm, and is heavily doped (N+ or P+) during or after deposition. Layer 520 is subjected to a blanket of anisotropic etch (e.g. RIE) to form spacers over the sidewalls of stacks 710. The vertical thickness of nitride 720 and polysilicon 520 can be adjusted to control the width of spacers 520.

In FIGS. 20A, 20B, 21A, 21B, spacers 520 are formed on each sidewall of stacks 710. In some embodiments, the source lines 144 are so narrow that the polysilicon 520 fills the gap between the stacks 710 over the source lines and does not form spacers on the stacks' sidewalls adjacent to the source lines.

In addition to the select gates, layer 520 can provide interconnects, transistor gates, and other circuit elements for the peripheral circuitry. For that purpose, layer 520 can be masked in the peripheral areas before it is etched. No such masking is needed over the memory cells.

Photoresist mask 1710 (FIGS. 21A, 21B) is formed photolithographically over those portions of polysilicon 520 which will provide the wordlines. Mask 1710 may also cover parts or all of the peripheral areas. Mask 1710 forms strips extending in the wordline direction. Each strip overlaps two adjacent stacks 710 between the adjacent source lines 144, and covers the bitline regions 134. Source lines 144 are not covered by the mask.

The longitudinal edges of mask 1710 can be positioned anywhere over the stacks 710, so their positioning is not critical if the mask alignment tolerance is not more than one half of the width of a stack 710. In some embodiments, the minimal feature size is 0.14 μm. The mask alignment tolerance is 0.07 μm. The width of each stack 710 is 0.14 μm, that is, twice the alignment tolerance.

Figure 22A:
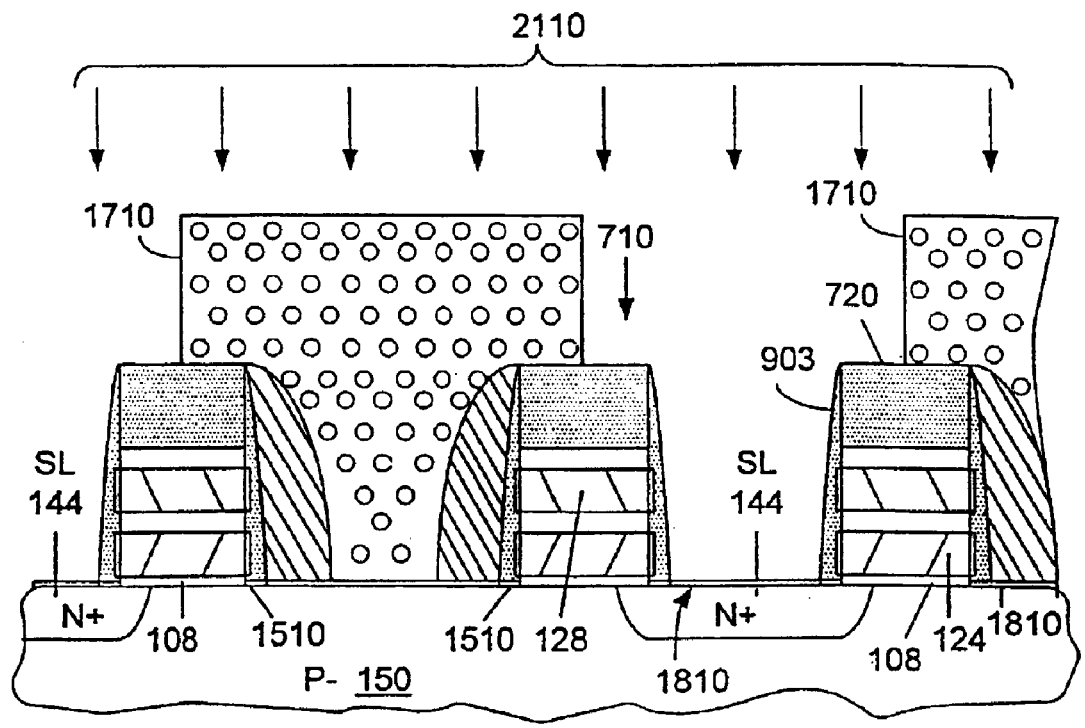
Figure 22B:
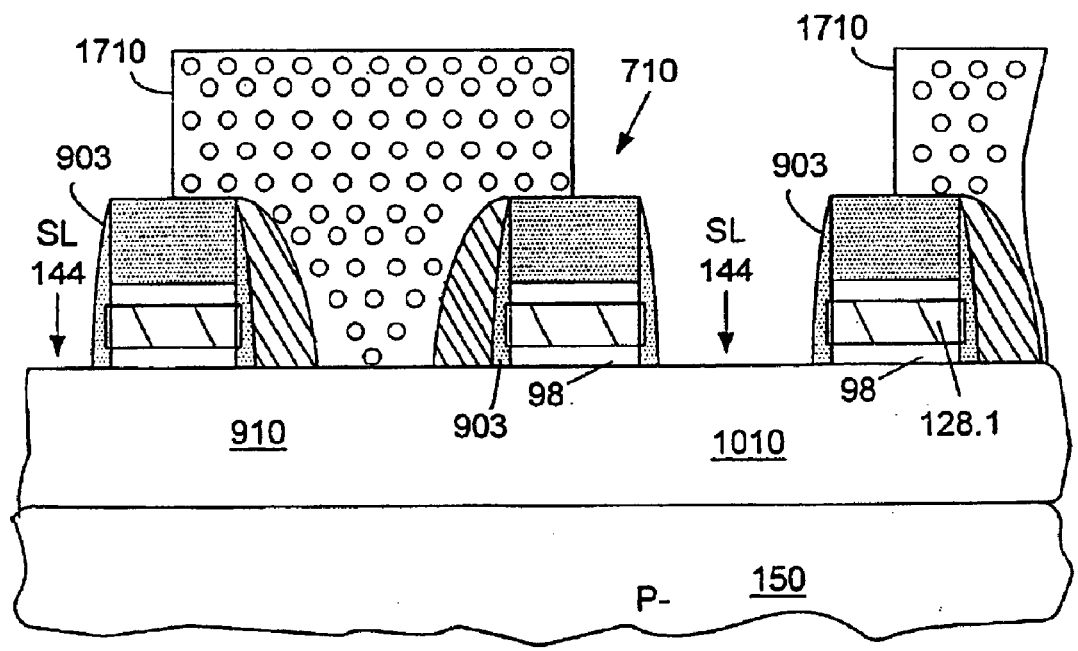

Polysilicon 520 is etched off the source line side of each stack 710 (FIGS. 22A, 22B). A polysilicon wordline 520 remains on the bitline side of each stack.

After the etch of polysilicon 520, mask 1710 remains in place as N type dopant (e.g. phosphorus) is implanted into the wafer to heavily dope (N+) the source lines 144, as shown by arrows 2110 in FIG. 22A. This is a "deep" implant done to enable the source lines to carry high voltages for erase and/or programming operations. The deep implant will also provide a suitable overlap between the doped source lines and the floating gates 124 when the dopant diffuses laterally (as shown in FIG. 22A).

Figure 22C:
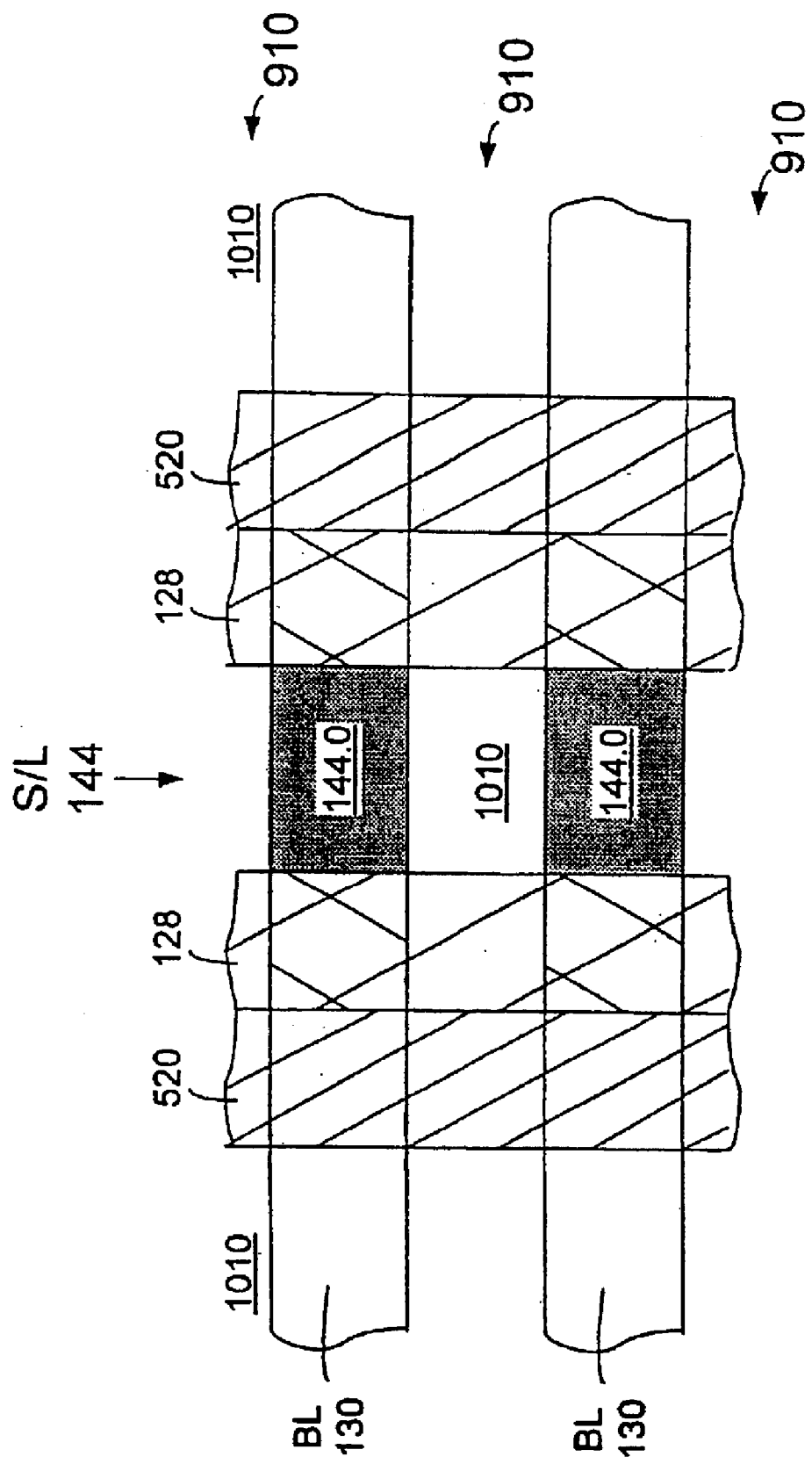
FIG. 22C is a top view of the structure of FIGS. 22A, 22B.

In some embodiments, the dopant does not penetrate the insulation 1010, so the bottoms of trenches 910 are not doped in this step (see FIG. 22B). The source line regions doped in this step are marked "144.0" in FIG. 22C. Whether or not the dopant penetrates the insulation 1010, insulation 1010 prevents the dopant from coming close or reaching the N-region 1103 (FIG. 11). Therefore, a high leakage current or a short between the source lines 144 and the region 1103 is avoided. In some embodiments, the top surface of region 1103 at the end of fabrication (after thermal steps) is about 1 μm below the top surface of substrate 905 (of region 150). The trench depth is 0.25 μm.

Figure 23A:
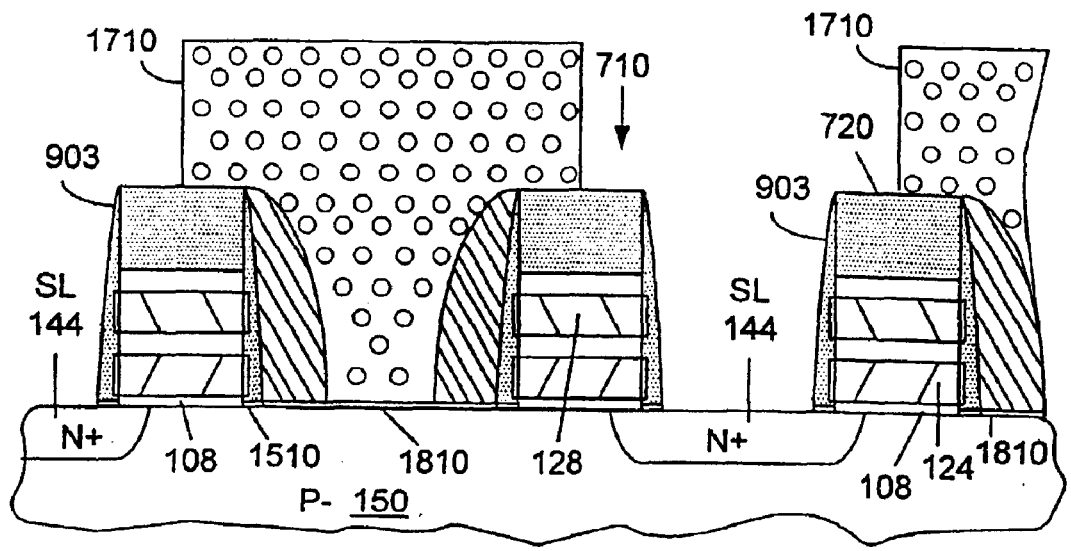
FIGS. 23A, 23B, 24A, 24B, 24C are cross section illustrations of memory embodiments of the present invention during fabrication.
Figure 23B:
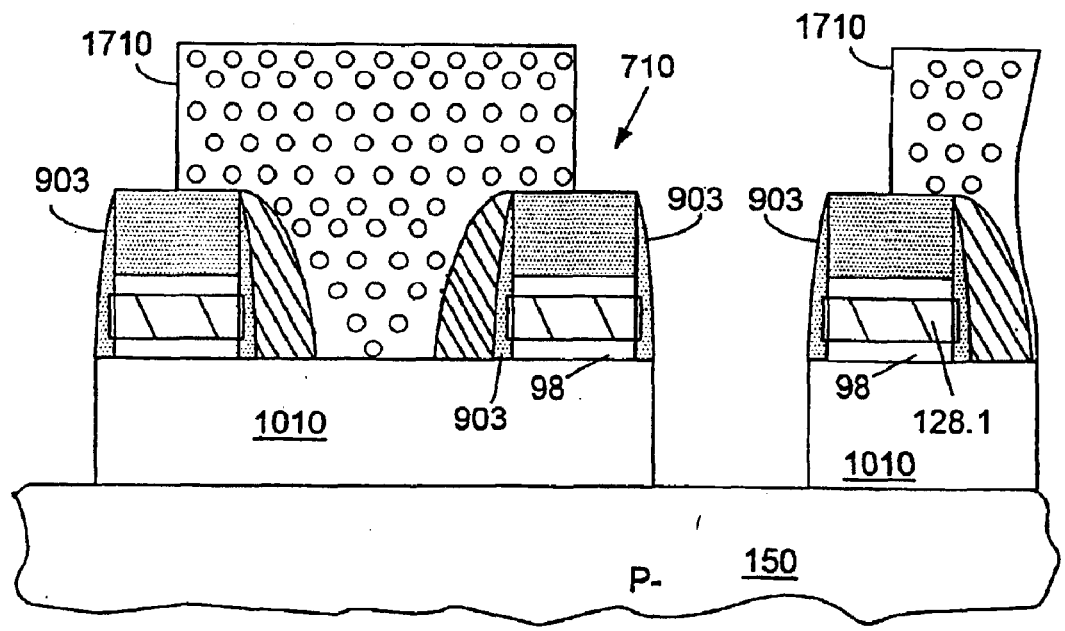

After the implant, mask 1710 is left in place, and the exposed insulation 1010 is completely or partially etched out of the trenches at the location of source lines 144 (FIG. 23B). Nitride 903 and oxide 1510 protect the sidewalls of layers 124, 128 from being exposed. The etch can be anisotropic, e.g. RIE. Oxide 1810 is etched off the source lines 144 during this step (FIG. 23A).

Then mask 1710 is removed, and a blanket N+ implant 2401 is performed to dope the bitline regions 134 and source lines 144 (FIGS. 24A, 24B, 9B, 9C). Stacks 710 and polysilicon wordlines 520 mask the substrate during this implant. Polysilicon 520 is also implanted during this step. In some embodiments, the implantation process includes ion implantation at a non-zero angle relative to the vertical axis (the axis perpendicular to the wafer) to dope the trench sidewalls. In some embodiments, the angle is 7°, 8°, or 30°. The dopant can be arsenic.

This implant does not penetrate insulation 1010 adjacent to bitline regions 134, so the bitline regions are not shorted together.

Memory fabrication can be completed using known techniques. Insulating layers (not shown) can be deposited. Contact openings such as 138 (FIG. 9A) can be formed. Conductive materials can be deposited and patterned to provide bitlines and other features as needed.

As explained above in connection with FIG. 15, after insulation 1010 has been polished, it can be etched down to expose the sidewalls of polysilicon 124. That embodiment is illustrated in FIG. 24C which shows a cross section of the memory array along the wordline by a plane passing through control gate 128. Control gate 128 includes portions 128A adjacent to the sidewalls of floating gate 124. As a result, capacitive coupling between control gate 128 and floating gate 124 is improved. In some embodiments, the thickness of layer 124 is 120 nm. The width of floating gate 124 in the view of FIG. 24C is 140 nm. If the top surface of layer 124 is on the order of 60 nm above the top surface of insulation 1010, it is believed that significant improvement of the coupling between the control and floating gates can be achieved.

In some embodiments, the gates of peripheral transistors are formed from polysilicon layer 520 rather than layer 128. This eliminates the need to mask the memory array and remove polysilicon 124 and insulation 98.2, 98.1, 108 from the peripheral areas 1603 before the deposition of control gate layer 128, as described above in connection with FIG. 16. In embodiments in which the peripheral transistor gates are formed from layer 520, the mask 1014, shown in FIG. 16, does not cover the peripheral areas 1603 or at least does not cover the areas in which the peripheral transistor gates will be formed. Therefore, when the stacks 710 are being defined, the layers 108, 124, 98, 128, and 720 are etched off the peripheral areas or at least off the areas of the peripheral transistor gates. Substrate 905 becomes exposed in the peripheral active areas.

Then the wafer is processed as described above in connection with FIGS. 17A, 17B, 18A, 18B, 19A, 19B. Silicon dioxide 1810 (FIG. 19A) will provide gate insulation for the peripheral transistors.

Figure 20A:
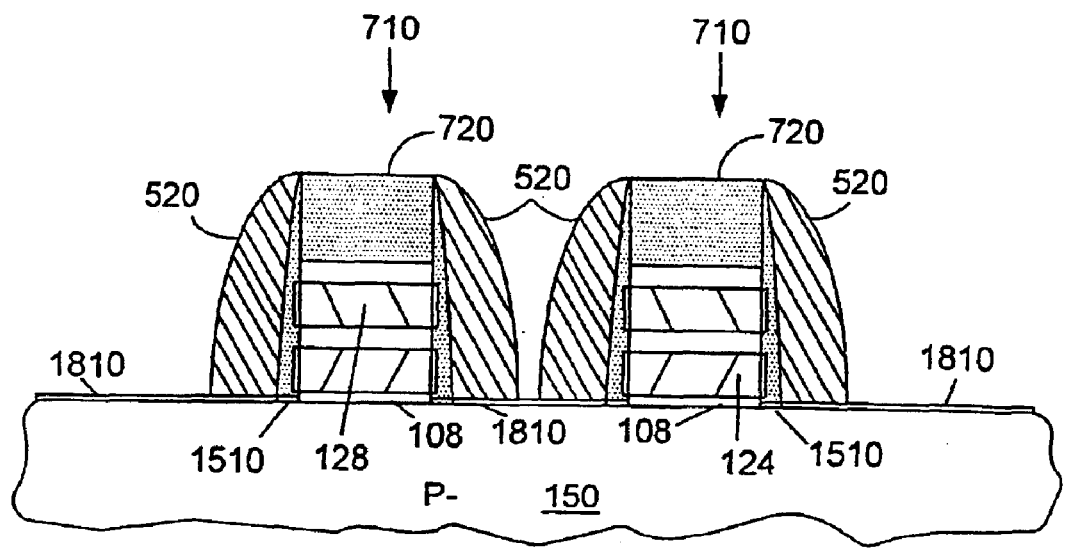
Figure 20B:
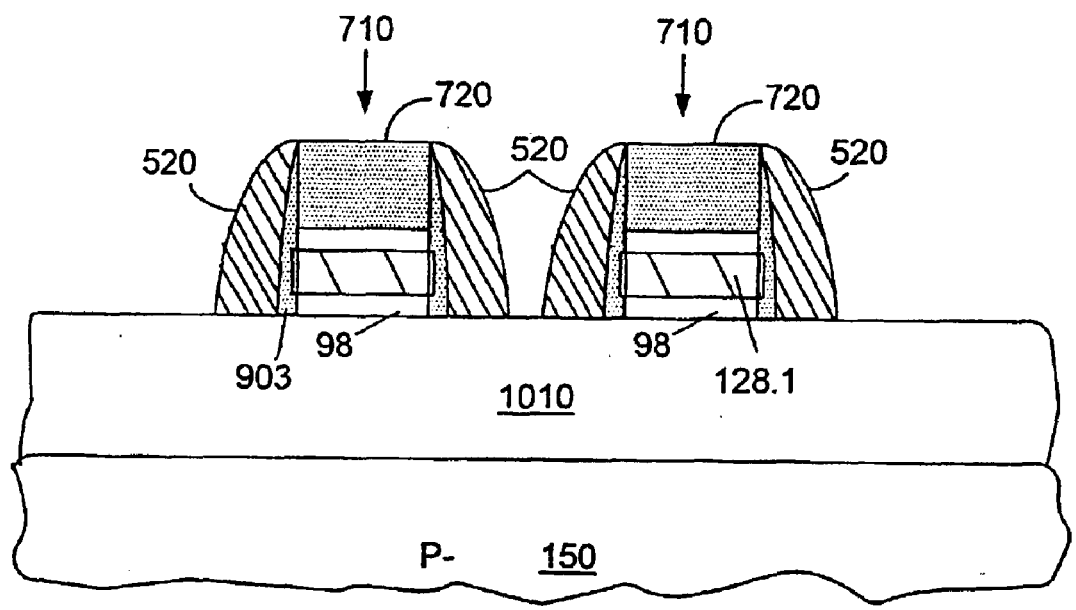

Then polysilicon 520 is deposited, as described above. The resulting structure is shown in FIG. 25. Before the anisotropic etch of polysilicon 520, a photoresist mask 2501 is formed over the peripheral areas to define the peripheral transistor gates and possibly other features (e.g. interconnects, resistors, etc.). Then the anisotropic etch of polysilicon 520 is performed as described above. Then resist 2501 is removed. A cross section of the peripheral area after the removal of resist 2501 is shown in FIG. 26A. The memory array cross section is shown in FIGS. 20A, 20B.

In some embodiments, the resistance of the peripheral transistor gates is reduced as follows. When the polysilicon 520 has been deposited (FIG. 25), a layer of tungsten silicide or some other low resistivity material (not shown) is formed over the polysilicon 520. Then mask 2501 is formed over the peripheral areas as described above. Then the tungsten silicide or the other material deposited over polysilicon 520 is etched off the areas not covered by the mask 2501. Then the anisotropic etch of polysilicon 520 is performed to form the spacers shown in FIGS. 20A, 20B, and to define the peripheral transistor gates and other peripheral features. Then the resist 2501 is removed. The tungsten silicide or the other conductive material 2605 (FIG. 26B) covers polysilicon 520 in the peripheral areas. Some of the material 2605 may also remain on the polysilicon 520 in the memory array if the material 2605 and the polysilicon are etched at the same time.

Mask 1710 (FIG. 21A) will protect the peripheral active areas during the etch that removes polysilicon 520 off the source lines.

Figure 26C:
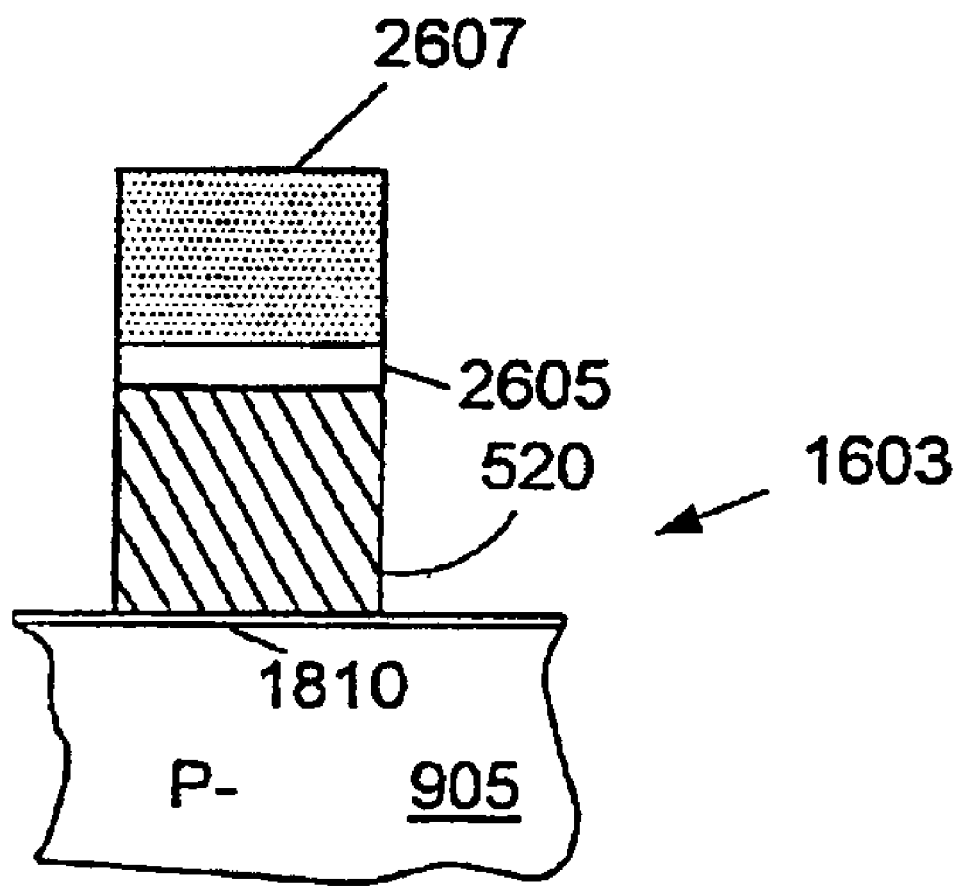

In some embodiments, before mask 2501 is formed, a layer of silicon nitride 2607 (FIG. 26C) is deposited over polysilicon 520. If conductive material 2605 is used to reduce the resistance of the peripheral transistor gates, then the silicon nitride is deposited over the material 2605. Then mask 2501 is formed over the peripheral transistor gates as described above. Then silicon nitride is etched off the areas not covered by the mask. The wafer is processed as described above in connection with FIGS. 25, 26A, 26B. FIG. 26C shows the resulting cross section of the peripheral area in an embodiment having the conductive material 2605. Silicon nitride layers 720, 2607 will act as stop layers when the structure is later polished with CMP. The CMP polishing can be performed to planarize the wafer after the wafer is covered with insulation (e.g. vapox, not shown) at the stage of FIGS. 24A, 24B (after the source line and bitline doping).

In some embodiments, some of the peripheral transistor gates or other features are formed using layer 128, while other peripheral gates or features are formed using layer 520. One such embodiment is described below in connection with FIGS. 44–50.

Figure 27:
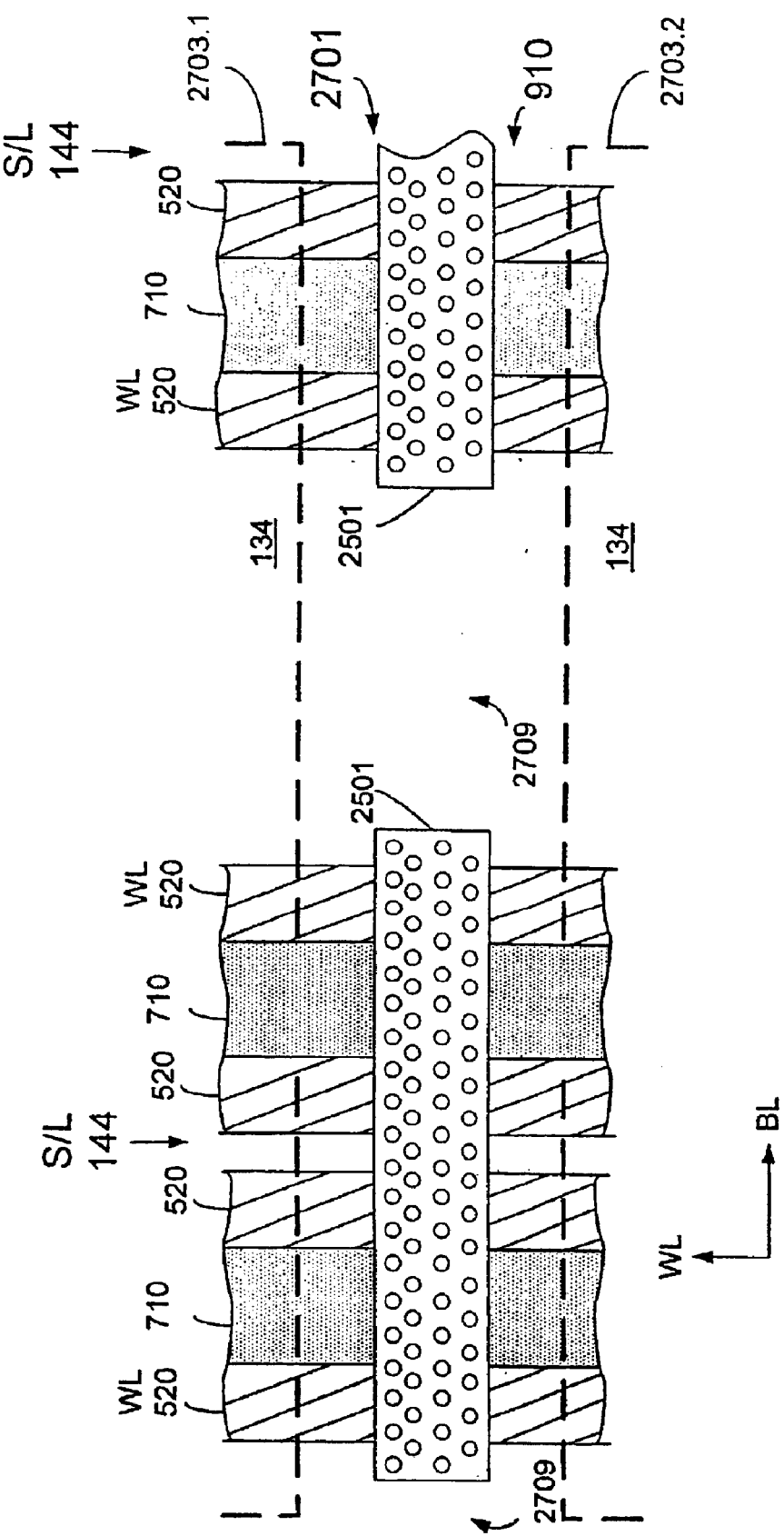
FIGS. 27, 28, 29 are top views of some memory embodiments of the present invention.
Figure 28:
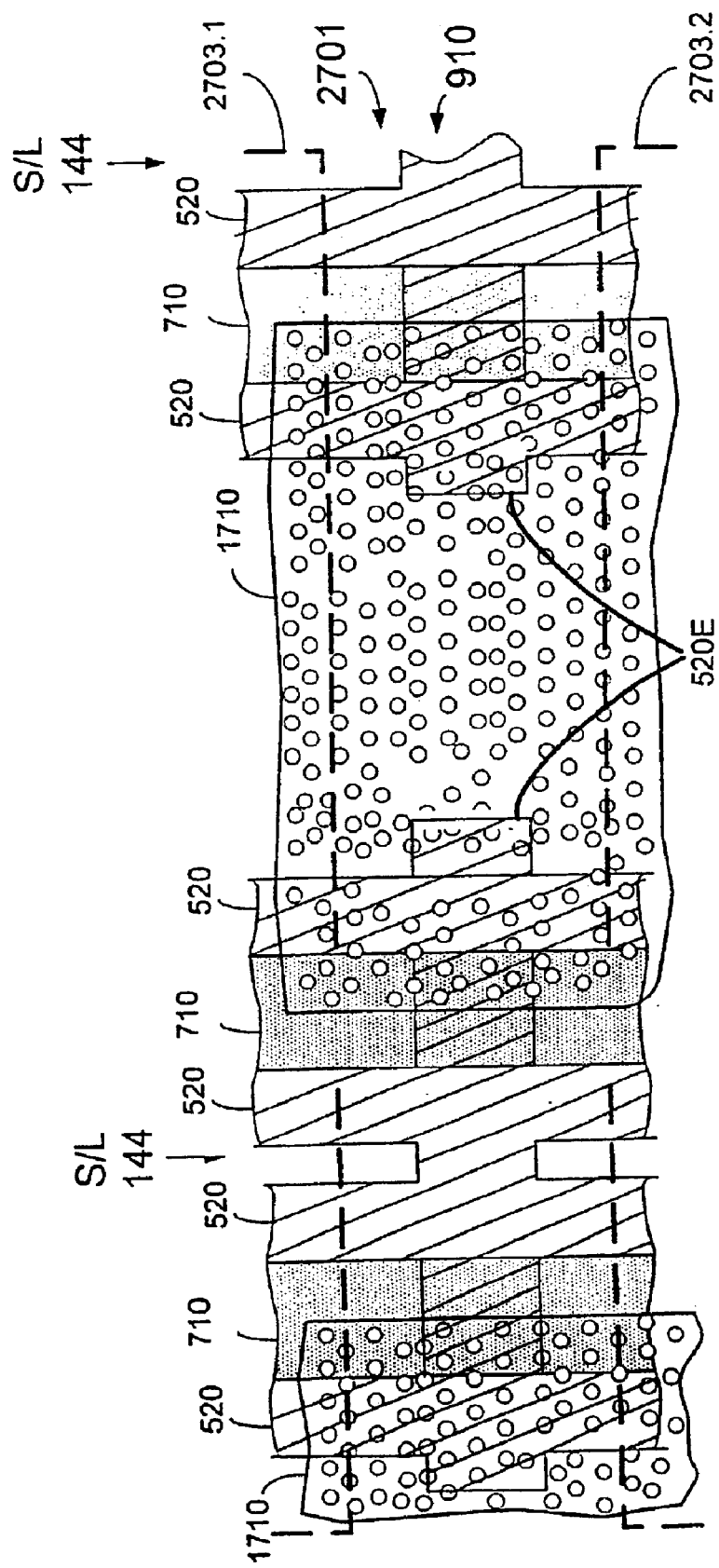

To reduce the resistance of polysilicon wordlines 520, some embodiments include metal strap lines each of which runs over a wordline 520 and contacts the wordline at periodic intervals (e.g., every 128 columns). Since wordlines 520 are narrow spacers, they can be provided with extensions so that low resistance contact to the strap lines can be made. Resist 2501 can be used to form such extensions. FIG. 27 illustrates the top view of one such embodiment after the anisotropic spacer-forming etch of polysilicon 520. In FIG. 27, the memory array is interrupted to have a gap 2701 extending through the array in the bitline direction to make room for the wordline extensions. The gap can be occupied by a trench 910. A memory array section 2703.1 is on one side of the gap (above the gap in the view of FIG. 27), and a memory array section 2703.2 is below the gap. Wordlines 520 and stacks 720 run uninterrupted across the sections 2703.1, 2703.2 and across the gap. Mask 2501, formed before the spacer-forming etch, covers portions of polysilicon 520 in gap 2701. The top view of the gap area after the removal of mask 2501 and formation of mask 1710 is shown in FIG. 28.

A memory array may have any number of gaps 2701. For example, a gap can be provided after every 128 columns (bitlines) in a memory array. A memory, of course, may have any number of memory arrays.

In FIG. 27, mask 2501 includes strips extending along the gap. Resist 2501 is interrupted in areas 2709 between adjacent wordlines 520 to allow the polysilicon 520 to be etched off between the wordlines. Therefore, a short between the adjacent wordlines is avoided. Mask 2501 may or may not be interrupted over the source lines 144. The mask need not be interrupted over the source lines because the polysilicon 520 is etched off the source lines using the mask 1710 (FIG. 28).

Mask 2501 may also cover peripheral transistor gates and other peripheral features as described above in connection with FIG. 25.

Figure 29:
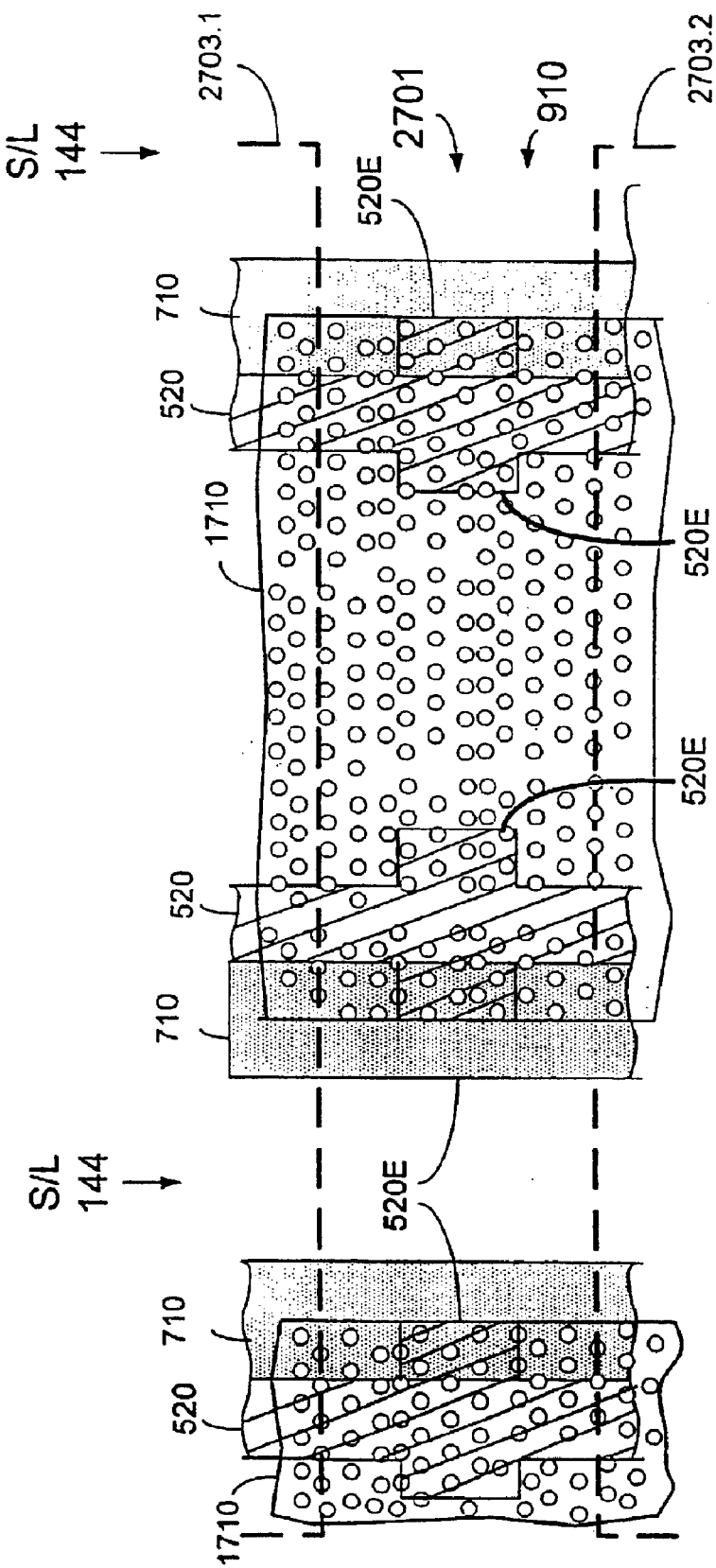

Mask 1710 (FIG. 28) may have the same geometry as described above in connection with FIGS. 21A to 23B, and may be used for the same purposes as described above, i.e. etch the polysilicon 520 off the source lines 144, perform a deep implant 2110 into the source lines, and etch insulation 1010 out of the trenches. FIG. 29 shows the top view after the polysilicon 520 has been etched off the source lines. Each polysilicon wordline 520 has horizontal extensions 520E in gap 2701.

Then the wafer is processed as described above in connection with FIGS. 22A–26C. If insulation 1010 is etched as described above in connection with FIG. 23B, insulation 1010 is totally or partially removed in gap 2701 at the location of source lines 144. The trench bottoms and sidewalls in gap 2701 are doped at the same time as in the memory array. Consequently, conductive source lines 144 run continuously through the gaps.

Figure 30A:
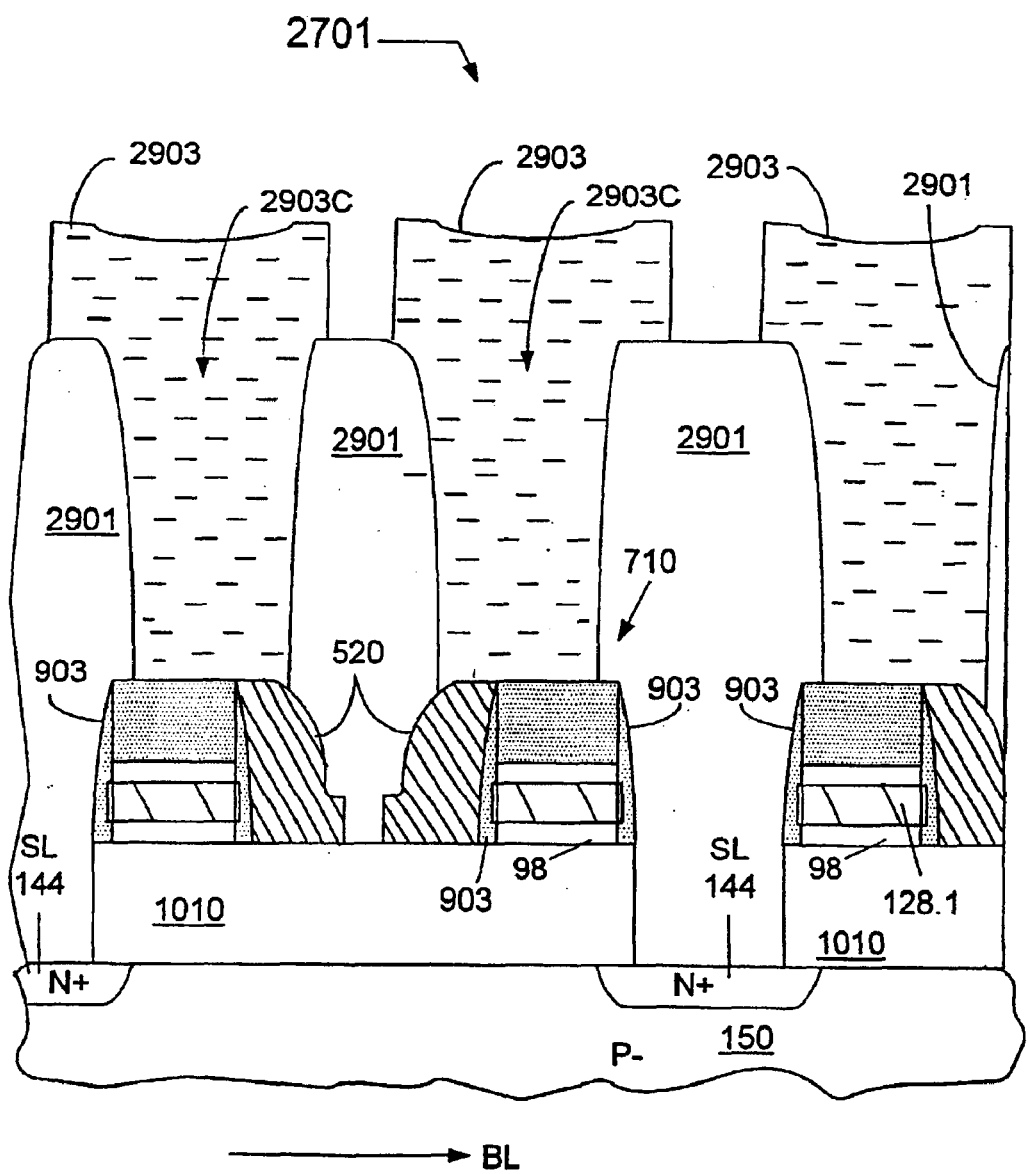
FIGS. 30A, 30B are cross section illustrations of memory embodiments of the present invention.

FIG. 30A shows a cross section of the memory in gap 2701 at a later stage of fabrication. Insulator 2901 has been formed over the memory cells. Each metal strap line 2903 runs above a respective wordline 520 and contacts the wordline in gap 2701 through openings 2903C in insulator 2901. In FIG. 30A, the top level of polysilicon layer 520 is at the same height as the top level of nitride 720 over the control gates 128, because the polysilicon 520 has been subjected to CMP polishing which stopped at the nitride. More particularly, insulation 2901 includes multiple layers. Some of these layers were deposited after the stage of FIGS. 24A, 24B, and then were polished by CMP. Then other insulation layers were formed to complete the layer 2901. In other embodiments, polysilicon 520 overlaps the nitride.

In some embodiments, an isolation trench 910 does not occupy the whole width (i.e. vertical dimension in FIGS. 28, 29) of gap 2701. Multiple isolation trenches, or no trench at all, can be located in the gap.

Figure 30B:
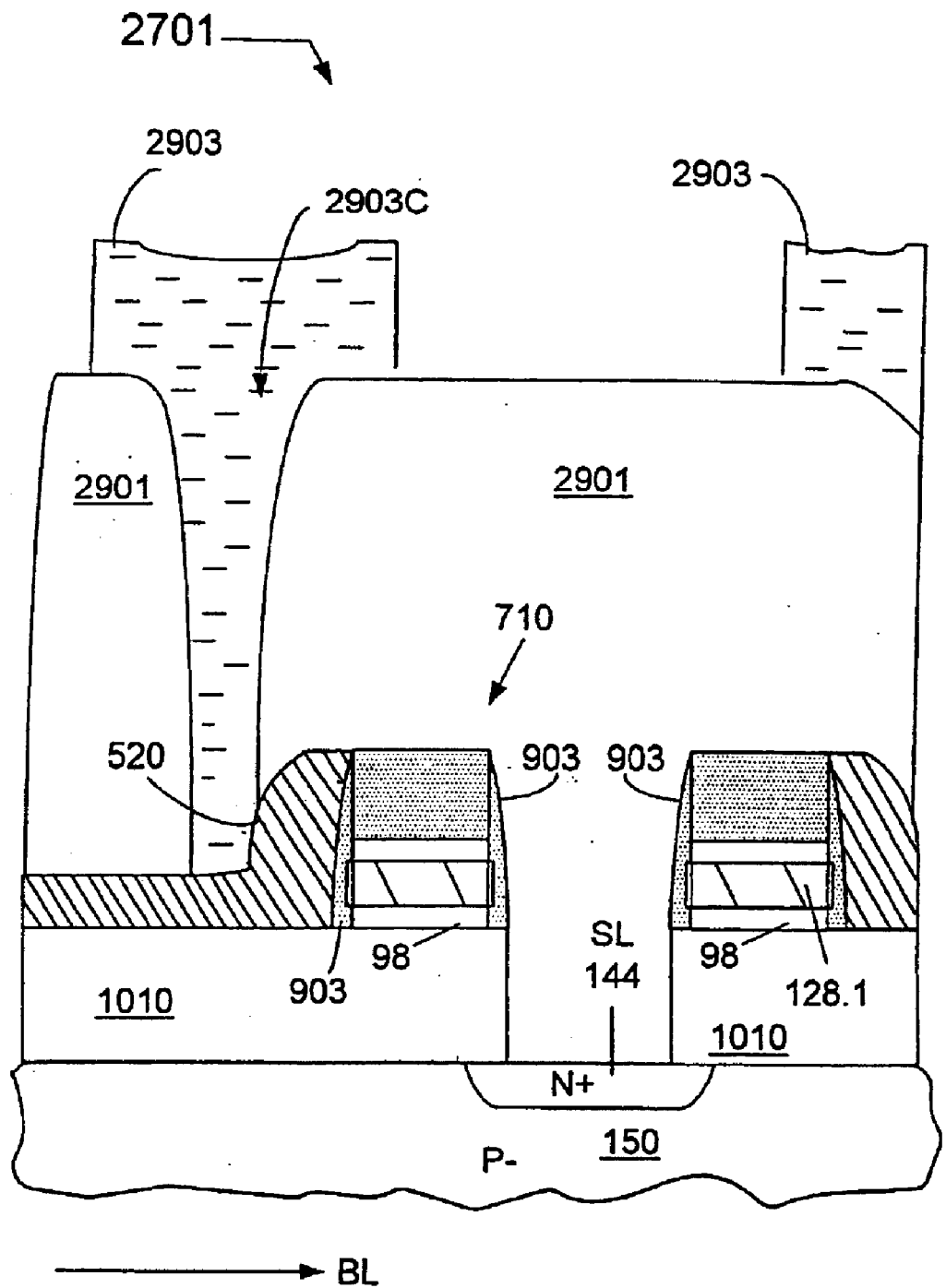
Figure 30C:
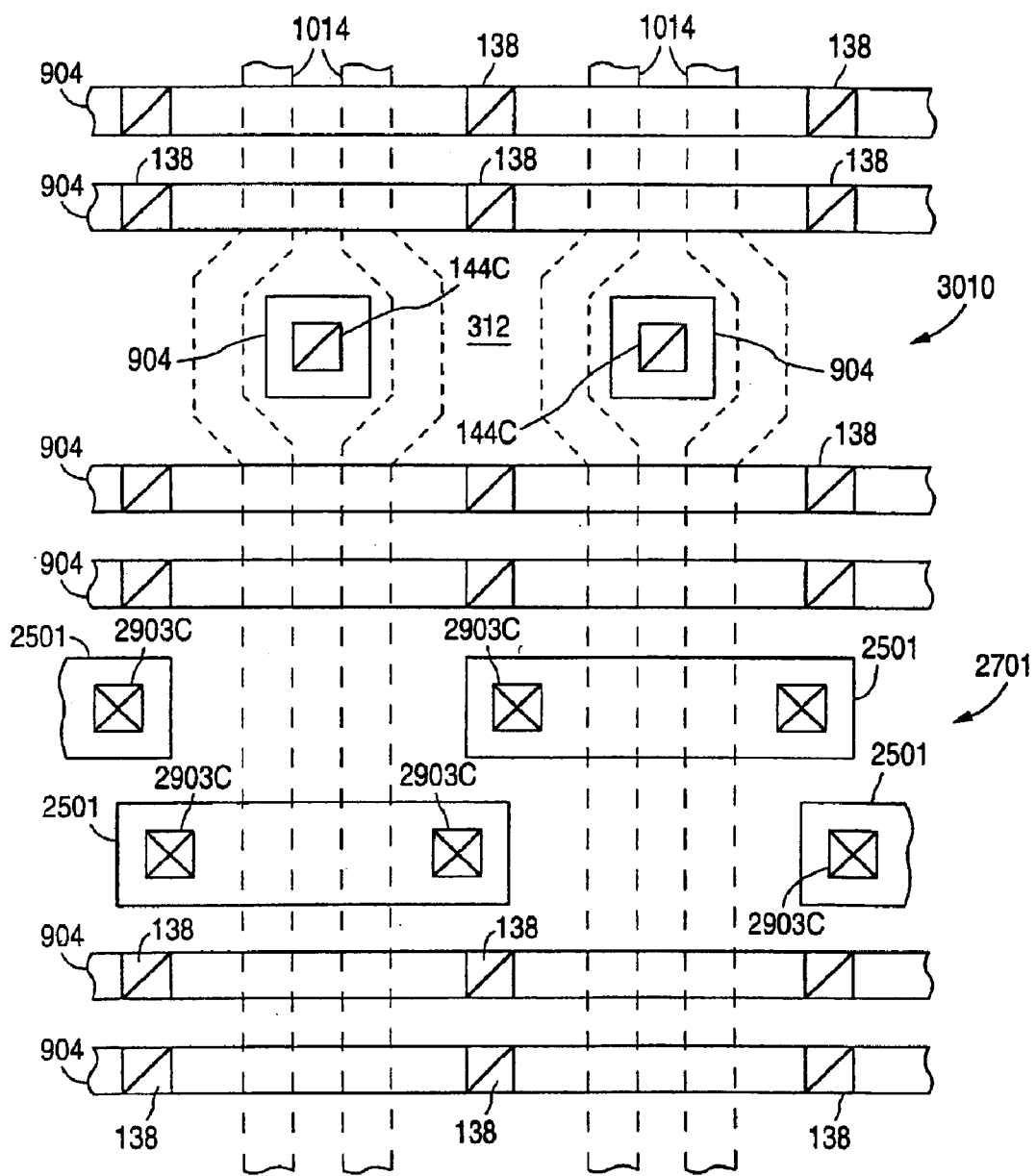
FIG. 30C shows a mask layout of a memory embodiment of the present invention.
Figure 31A:
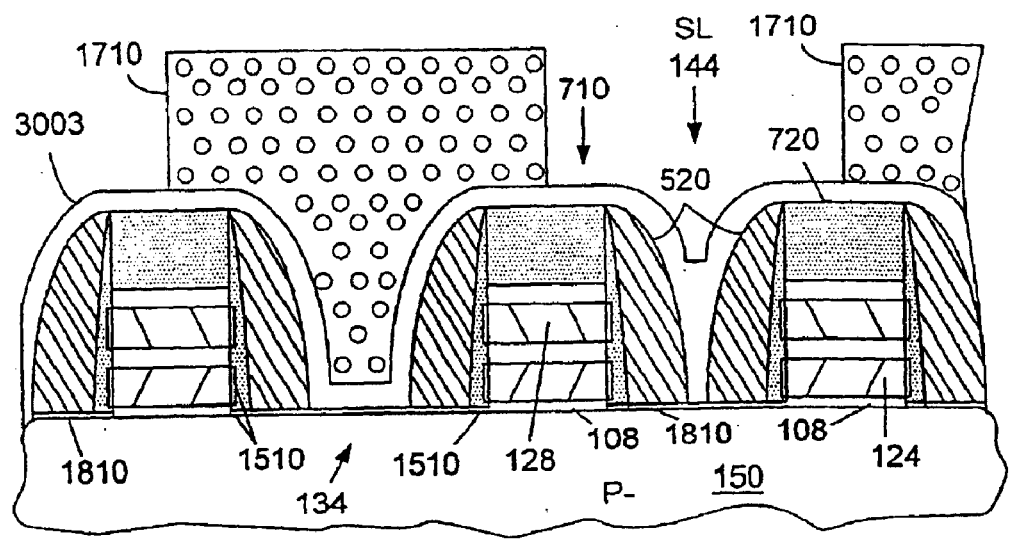
FIGS. 31A, 31B, 32A, 32B, 33A, 33B are cross section illustrations of some memory embodiments of the present invention.
Figure 31B:
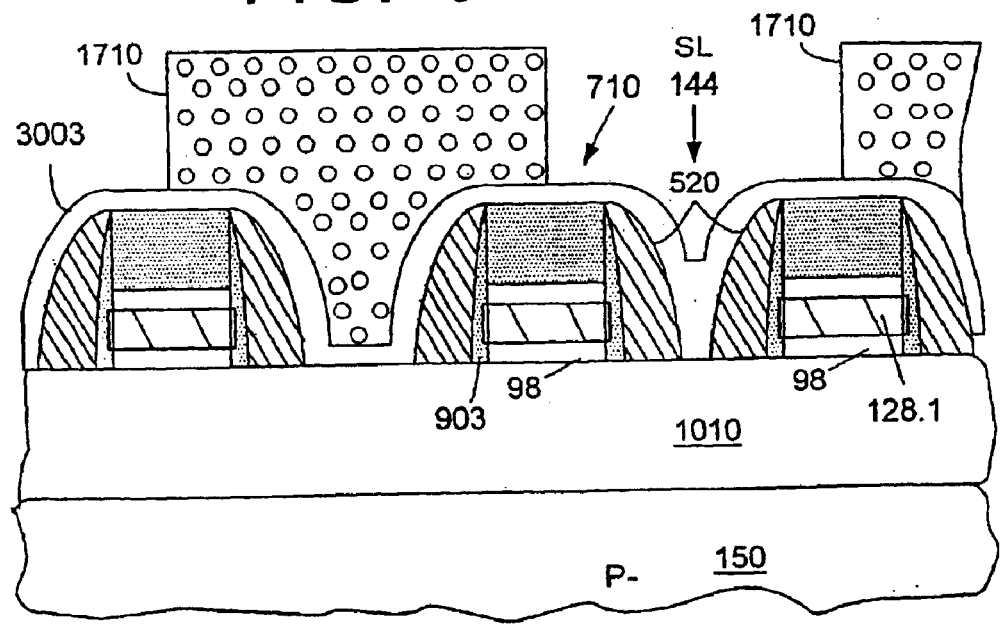

FIGS. 30B, 30C show respectively a cross section and a mask layout for the memory in another embodiment. FIG.

30C shows masks 904, 1014, and 2501 (see also FIGS. 12A, 12B, 16, 27). Bitline contacts 138 may or may not be etched at the same time as the contact openings 2903C to polysilicon 520. Contact openings 144C to source lines 144 can be etched at the same time as bitline contacts 138 or polysilicon contacts 2903C. In some embodiments, contact openings 138, 2903C, 144C, and contact openings (not shown) to control gates 128, are etched simultaneously using the same photoresist mask. Silicon nitride 710 is etched in the mask openings to expose the control gates. Contacts 2903C to polysilicon 520 are spaced from the control gates to avoid shorting the wordlines 520 to the control gates.

Contact openings 138 can be filled with plugs of N+ doped polysilicon using known techniques. If an etch of contact openings 138 attacks insulation 1010 in a trench 910 due to contact mask misalignment, the removed insulation 1010 in the trench will be replaced with the N+ polysilicon during the plug formation. The polysilicon plug will thus prevent a short between the metal contact the P doped substrate region 150.

In some embodiments, adjacent source lines 144 are shorted together. For example, source lines 144 can be grouped in groups of four, and each group of four source lines can be shorted together by a metal plate formed from layer 2903. The plate can contact the source lines in openings 144C in a gap 3010 running between adjacent columns of the memory array. Shorting the source lines reduces the area needed to connect the source lines to a higher metal layer (not shown) because only one contact opening (not shown) for the higher metal layer is needed for four source lines. The contacts to the higher metal layer can also be used to reduce the source line resistance. Metal strap lines made from the higher metal layer can run over the source lines and periodically contact the metal plates, made from layer 2903, which contact the source lines in openings 144C in gaps 3010. The memory array may have plural gaps 3010. For each group of the four source lines, the eight associated control gate lines 128 can also be shorted together.

Control gate lines 128, defined by mask 1014, curve around the source line contact openings 144C. If adjacent control gate lines 128 come very close to each other in bitline regions 312 in gaps 3010, the polysilicon 520 may fill the regions 312, undesirably causing the wordlines 520 to be shorted together in these regions. To avoid this short, mask 1710 (FIG. 28) can be used to remove polysilicon 520 in gaps 3010. This may cause each wordline spacer 520 to be interrupted in gaps 3010, but individual sections of the wordline between the gaps 3010 will be electrically connected together by metal strap lines 2903 (FIG. 30B), which contact the wordlines in gaps 2701.

Figure 24A:
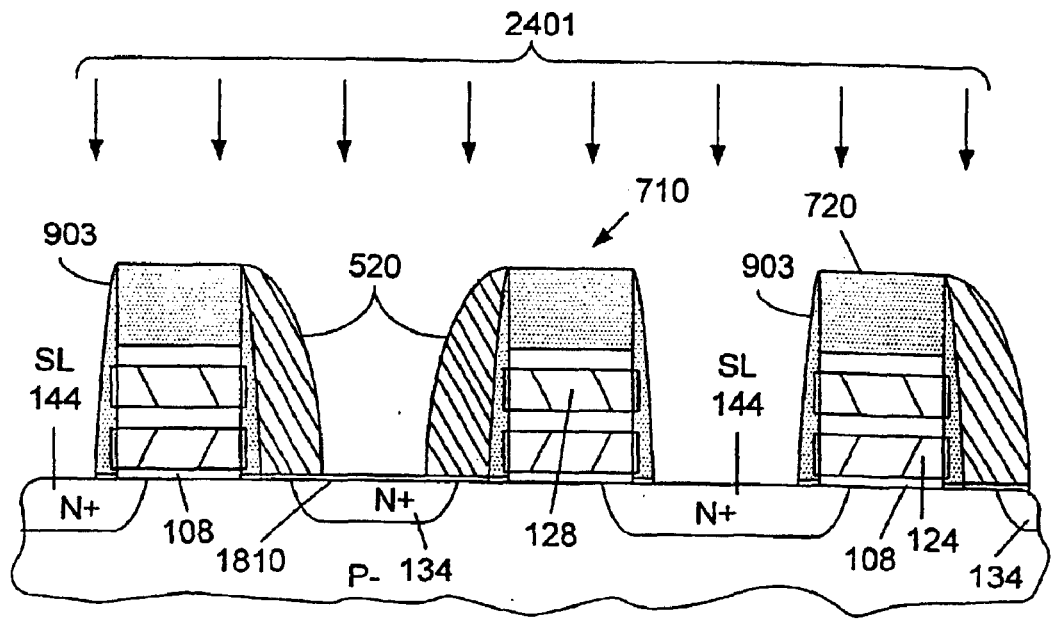
Figure 24B:
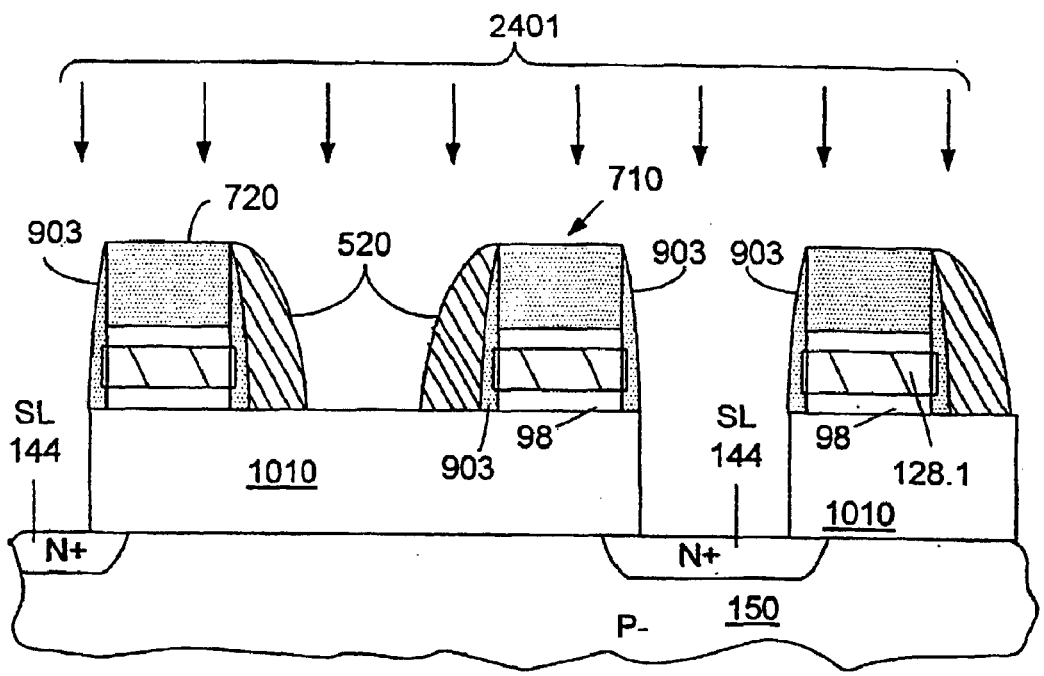
Figure 24C:
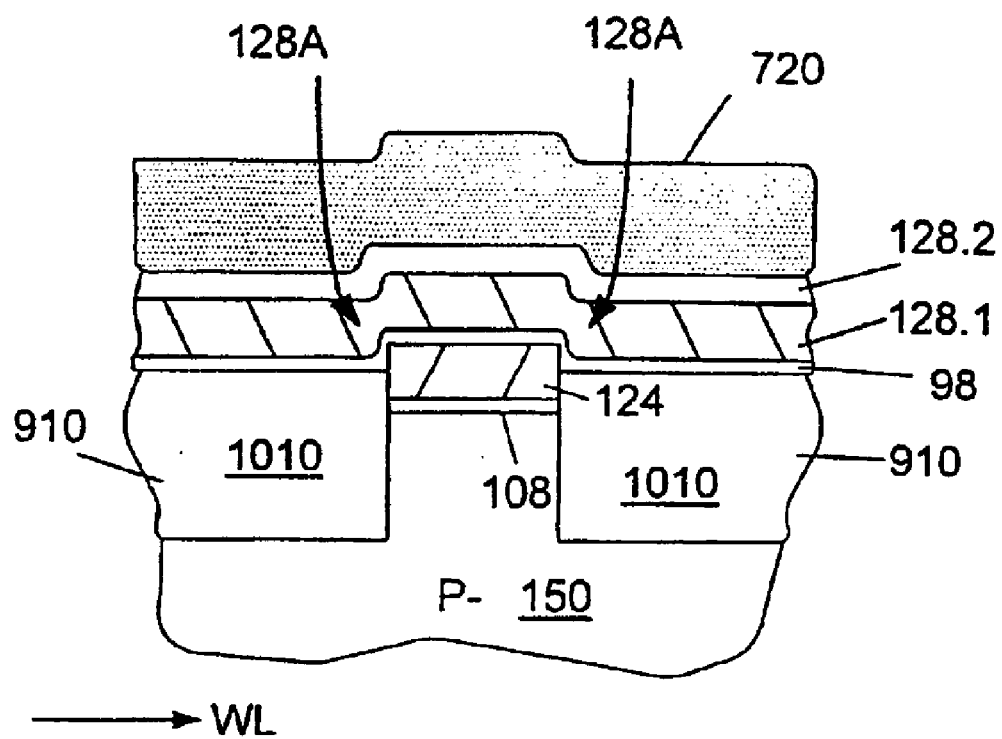

Cross sections of the memory array sections 2703.1, 2703.2 between the gaps 2701, 3010 are similar to those of FIGS. 24A, 24B. Metal 2903 overlies but does not contact the wordlines in the memory array sections 2703.1, 2703.2.

In some embodiments, source lines 144 are silicided to reduce their resistance. For example, cobalt or some other suitable metal is deposited over the structure at the stage of FIGS. 24A, 24B (before or after doping the bitline regions 134). The wafer is heated to cause the cobalt or the other metal to react with the exposed silicon and form a conductive silicide. Then unreacted cobalt or the other metal is removed. The silicide remains on source lines 144 and wordlines 520. The silicidation steps described above can be the same as in the salicide (self-aligned silicide) process known in the art.

In some embodiments, insulation 1810 may be insufficient to prevent a short between the cobalt or other metal and the regions 134. As a result, the wordlines 520 could be shorted to the regions 134. This can be prevented as follows.

Figure 32A:
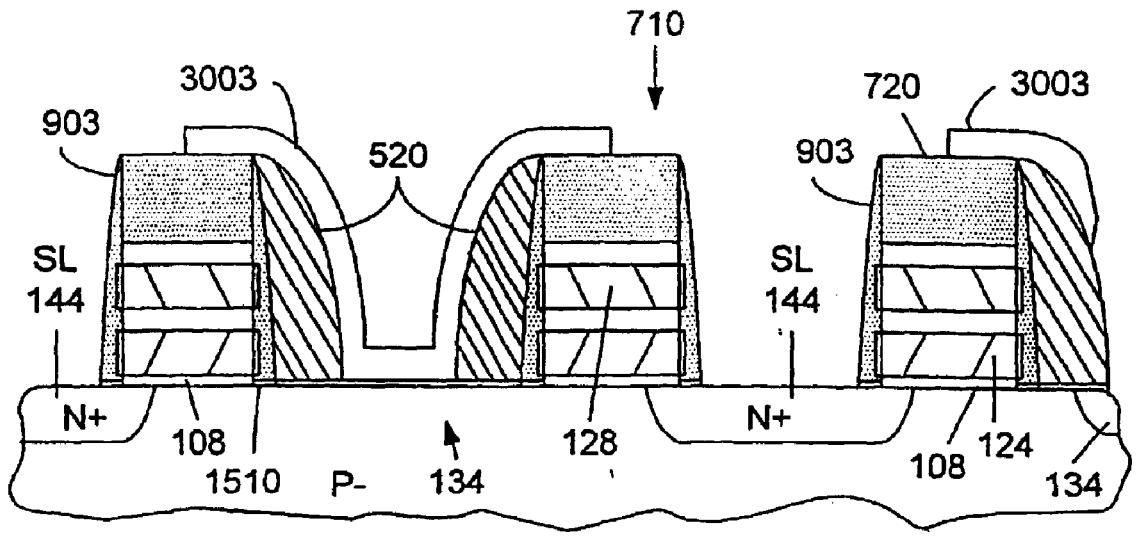
Figure 32B:
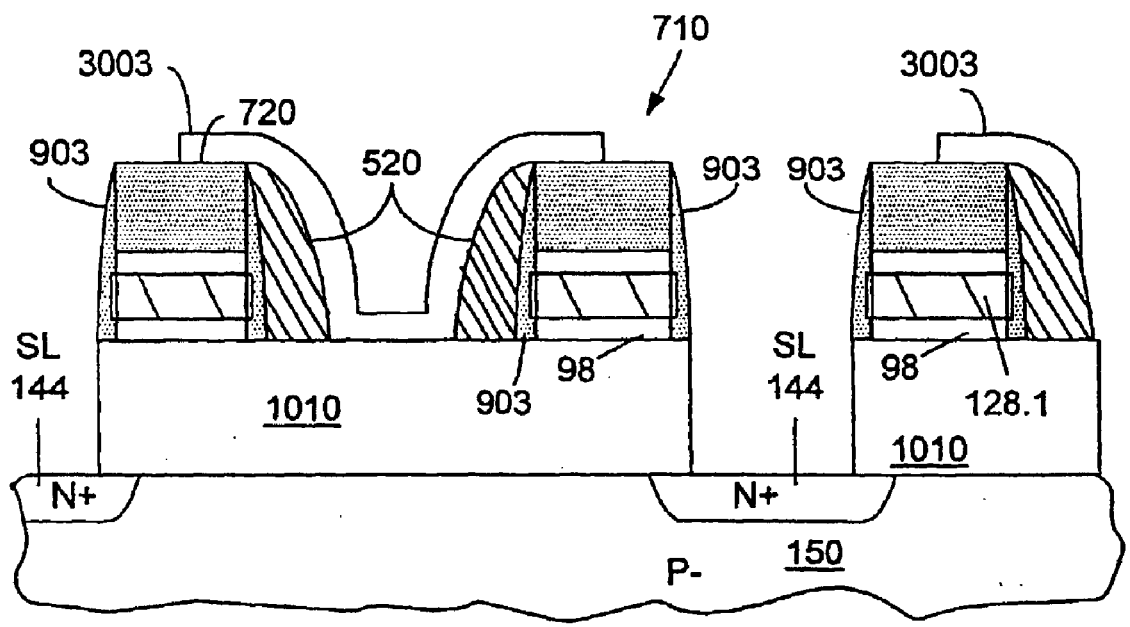
Figure 33A:
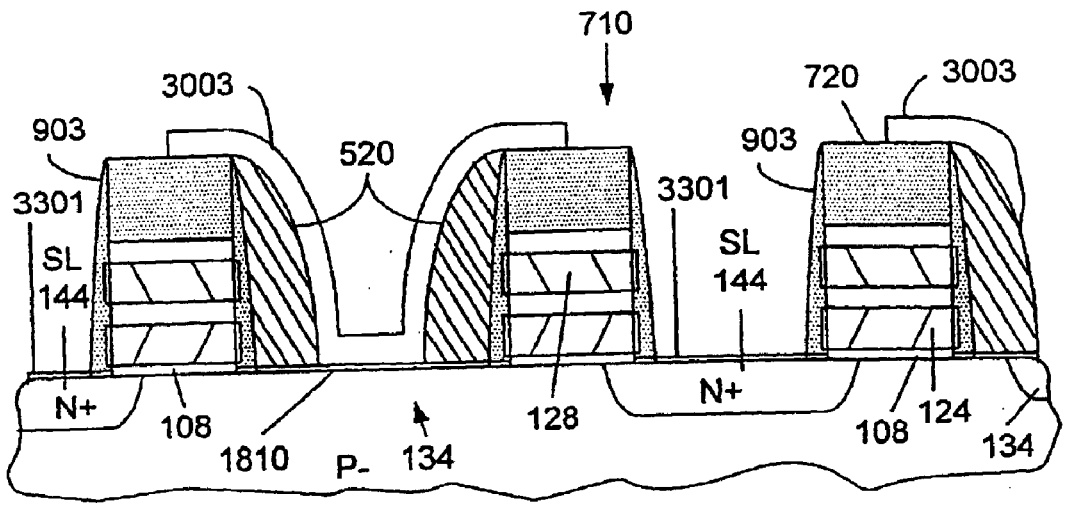
Figure 33B:
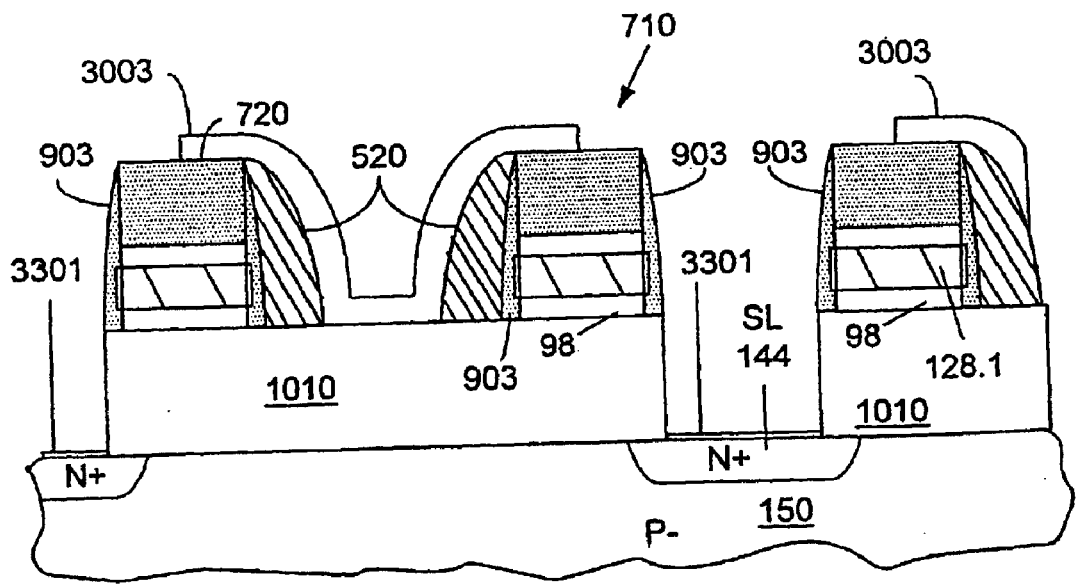

After the wafer has been processed to the stage of FIGS. 20A, 20B, immediately before the deposition of resist 1710, an insulation layer 3003 (FIGS. 31A, 31B) is deposited. Insulation 3003 can be silicon dioxide, for example. Then mask 1710 is formed as described above. Then insulation 3003 is removed from the areas exposed by mask 1710. Then the wafer is processed as described above in connection with FIGS. 21A–23B. In particular, polysilicon 520 is etched, and the source lines 144 are doped (implant 2110). Then resist 1710 is removed. The resulting structure is shown in FIGS. 32A, 32B.

Then a metal (for example, cobalt) is deposited, the wafer is heated to react the metal with the silicon in the source line regions, and the unreacted metal is removed, as described above. As a result, conductive silicide 3301 (FIGS. 33A, 33B) is formed over the source lines.

If insulation 1010 has not been completely etched out of the trenches (as described above in connection with FIG. 23B), the silicide may be interrupted in the trenches.

Then insulation 3003 can be etched away. Then implant 2401 can be performed into bitline regions 134 and the source lines, as described above in connection with FIGS. 24A, 24B. Alternatively, this implant can be performed through the insulation 3003. Insulation 3003 may be left in the memory.

The source line silicidation techniques can be used with embodiments of FIG. 16 (in which the peripheral transistor gates are formed from control gate layer 128), or with embodiments of FIGS. 25, 26A, 26B, 26C (the peripheral transistor gates are formed using polysilicon 520), with embodiments of FIGS. 44–50, described below (both layers 128, 520 are used for the peripheral transistor gates). The silicidation techniques can be combined with extensions 520E (FIGS. 27–30).

Figure 34:
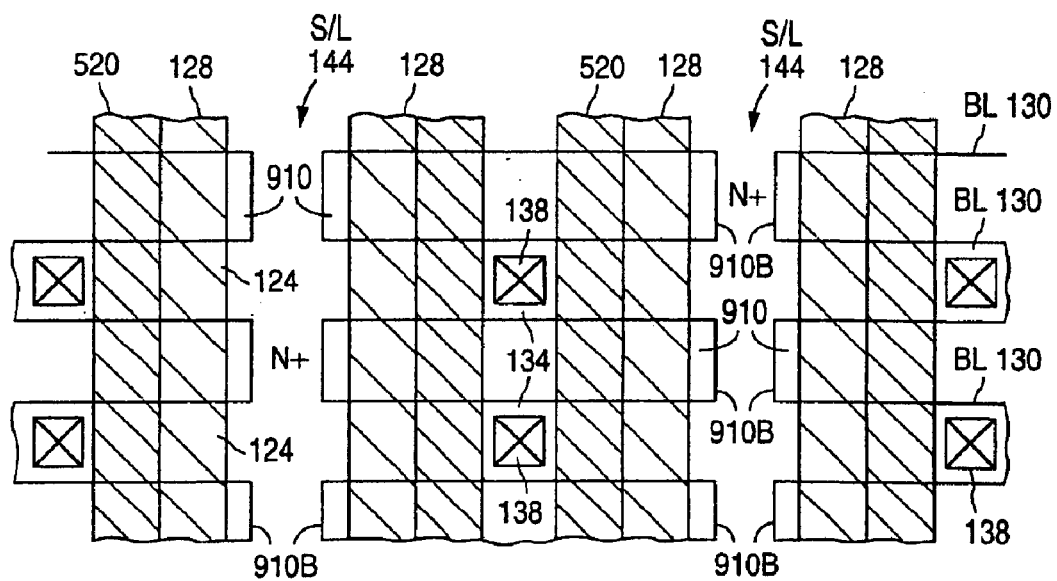
FIG. 34 is a top view of a memory embodiment of the present invention.

FIG. 34 illustrates another flash memory array according to the present invention. Each isolation trench 910 extends between adjacent source lines 144 but does not cross the source lines. The boundaries of the isolation trenches are shown at 910B.

Figure 35:
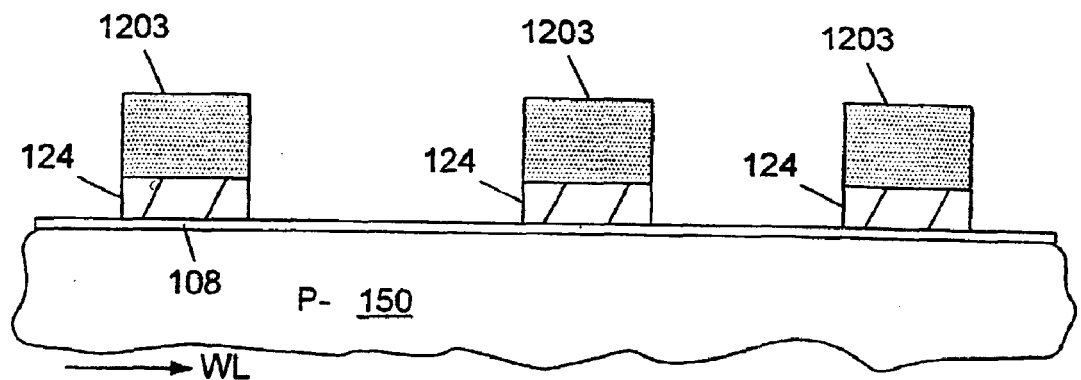
FIGS. 35, 36 are cross section illustrations of the memory of FIG. 34 during fabrication.

This memory can be fabricated as follows. The substrate can be doped to form an isolated region 150, as described above in connection with FIG. 11. Then tunneling oxide 108, polysilicon 124, silicon nitride 1203, and photoresist mask 904 can be formed as in FIGS. 12A, 12B. Then silicon nitride 1203 and polysilicon 124 are patterned as described above in connection with FIGS. 12A, 12B. However, silicon 150 is not etched at this step. Oxide 108 may or may not be etched. Photoresist 904 is removed. The resulting structure is shown in FIG. 35.

Figure 36:
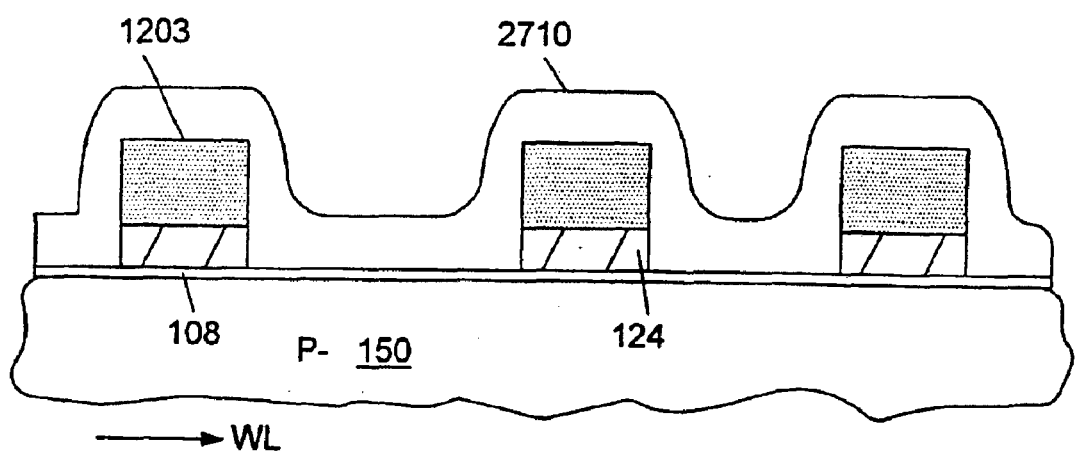
Figure 37:
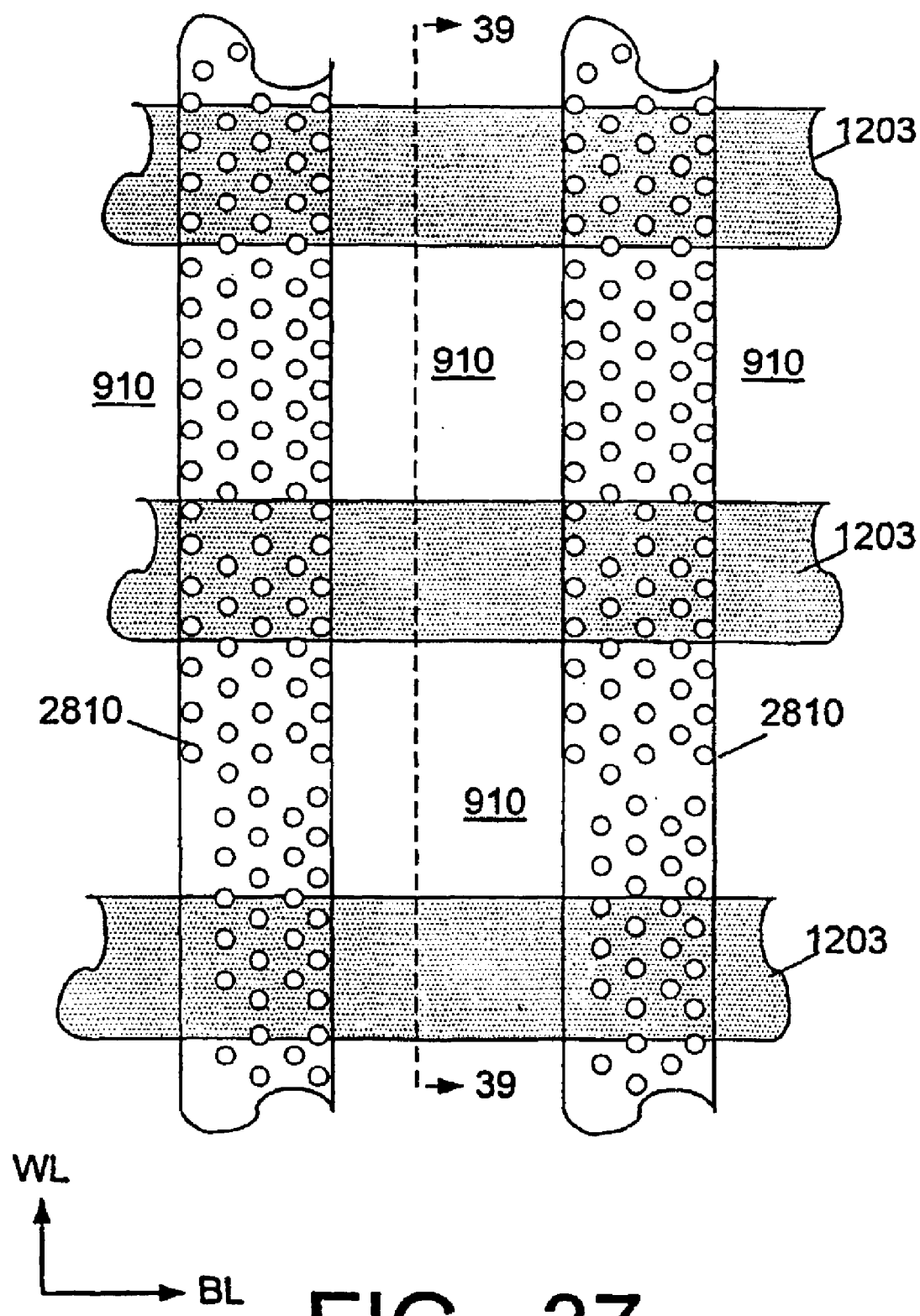
FIG. 37 is a top view of the memory of FIG. 34 during fabrication.
Figure 38:
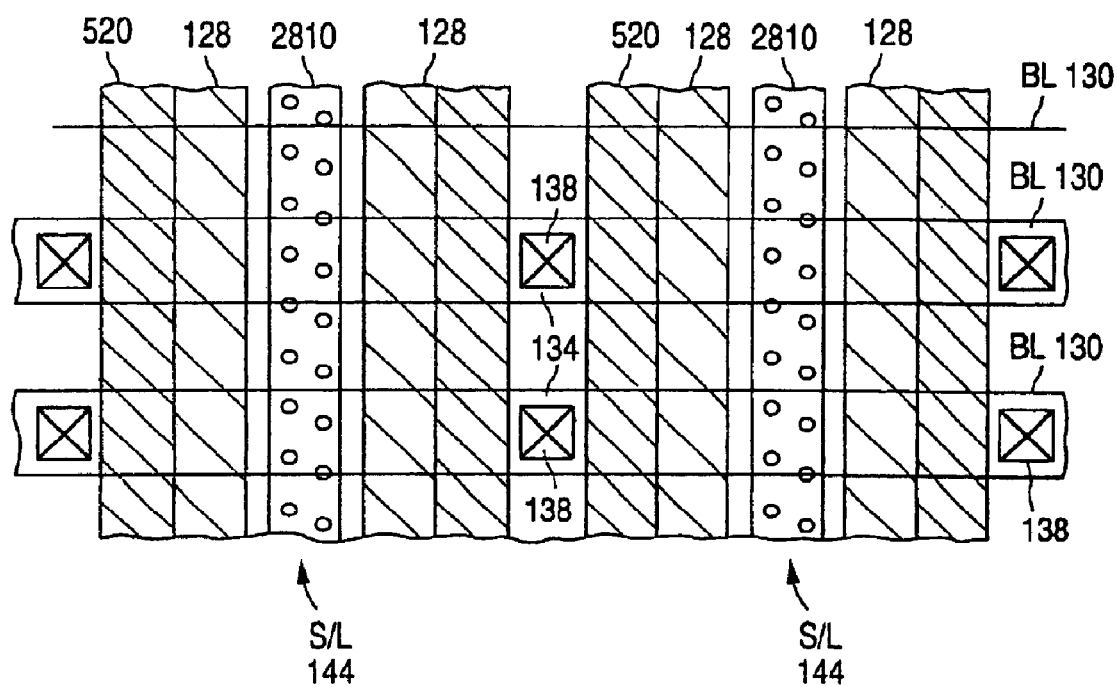
FIG. 38 is a top view illustrating some features of the memory of FIG. 34.

Silicon dioxide layer 2710 (FIG. 36), for example, BPSG, is deposited by CVD to a thickness of about 300 nm. A photoresist mask 2810 (FIG. 37) is patterned photolithographically into strips extending in the wordline direction. Each strip is positioned over a region in which the source line 144 will be formed. The position of mask 2810 relative to other features of the memory, and in particular to control gates 128, is illustrated in FIG. 38. Control gates 128 have not yet been fabricated at this step.

Figure 39:
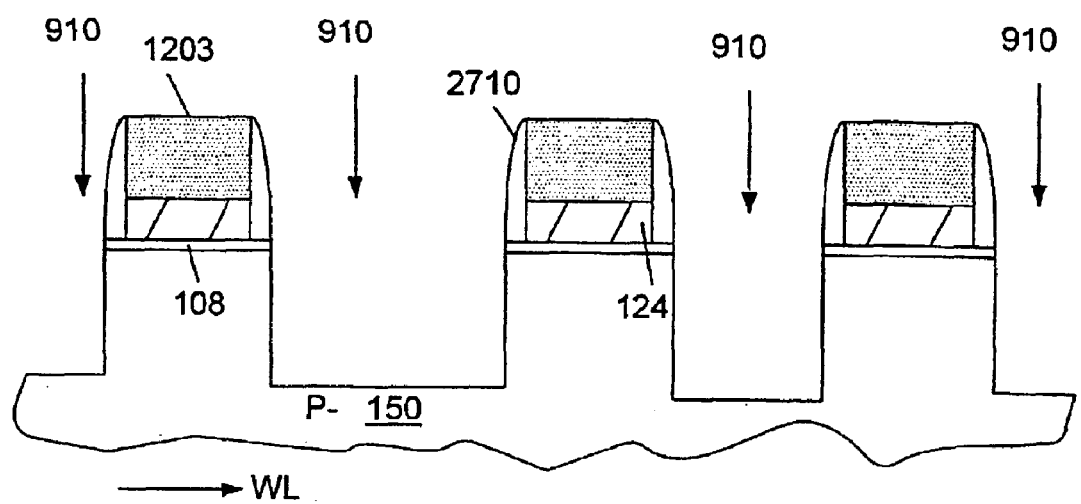
FIGS. 39, 40A, 40B, 41 are cross section illustrations of the memory of FIG. 34 during fabrication.

An etch selective to photoresist 2810 and silicon nitride 1203 removes oxide layers 2710, 108 in the regions bounded by the photoresist and the nitride. Then resist 2810 is stripped, and substrate region 150 is etched with oxide 2710 and nitride 1203 as a mask to form rectangular trenches 910. Alternatively, the resist 2810 can be left in place when the silicon 150 is etched. In this case, oxide 2710 does not have to be deposited at all. A cross section of one embodiment which does use the oxide 2710 is shown in FIG. 39. This cross section is taken along the line 39—39 in FIG. 37, by a plane passing through the trenches. Cross sections by planes not passing through the trenches are identical to those of FIG. 36.

Figure 40A:
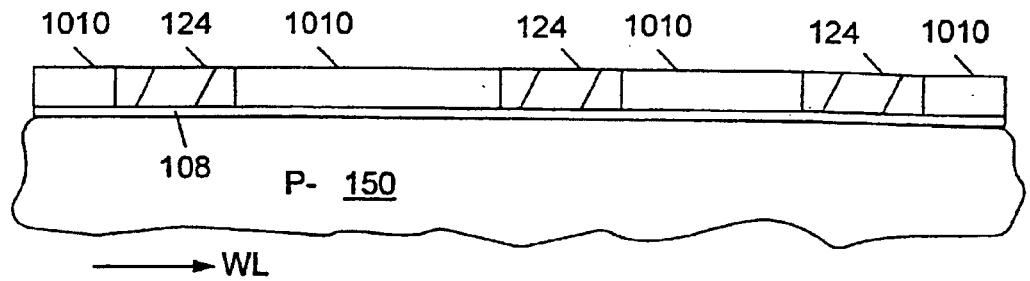
Figure 40B:
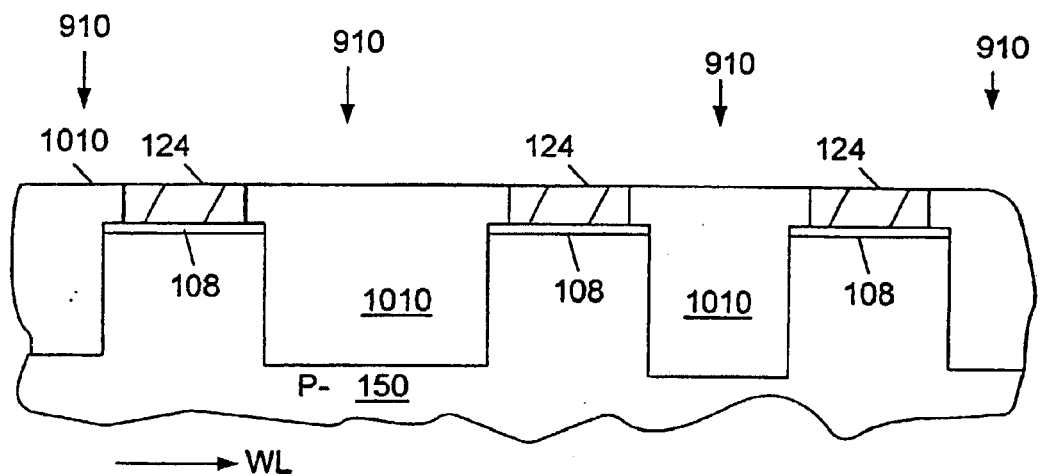

Then insulation 1010 is deposited as in FIG. 13, and polished by CMP as in FIG. 14. Then nitride 1203 is removed, and insulation 1010 is optionally etched down. A planar top surface can be provided. A cross section of the resulting structure by a plane parallel to the wordlines and passing through the trenches is shown in FIG. 40B. A cross section by a plane passing between the trenches is shown in FIG. 40A. Some of insulation 1010 may cover the substrate region 150 in the area of the source lines 144. The source lines do not cross over the trenches. (Some oxide 2710 may remain on the sidewalls of polysilicon strips 124. This oxide is shown as part of insulation 1010.)

In some embodiments, insulation 1010 is etched down to expose the sidewalls of polysilicon 124 to improve the capacitive coupling between the control gates and the floating gates as described above in connection with FIG. 24C.

The remaining fabrication steps can be similar to those described above in connection with FIGS. 16–33B. ONO layer 98, control gate layer 128, silicon nitride 720, and photoresist mask 1014 are formed as in FIG. 16. (Peripheral transistor gates can be formed using layer 128 or wordline layer 520, or both, as described above in connection with FIGS. 16, 25, 26A, 26B, 26C, and below in connection with FIGS. 44–50.)

Figure 18A:
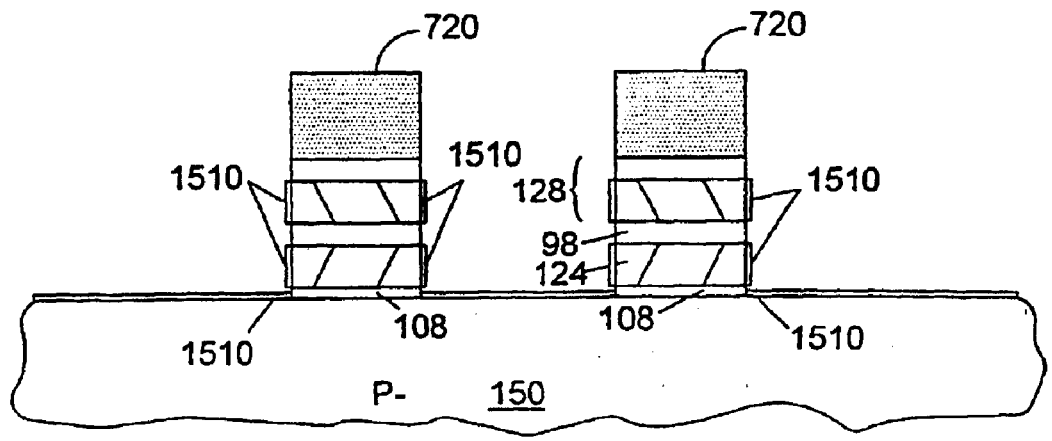
Figure 18B:
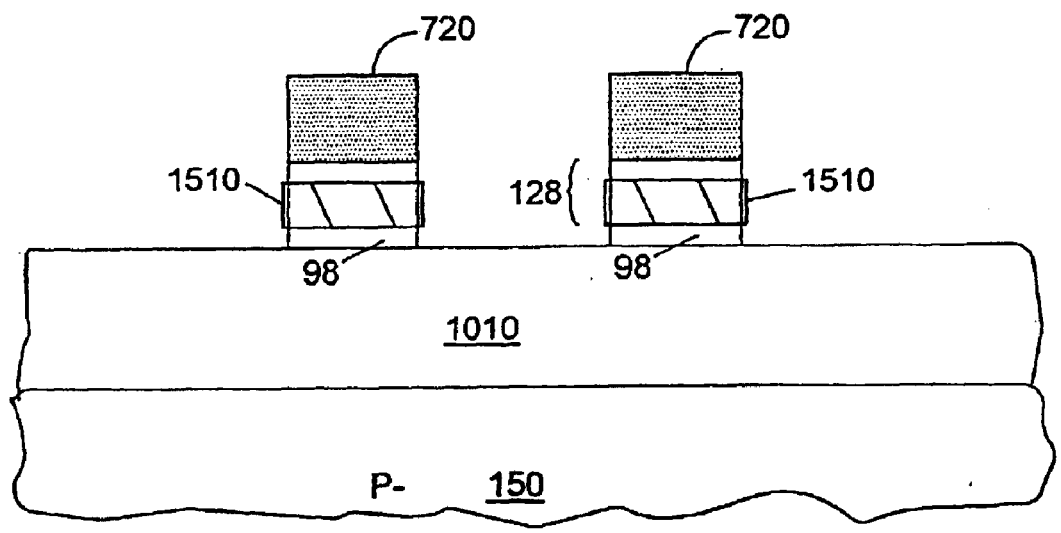
Figure 19A:
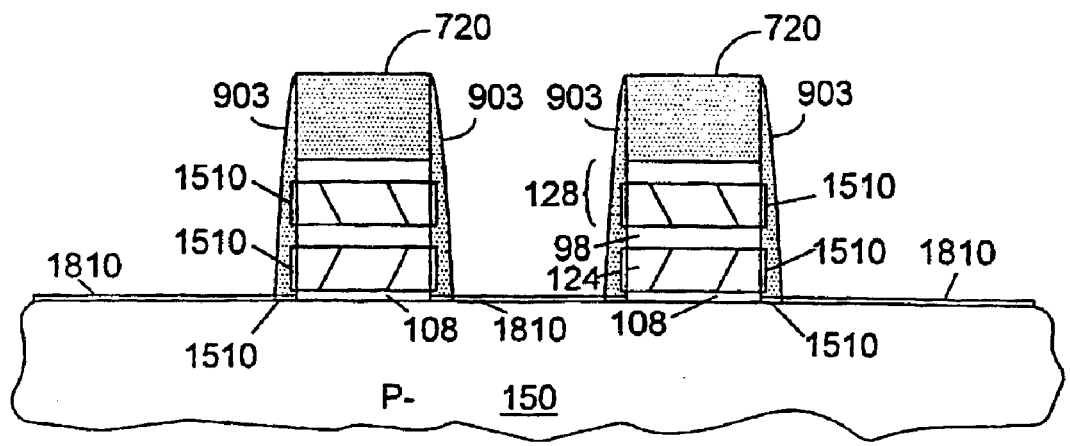
Figure 19B:
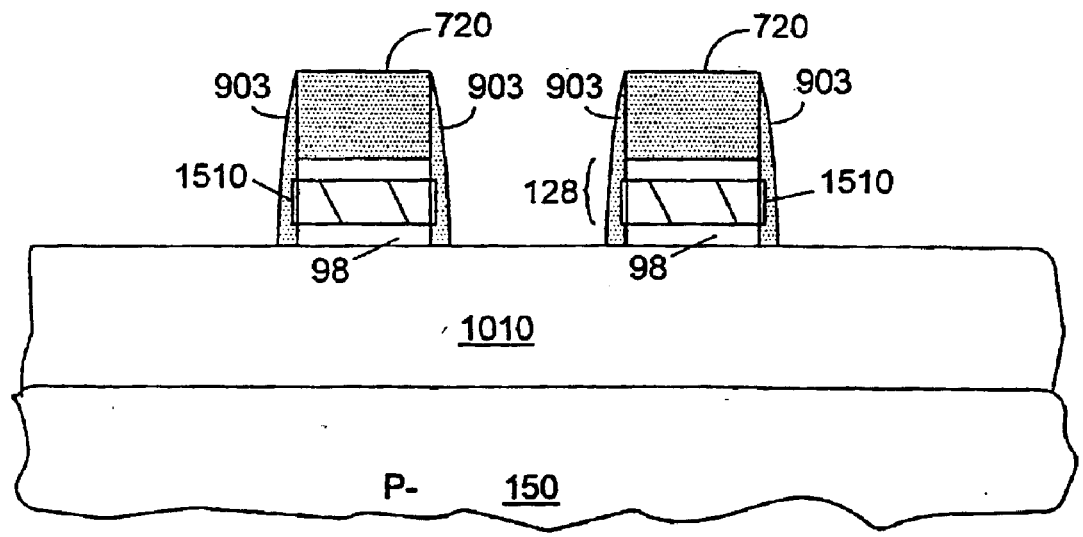

Then silicon dioxide 1510 is grown (FIG. 18A). Silicon nitride spacers 903 and silicon dioxide 1810 are formed as described above for FIG. 19A.

Figure 21A:
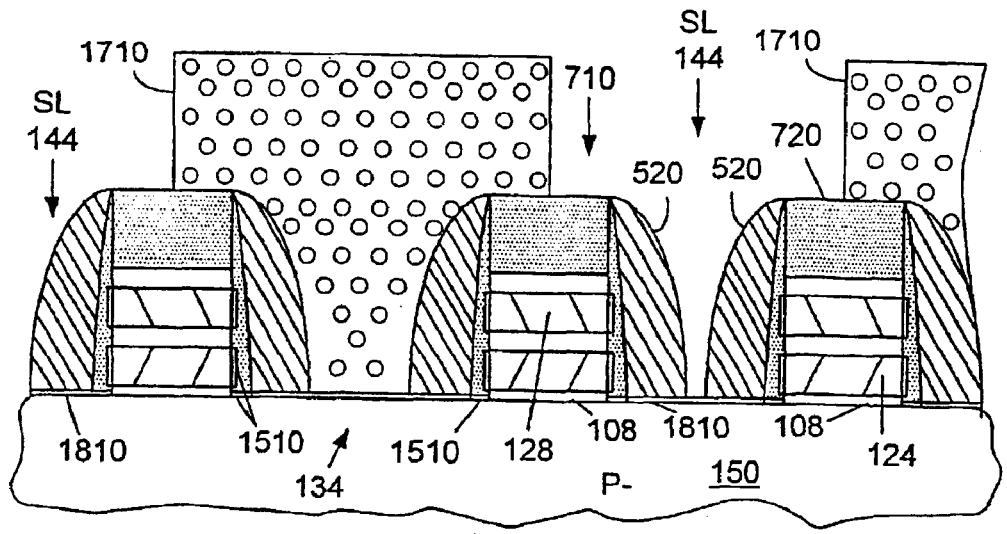
Figure 21B:
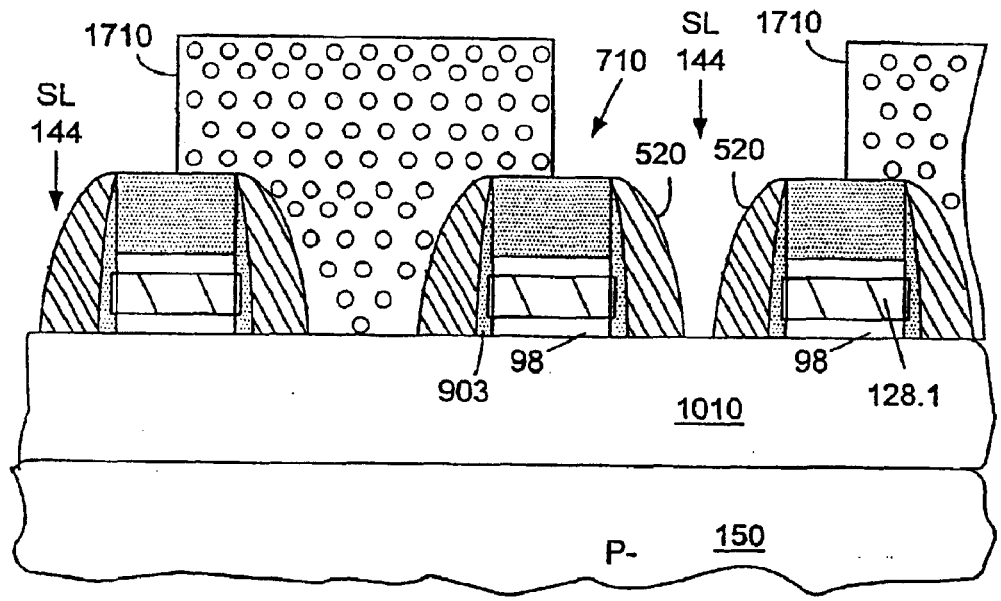
Figure 41:
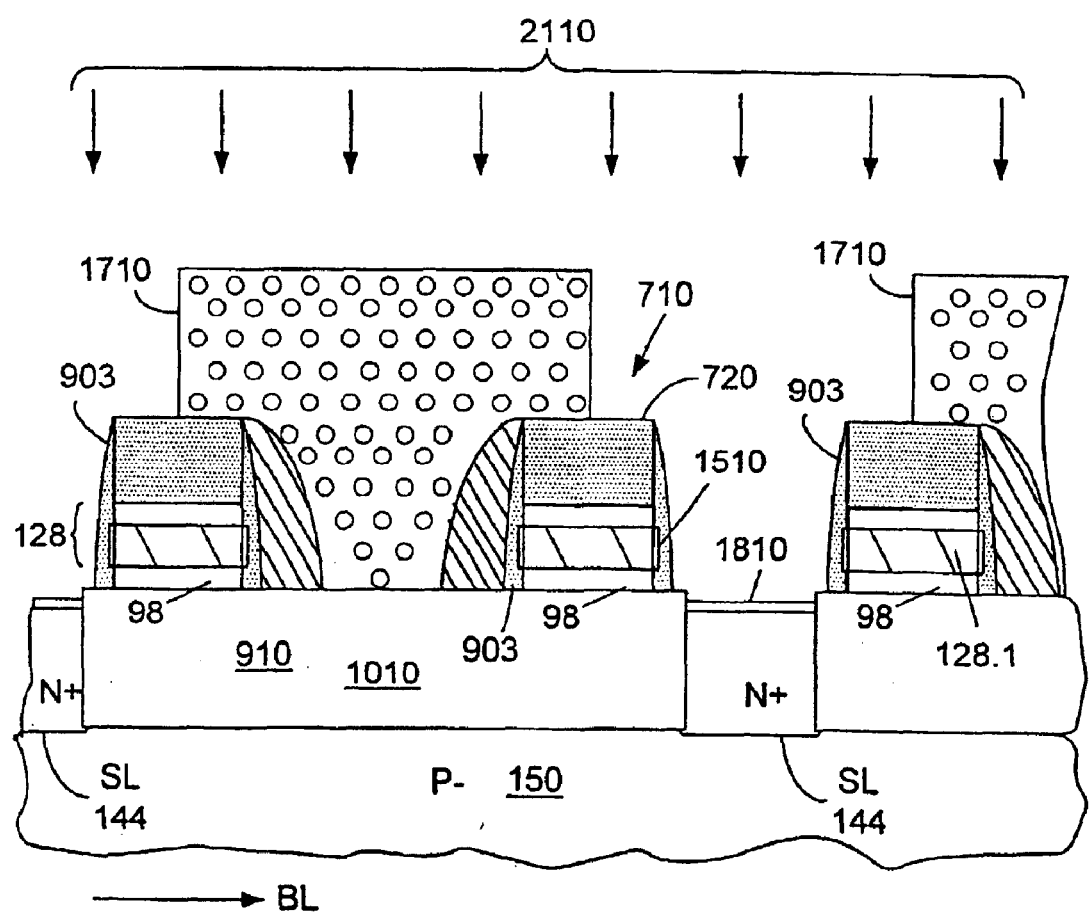

Polysilicon 520 is deposited and etched anisotropically (FIG. 20A). Then photoresist mask 1710 is formed (FIG. 21A). Polysilicon 520 is etched off the source lines 144 as described above in connection with FIG. 22A. Insulation 1010 may or may not be etched off the source lines 144. Then implant 2110 is performed as described above. This implant dopes the entire length of the source lines since the source lines are not crossed by trenches 910. A cross section of the resulting structure by a plane parallel to the bitlines and passing between the trenches is identical to that of FIG. 22A. A cross section along the trenches is shown in FIG. 41. (These cross sections assume that insulation 1010 has been etched off the source lines.)

Then mask 1710 is removed, and N type implant 2401 is performed to dope the bitline regions 134 and the source lines 144, as described above in connection with FIGS. 24A, 24B. Insulation 1010 can be etched off the source lines before implant 2110, or between implants 2110 and 2410, or after the implant 2410, or not at all.

Figure 42:
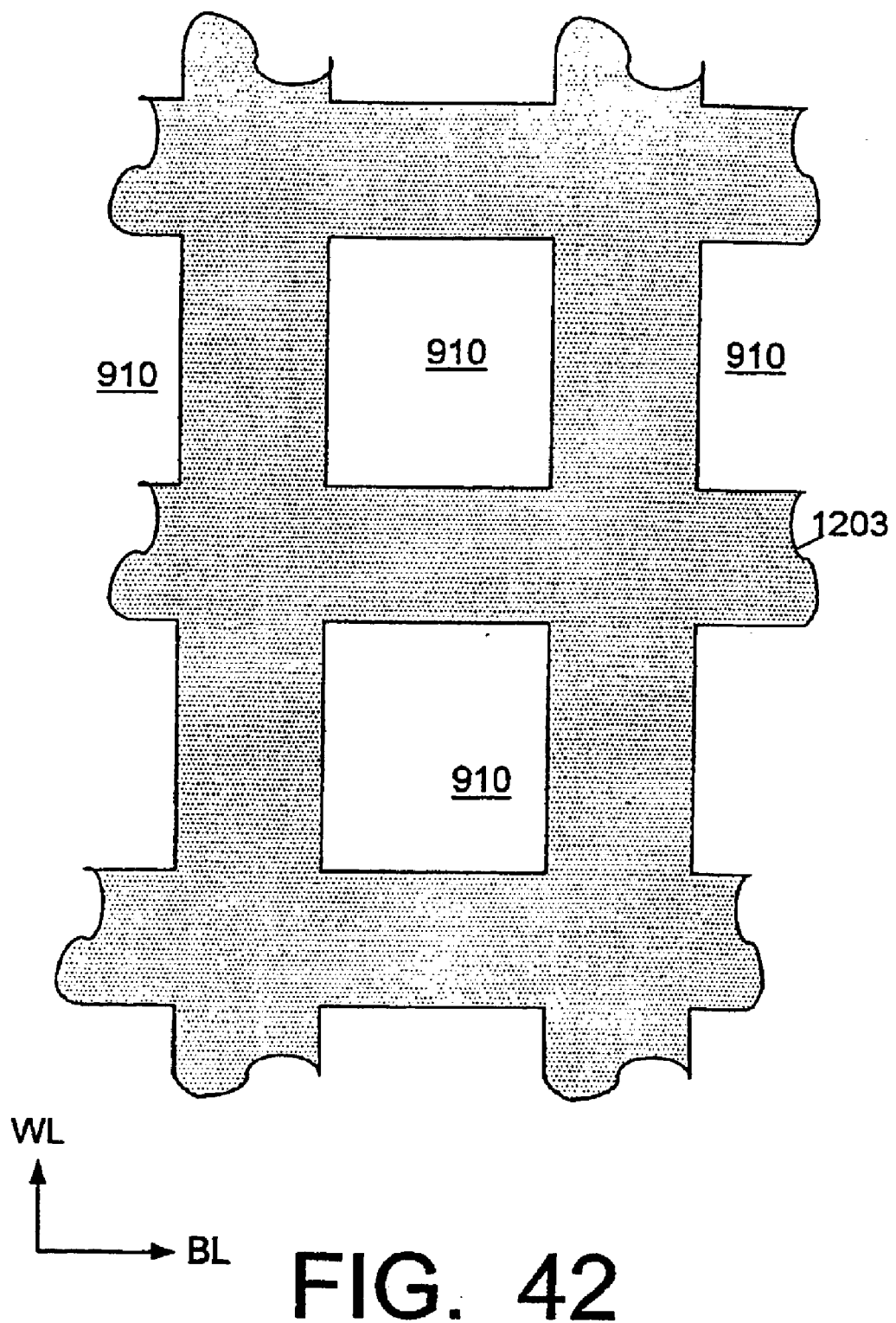
FIG. 42 is a top view of a memory embodiment of the present invention during fabrication.

In FIG. 42, oxide 2701 and mask 2810 are omitted. Isolation trenches 910 are defined by resist mask 904 as in FIG. 12A, but the trenches are rectangular as in FIG. 37. Thus, silicon nitride layer 1203 and polysilicon layer 124 each have the same geometry as combined layers 1203, 124, 2810 in FIG. 37. Trenches 910 have the same geometry as in FIGS. 34–41. Insulation 1010 is removed from over the source lines when it is polished by CMP (FIG. 15). The remaining fabrication steps are as in FIGS. 37–41. Polysilicon 124 and oxide 108 are etched off the source lines 144 when the stacks 710 are defined (FIG. 16). Source lines 144 become exposed during this step.

In some embodiments of FIGS. 9A through 43, a memory cell is programmed (rendered non-conductive) via source-side hot electron injection. See W. D. Brown et al., "Non-volatile Semiconductor Memory Technology" (1998), pages 21–23. Exemplary voltages for a memory powered by a 1.8 V external power supply (VCC) are shown in Table 1 below. A slash is used to indicate the voltages for selected/non-selected memory rows or columns. For example, in the "Program" column of Table 1, in the row "Bitline region 134", the entry "0 V/V3" indicates 0 V for the selected bitline and a voltage V3 for the non-selected bitlines. Not all of the non-selected voltages are shown.

A memory cell can be erased using Fowler-Nordheim tunneling from floating gate 124 to source line 144 (see column "Sector erase through source line" in Table 1) or to substrate region 150 ("Sector erase through substrate"). The latter technique is advantageous because the band-to-band current is reduced. In the flash memory arrays of FIGS. 10B and 34, an entire sector is erased, individual cells cannot be erased. A sector is either a row or a group of rows which have their associated source lines 144 shorted together through circuit connections and which also have their associated control gate lines 128 shorted together through circuit connections.

Some embodiments provide an option of erasing multiple sectors or even the entire memory array in a single operation in which all of the cells being erased are erased simultaneously by Fouler-Nordheim tunneling of electrons from the floating gates to substrate region 150. This is shown as "Chip Erase" in Table 1. Region 150 is biased positive relative to all of the control gates. The array can be erased faster by chip erase than row-by-row. This is especially desirable for memory testing.

TABLE 1

|  | Program | Sector erase through source line | Sector erase through substrate | Chip Erase | Read |
| --- | --- | --- | --- | --- | --- |
| Control gate 128 | +10 V/0 V | −10 V | −10 V | −10 V | 1.8 V |
| Bitline region 134 | 0 V/V3** (VCC = 1.8 V) | V4*** (VCC = 1.8 V) | Float | Float | 1.5 |
| Source line 144 | 6 V | 5 V | Float | Float | 0 V |
| Select gate 520 | VTN + $\Delta V_1$* | 0 V | 0 V | 0 V | VCC + $\Delta V_2$* (VCC = 1.8 V) |
| Substrate region 150 | 0 V | 0 V | 6 V | 6 V | 0 V |

Notes to Table 1:
*In some embodiments, VTN = 0.6 V, $\Delta V_1$ = 0.9 V, $\Delta V_2$ = 1.4 V.
**V3 is a voltage above $\Delta V_1$.
***V4 is some voltage such that 0 < V4 < VCC.

In some embodiments, wordlines 520 are provided with extensions as in FIGS. 27–30. In some embodiments, the source lines 144 are silicided as described above in connection with FIGS. 24A, 31A–33B.

A memory may have multiple memory arrays, each with its own bitlines and wordlines. Different arrays may be fabricated in the same substrate region 150 or in different isolated regions 150 in the same integrated circuit. The "chip erase" operation can erase the memory cells formed in one region 150 without erasing the cells formed in the other regions 150.

A voltage generator and decoder block 4201 (FIG. 43) generates the required voltages from the power supply voltage VCC, address signals "ADDR", and possibly other command/control signals, using known techniques.

Figure 43:
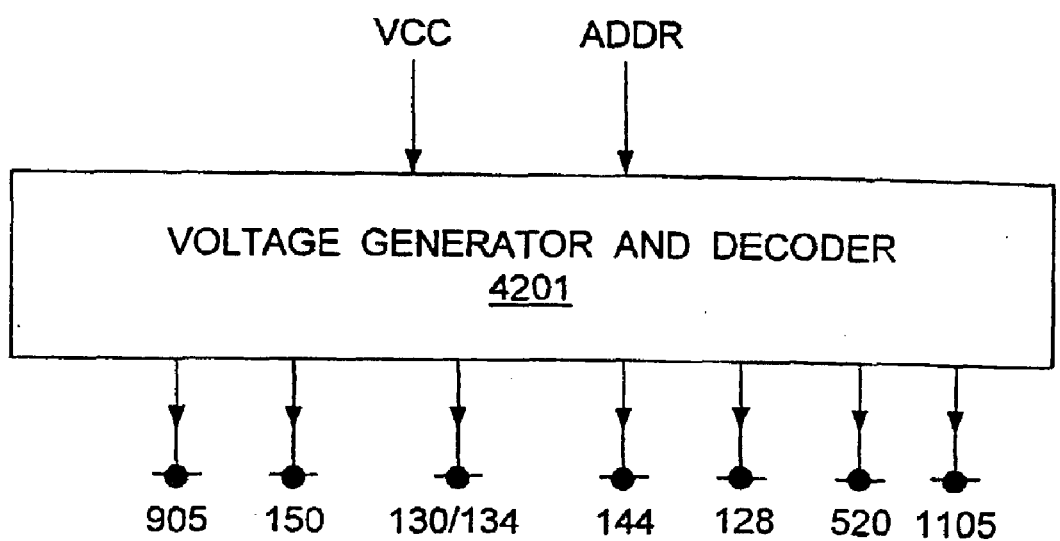
FIG. 43 is a block diagram of a voltage generator for some memory embodiments of the present invention.
Figure 44:
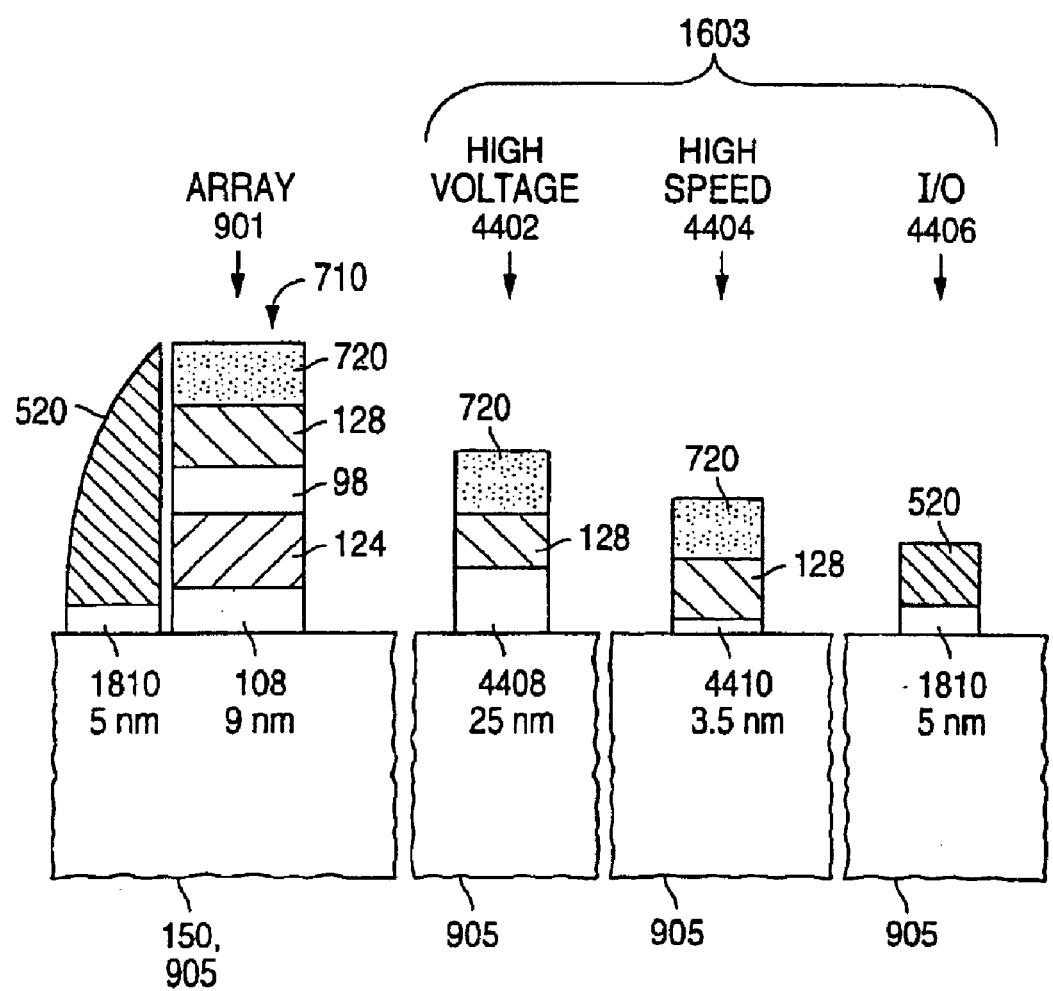
FIGS. 44–50 are cross section illustrations of some memory embodiments of the present invention.
Figure 45:
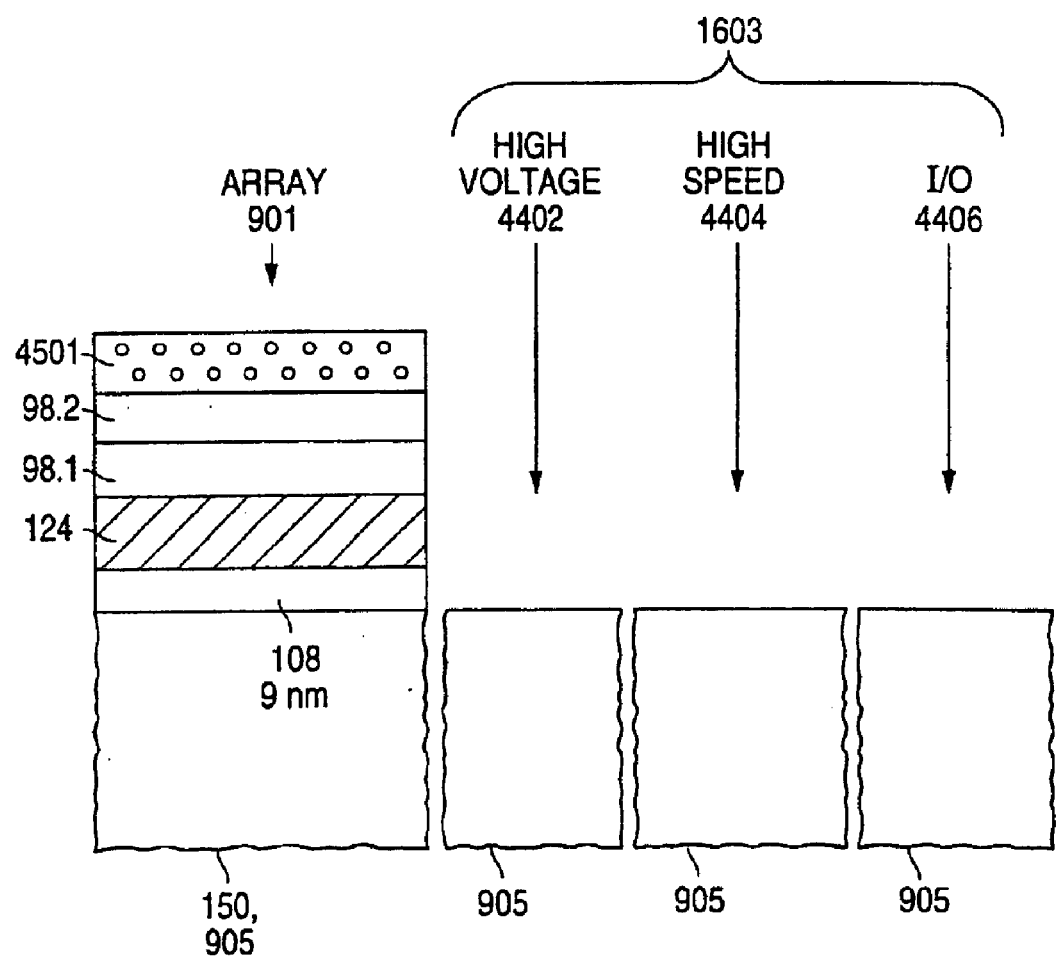
Figure 46:
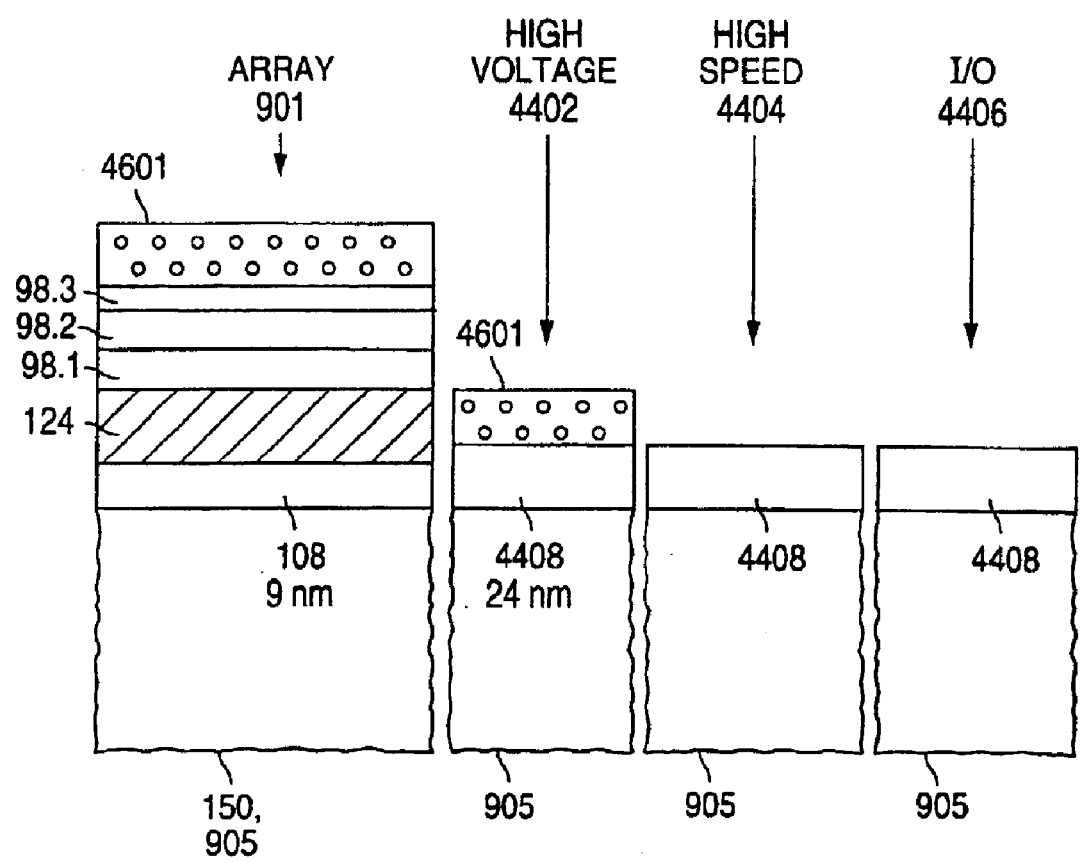
Figure 47:
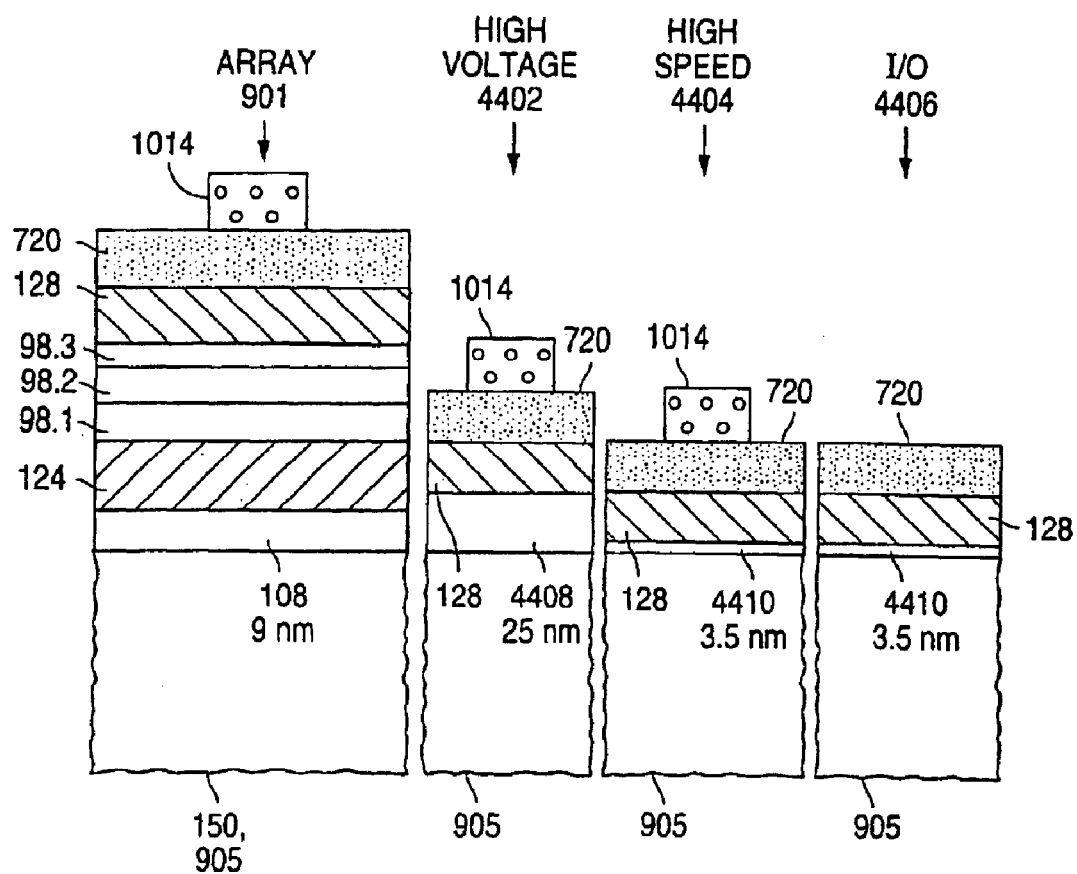
Figure 48:
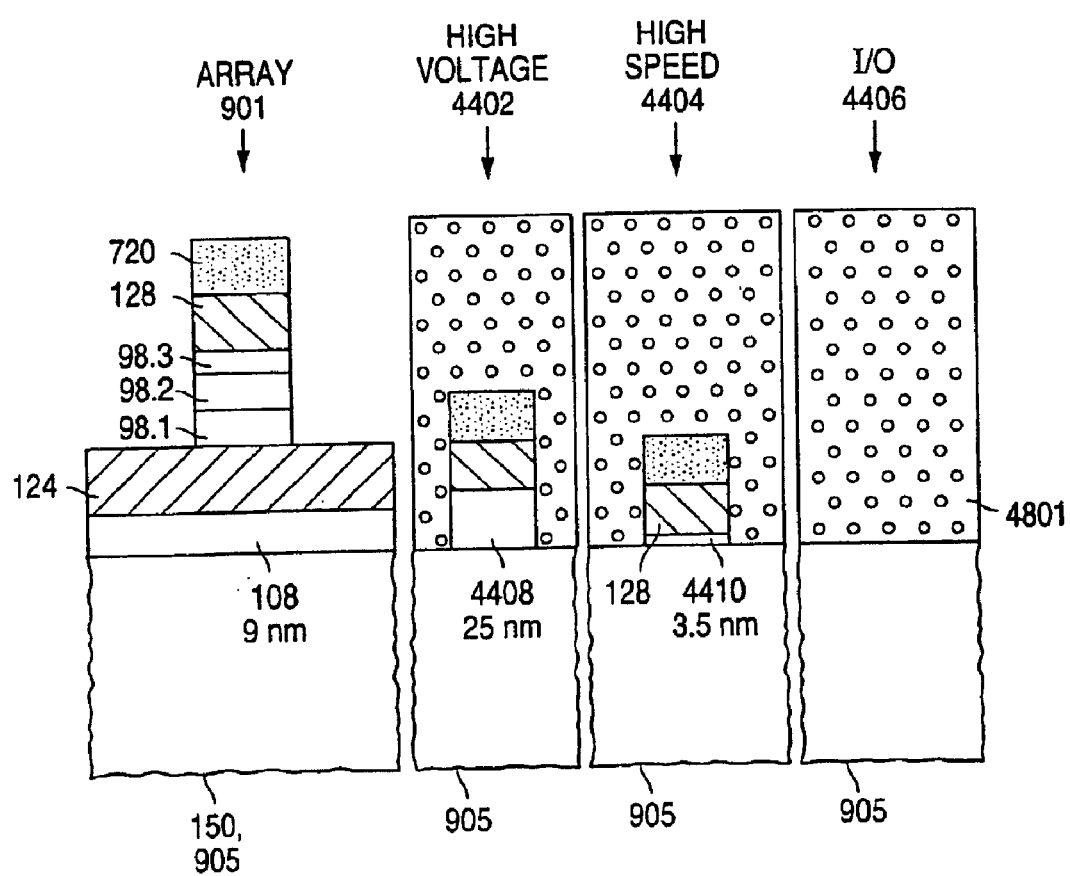

FIG. 44 illustrates schematically different MOS transistor gate insulation thicknesses obtained in some embodiments of the memories of FIGS. 9A–43. Thin gate insulation is desirable for high speed operation. On the other hand, transistors exposed to high voltages may need thicker gate insulation. Also, tunneling oxide 108 should be thick enough to provide long data retention.

In the embodiment described immediately below, all of the gate insulation layers are silicon dioxide; this is not so in other embodiments. The gate insulation thicknesses immediately below assume VCC=1.8V and the operation voltages as in Table 1 above. These voltages and thicknesses are illustrative and not limiting.

In FIG. 44, tunneling oxide 108 is 9 nm thick. Select transistor gate oxide 1810 is thinner (e.g. 5 nm) to provide faster operation, but is thick enough to withstand the 3.2V voltage used for the read operations shown in Table 1 (VCC+$\Delta V_2$=3.2V in the example being described).

Peripheral area 1603 includes active areas 4402, 4404, 4406. High voltage active area 4402 is used for transistors exposed to the 10V and −10V voltages (see Table 1) and possibly other high voltages. Some of these transistors may be part of voltage generator 4201 (FIG. 43). Gate oxide 4408 in area 4402 is thick, 22 to 25 nm in some embodiments.

High speed active area 4404 is for transistors not exposed to voltages above VCC. These transistors may be part of address decoders, sense amplifiers, clock signal generators, voltage generators, address and data buffers, and other circuitry. Their gate oxide 4410 is relatively thin, 3.5 nm in some embodiments.

I/O active area 4406 is for transistors providing interface to off chip circuitry. The off chip circuitry may operate at higher power supply voltages, e.g. 2.5V or 3.3V. The I/O transistors have thicker gate oxide to withstand such voltages. In FIG. 44, the I/O transistor gate oxide layer is the same layer 1810 as used for the select transistors. This layer is 5 nm thick in this example.

In FIG. 44, the transistor gates in areas 4402, 4404 are provided by control gate layer 128. The I/O transistor gates in area 4406 and select gates 520 (wordlines) for memory cells are provided by polysilicon 520. Polysilicon gates 520 may have metal and/or silicon nitride on top, as described above in connection with FIGS. 26B, 26C. Control gate layer 128 may be polysilicon, polycide, or some other conductive layer.

The gate insulation is fabricated as follows. Tunneling oxide 108 is grown to a thickness of 9 nm as described above (see e.g. FIG. 12A). Oxide 108 is grown over the whole wafer, including the peripheral area 1603. Then polysilicon 124 is deposited and patterned, and isolation trenches 910 are formed and filled with insulation 1010. See e.g. FIGS. 12A–15, 37, 42, and the accompanying text.

Silicon dioxide 98.1 and silicon nitride 98.2 are formed as described above in connection with FIG. 16. (These layers are respectively 1 nm and 5 nm thick in some embodiments.) Then photoresist mask 4501 (FIG. 45) is deposited and photolithographically patterned to cover the memory array. Layers 98.2, 98.1, 124, 108 are etched off the peripheral area 1603. Substrate 905 becomes exposed.

Then resist 4501 is stripped. The wafer is oxidized in steam at a temperature of 850° C. or below as described above in connection with FIG. 16. As a result, silicon dioxide layer 4408 (FIG. 46) is grown in the active areas 4402, 4404, 4406 to a thickness of 24 nm. At the same time, silicon dioxide 98.3 is grown on nitride 98.2 in memory array active area 901 to a thickness of 1 nm to 1.5 nm.

Then photoresist 4601 is deposited and patterned to cover the entire memory array and the high voltage active area 4402. Active areas 4404, 4406 are exposed. Silicon dioxide 4408 is etched off the active areas 4404, 4406.

Then resist 4601 is stripped. Resist stripping is typically followed by wafer cleaning. Here the cleaning step is unlikely to damage the oxide 4408 in area 4408 because oxide 4408 is thick. As will be clear, thin oxide 4410 (FIG. 44) does not come into physical contact with photoresist, and thus will not be damaged by a post-resist-stripping cleaning operation.

Then the wafer is oxidized to grow silicon dioxide 4410 (FIG. 47) in active areas 4404, 4406 to a thickness of 3.5 nm. Dry oxidation at a temperature below 850° C. can be used for this purpose. The thickness of oxide 4408 (in area 4402) increases to about 25 nm during this step.

Then control gate layer 128 and silicon nitride layer 720 are deposited over the wafer. Mask 1014 is formed as described above in connection with FIG. 16. Mask 1014 defines stacks 710 and the transistor gates for high voltage areas 4402 and high speed areas 4404. I/O active areas 4406 are exposed by the mask. Silicon nitride 720, control gate layer 128, and insulation layers 98.3, 98.2, 98.1, 4408, 4410 are etched off the regions exposed by the mask. The etch stops at polysilicon 124 in the array active areas 901 and at substrate 905 in the peripheral active areas.

Figure 49:
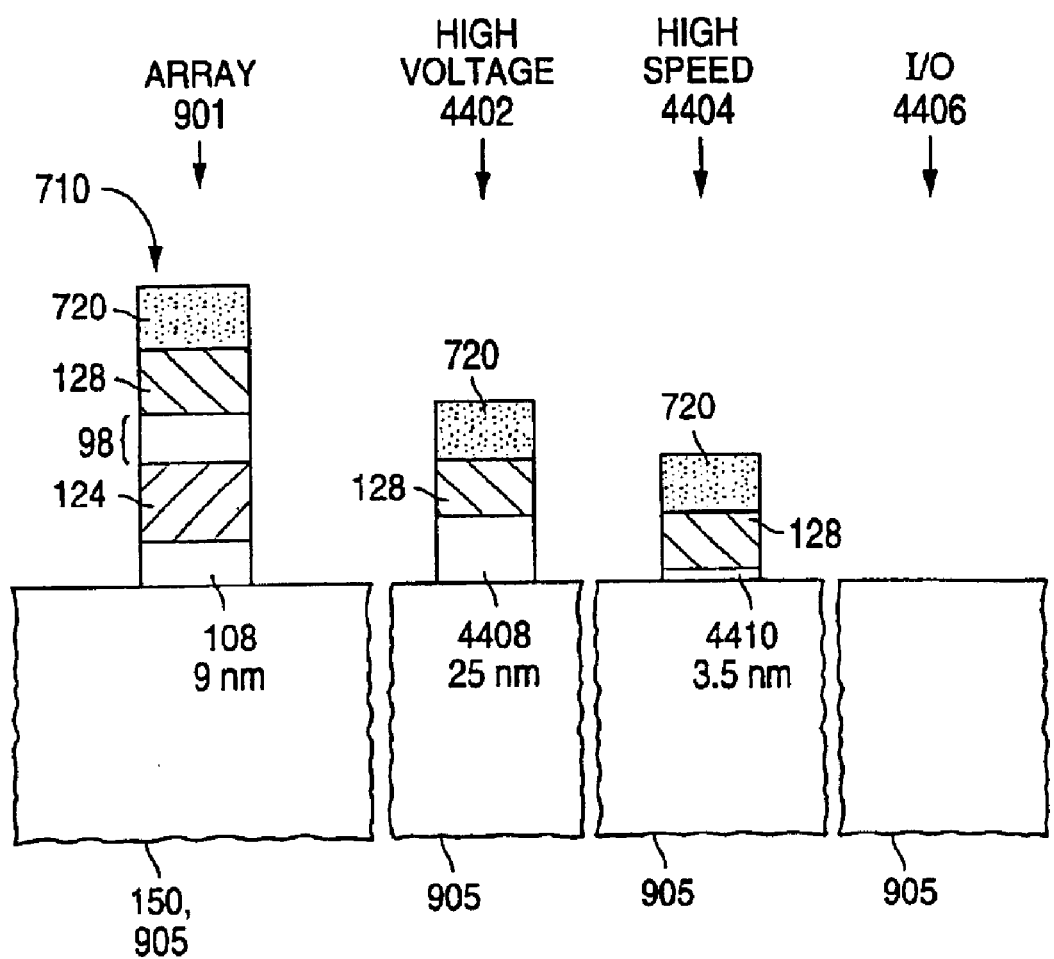

Then resist 1014 is stripped, and another photoresist mask 4801 (FIG. 48) is formed to cover all of the peripheral areas 1603 except, possibly, the regions covered by silicon nitride 720. Polysilicon 124 and silicon dioxide 108 are etched off the wafer except in the regions protected by resist 4801 and silicon nitride 720. As a result, stacks 710 are formed. Photoresist 4801 is removed. The resulting structure is shown in FIG. 49.

Then silicon dioxide 1510 and silicon nitride 903 (FIGS. 19A, 19B) can be formed to protect the sidewalls of stacks 710. Then the wafer is oxidized to form silicon dioxide layer 1810 (FIGS. 20A, 44) on the exposed substrate region 150 in memory array active area 901 and on the exposed substrate 905 in I/O active areas 4406 to a thickness of 5 nm. Polysilicon 520 is deposited and patterned to provide I/O peripheral transistor gates as described above in connection with FIGS. 25, 26A, 26B, 26C.

Figure 50:
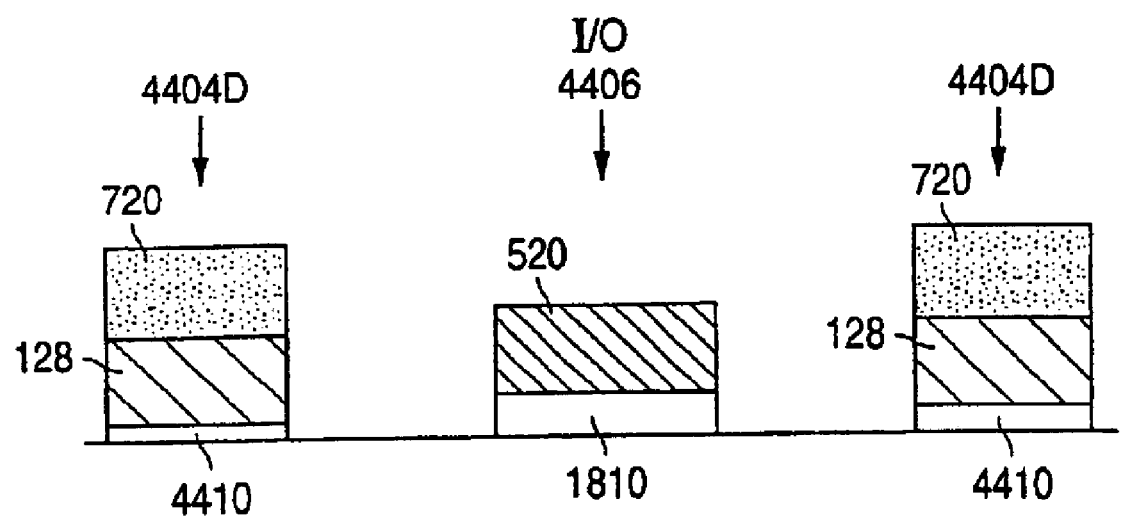

As described above, silicon nitride 2607 (FIG. 26C) on top of polysilicon 520 in active areas 4406 will protect the polysilicon during chemical mechanical polishing. If silicon nitride 2607 is not formed, the polysilicon 520 can be protected as shown in FIG. 50. In this figure, dummy structures are formed in "dummy" areas 4404D adjacent to a transistor active area 4406. Then dummy areas 4404D are processed in the same way as high speed areas 4404 (FIG. 44). As a result, nitride 720 is formed in areas 4404D. The top surface of nitride 720 is higher than the top surface of polysilicon 520 in areas 4406. When the wafer is later covered by silicon dioxide (not shown) and the silicon dioxide is polished by CMP, the silicon nitride 720 in areas 4404D will not allow the silicon dioxide to be removed from over the polysilicon 520 in the area 4406. Polysilicon 520 will thus be protected.

Alternatively, the dummy areas 4404D can be processed in the same way as high voltage areas 4402. Alternatively, each I/O transistor active area 4406 can be surrounded by different dummy areas some of which are processed in the same way as areas 4402 while others in the same way as areas 4404. Some of the areas 4404D may be non-dummy areas, that is, transistors can be formed in these areas. Areas 4404D can be separated from the area 4406 by an isolation trench (or trenches) 910 and may partially overlap, or be positioned entirely over, the isolation trenches.

In some embodiments, the memory cells are multilevel cells (MLC), that is, each memory cell can store more than one bit of information. Each floating gate 124 can store one of three or more charge levels, corresponding to three or more different threshold voltages for the control gate 128. See U.S. Pat. No. 5,953,255 issued Sep. 14, 1999 to Lee, incorporated herein by reference.

The invention is not limited to the embodiments described above. The invention is not limited to any particular erase or programming mechanisms (e.g. Fowler-Nordheim or hot electron injection). The invention covers non-flash EEPROM memories and other memories, known or to be invented. The invention is not limited to the materials described. In particular, control gates, select gates, and other conductive elements can be formed from metals, metal silicides, polycides, and other conductive materials and their combinations. Silicon dioxide and silicon nitride can be replaced with other insulating materials. P and N conductivity types can be interchanged. The invention is not limited to any particular process steps or order of steps. For example, in some embodiments, thermal oxidation of silicon can be replaced with depositing silicon dioxide or some other insulator by chemical vapor deposition or some other technique, known or to be invented. In some embodiments, deep implant 2110 (FIG. 22A) is performed after the etch of insulation 1010. The invention is not limited to silicon integrated circuits. Other embodiments and variations are within the scope of the invention, as defined by the appended claims.

What is claimed is:

1. A method for erasing memory cells of a flash memory array formed in and over a semiconductor region, the memory array comprising a plurality of sections each of which can be erased individually, each section having a plurality of memory cells, the method comprising:

receiving by the memory a command indicating whether the entire memory array is to be erased or less than the entire memory array is to be erased;

if the entire memory array is to be erased, then erasing the entire memory array in response to the command;

if less than the entire memory array is to be erased, then erasing a portion of the memory array in response to the command without erasing the entire memory array in response to the command.

2. The method of claim 1 wherein erasing the entire memory array comprises providing a first voltage to the semiconductor region and a second voltage to all of control gates of the memory array.

3. The method of claim 1 wherein erasing a portion of the memory array comprises:

providing a first voltage to control gates of memory cells in said portion;

providing a second voltage to control gates of memory cells in the array outside of said portion.

4. The method of claim 1 wherein erasing the entire memory array comprises erasing a memory cell by Fowler-Nordheim tunneling from the cell's floating gate to the cell's channel region located in the semiconductor region.

5. The method of claim 1 wherein erasing the portion of the memory array comprises erasing a memory cell by Fowler-Nordheim tunneling from the cell's floating gate to the cell's channel region located in the semiconductor region.

6. The method of claim 1 wherein erasing the portion of the memory array comprises erasing a memory cell by Fowler-Nordheim tunneling from the cell's floating gate to the cell's source/drain region located in the semiconductor region.

7. The method of claim 1 wherein:

if the command indicates that the entire memory array is to be erased, then erasing of the array comprises Fowler-Nordheim tunneling from conductive floating gates of the memory cells of the array to channel regions of the memory cells of the array; and if the command indicates that less than the entire memory array is to be erased, then erasing the portion of the memory array comprises erasing the memory cells of said portion by Fowler-Nordheim tunneling from the floating gates of the cells of said portion to source/drain regions of the cells of said portion but not by Fowler-Nordheim tunneling from the floating gates of the cells of said portion to the channel regions of the cells of said portion.

8. The method of claim 7 wherein the channel regions of the cells of the array are part of a continuous semiconductor region of a first conductivity type.

9. An integrated circuit comprising:

a flash memory array formed in and over a semiconductor region, the memory array comprising a plurality of sections each of which can be erased individually, each section having a plurality of memory cells;

a first circuit for receiving a command indicating whether the entire memory array is to be erased or less than the entire memory array is to be erased, and for performing the following operations:

if the entire memory array is to be erased, then erasing the entire memory array in response to the command;

if less than the entire memory array is to be erased, then erasing a portion of the memory array in response to the command without erasing the entire memory array.

10. The integrated circuit of claim 9 wherein in erasing the entire memory array the first circuit provides a first voltage to the semiconductor region and a second voltage to all of control gates of the memory array.

11. The integrated circuit of claim 9 wherein in erasing a portion of the memory array the first circuit performs the following operations:

providing a first voltage to control gates of memory cells in said portion;

providing a second voltage to control gates of memory cells in the array outside of said portion.

12. The integrated circuit of claim 9 wherein erasing the entire memory array comprises erasing a memory cell by Fowler-Nordheim tunneling from the cell's floating gate to the cell's channel region located in the semiconductor region.

13. The integrated circuit of claim 9 wherein erasing the portion of the memory array comprises erasing a memory cell by Fowler-Nordheim tunneling from the cell's floating gate to the cell's channel region located in the semiconductor region.

14. The integrated circuit of claim 9 wherein erasing the portion of the memory array comprises erasing a memory cell by Fowler-Nordheim tunneling from the cell's floating gate to the cell's source/drain region located in the semiconductor region.

15. The integrated circuit of claim 9 wherein:
if the command indicates that the entire memory array is to be erased, then erasing of the array comprises Fowler-Nordheim tunneling from conductive floating gates of the memory cells of the array to channel regions of the memory cells of the array; and
if the command indicates that less than the entire memory array is to be erased, then erasing the portion of the memory array comprises erasing the memory cells of said portion by Fowler-Nordheim tunneling from the floating gates of the cells of said portion to source/drain regions of the cells of said portion but not by Fowler-Nordheim tunneling from the floating gates of the cells of said portion to the channel regions of the cells of said portion.

16. The integrated circuit of claim 15 wherein the channel regions of the cells of the array are part of a continuous semiconductor region of a first conductivity type.

* * * * *